United States Patent
Kim et al.

(10) Patent No.: US 8,393,775 B2
(45) Date of Patent: Mar. 12, 2013

(54) BACKLIGHT UNIT AND DISPLAY DEVICE

(75) Inventors: Sungwoo Kim, Seoul (KR); Sangjeon Kim, Seoul (KR); Sangtae Park, Seoul (KR); Soonhyung Kwon, Seoul (KR); Buwan Seo, Seoul (KR); Bupsung Jung, Seoul (KR); Seungchoon Bae, Seoul (KR); Seonghwan Ryu, Seoul (KR)

(73) Assignee: LG Electronics Inc., Seoul (KR)

( * ) Notice: Subject to any disclaimer, the term of this patent is extended or adjusted under 35 U.S.C. 154(b) by 273 days.

(21) Appl. No.: 12/860,713

(22) Filed: Aug. 20, 2010

(65) Prior Publication Data

US 2011/0051043 A1 Mar. 3, 2011

Related U.S. Application Data

(60) Provisional application No. 61/237,587, filed on Aug. 27, 2009, provisional application No. 61/320,728, filed on Apr. 3, 2010.

(30) Foreign Application Priority Data

| Aug. 27, 2009 | (KR) | 10-2009-0079700 |
| Aug. 27, 2009 | (KR) | 10-2009-0079710 |
| Aug. 28, 2009 | (KR) | 10-2009-0080249 |
| Nov. 24, 2009 | (KR) | 10-2009-0114225 |
| Nov. 24, 2009 | (KR) | 10-2009-0114226 |
| Nov. 24, 2009 | (KR) | 10-2009-0114227 |
| Mar. 17, 2010 | (KR) | 10-2010-0023956 |
| Mar. 25, 2010 | (KR) | 10-2010-0026736 |
| Mar. 31, 2010 | (KR) | 10-2010-0029272 |

(51) Int. Cl.
*F21V 33/00* (2006.01)
(52) U.S. Cl. .......... 362/613; 362/612; 362/97.1
(58) Field of Classification Search .......... 362/612, 362/613, 97.3
See application file for complete search history.

(56) References Cited

U.S. PATENT DOCUMENTS

| 2006/0203513 A1 | 9/2006 | Aoki | |
| 2009/0207339 A1* | 8/2009 | Ajichi et al. | 349/64 |
| 2010/0110330 A1* | 5/2010 | Ajichi et al. | 349/62 |
| 2010/0110667 A1* | 5/2010 | Takata | 362/97.3 |

FOREIGN PATENT DOCUMENTS

| JP | 2006-164625 A | 6/2006 |
| JP | 2006-251075 A | 9/2006 |
| JP | 2006/286217 A | 10/2006 |
| JP | 2007/42320 A | 2/2007 |

* cited by examiner

*Primary Examiner* — Laura Tso
(74) *Attorney, Agent, or Firm* — Birch, Stewart, Kolasch & Birch, LLP

(57) ABSTRACT

A backlight unit and a display device including the backlight unit are discussed. According to an embodiment, a light generating device comprising: arrays of light source devices arranged on a first layer and including a first light source device and a second light source device configured emit light in opposite directions, at least one of the first and second light source devices including: a housing having inclined inner walls that define a cavity, a light emitting diode disposed in the cavity and configured to generate the light, and at least one material filled in the cavity; a reflection layer disposed on the first layer and configured to reflect the light emitted from the light source devices; and a second layer covering the light source devices and the reflection layer.

20 Claims, 40 Drawing Sheets

(a)　　　　　　　　　　　　　　　　(b)

Lead type

SMD type

Flip chip type

BACKLIGHT UNIT AND DISPLAY DEVICE

This application claims the benefit of Korean Patent Application Nos. 10-2009-0079710 filed on Aug. 27, 2009, 10-2009-0079700 filed on Aug. 27, 2009, 10-2009-0080249 filed on Aug. 28, 2009, 10-2009-0114226 filed on Nov. 24, 2009, 10-2009-0114227 filed on Nov. 24, 2009, 10-2009-0114225 filed on Nov. 24, 2009, 10-2010-0023956 filed on Mar. 17, 2010, 10-2010-0026736 filed on Mar. 25, 2010, 10-2010-0029272 filed on Mar. 31, 2010, U.S. Provisional Application Nos. 61/237,587 filed on Aug. 27, 2009, 61/320,728 filed on Apr. 3, 2010, and 61/322,295 filed Apr. 9, 2010, which are all incorporated herein by reference for all purposes as if fully set forth herein.

BACKGROUND OF THE INVENTION

1. Field of the Invention

Exemplary embodiments of the invention relate to a backlight unit and a display device.

2. Description of the Related Art

Liquid crystal displays have been widely used in various fields including the notebook PC market and the monitor market because of excellent characteristics such as thin profile, lightness in weight, and low power consumption.

The liquid crystal display includes a liquid crystal display panel and a backlight unit providing light to the liquid crystal display panel. The liquid crystal display panel transmits light provided by the backlight unit and adjusts a transmittance of the light, thereby displaying an image.

The backlight unit may be classified into an edge type backlight unit and a direct type backlight unit depending on a location of light sources. In the edge type backlight unit, light sources are disposed at a side of the liquid crystal display panel, and a light guide plate is disposed on a back surface of the liquid crystal display panel and guides the light emitted from the side of the liquid crystal display panel to the back surface of the liquid crystal display panel. In the direct type backlight unit, light sources are disposed on a back surface of the liquid crystal display panel, and the light emitted from the light sources may be directly provided to the back surface of the liquid crystal display panel.

Examples of the light sources may include an electroluminescence (EL) device, a cold cathode fluorescent lamp (CCFL), a hot cathode fluorescent lamp (HCFL), and a light emitting diode (LED). The LED has low power consumption and high light emitting efficiency.

SUMMARY OF THE INVENTION

Exemplary embodiments of the invention provide a backlight unit such as a direct type backlight unit and a display device having the direct type backlight unit.

Embodiments of the invention provide a light generating device including one or more light source devices each including a light emitting unit such as an LED, which can be used in a backlight unit or other device and which address the limitations and disadvantages associated with the background art.

According to an embodiment, the invention provides a light generating device comprising: arrays of light source devices arranged on a first layer and including a first light source device and a second light source device configured emit light in opposite directions, at least one of the first and second light source devices including: a housing having inclined inner walls that define a cavity, a light emitting diode disposed in the cavity and configured to generate the light, and at least one material filled in the cavity; a reflection layer disposed on the first layer and configured to reflect the light emitted from the light source devices; and a second layer covering the light source devices and the reflection layer, wherein a first angle $\theta 1$ is formed from a line extending from the inner walls of the housing with respect to a line perpendicular to a light emitting surface of the light emitting diode of the first light source device, a second angle $\theta 2$ is formed from a line connecting a middle point on a surface of the first light source device and a middle point on a surface of the second light source device to a line extending perpendicularly from a light emitting surface of the first light source device, and a difference between the first angle $\theta 1$ and the second angle $\theta 2$ ranges from 0° to about 78°.

According to an embodiment, the invention provides a display device comprising: a display panel configured to display images; and a backlight unit configured to supply light to the display panel, and including a plurality of light generating blocks, at least one of the light generating blocks including: arrays of light source devices arranged on a first layer and including a first light source device and a second light source device configured emit light in opposite directions, at least one of the first and second light source devices including: a housing having inclined inner walls that define a cavity, a light emitting diode disposed in the cavity and configured to generate the light, and at least one material filled in the cavity; a reflection layer disposed on the first layer and configured to reflect the light emitted from the light source devices; and a second layer covering the light source devices and the reflection layer, wherein a first angle $\theta 1$ is formed from a line extending from the inner walls of the housing with respect to a line perpendicular to a light emitting surface of the light emitting diode of the first light source device, a second angle $\theta 2$ is formed from a line connecting a middle point on a surface of the first light source device and a middle point on a surface of the second light source device to a line extending perpendicularly from a light emitting surface of the first light source device, and a difference between the first angle $\theta 1$ and the second angle $\theta 2$ ranges from 0° to about 78°.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings. In this regard, each of all display devices, backlight units, light source devices, and any device that includes such backlight unit or light source device discussed below is operatively coupled and configured. Further, a backlight unit according to embodiments of the invention preferably is fixed to a back of a display panel and has a same or similar size as the display panel to correspond to the entire display region of the display panel. Furthermore, such a backlight unit preferably includes a plurality of light sources which are disposed in arrays, lines, patterns, etc. throughout the entire area of the backlight unit that corresponds to the entire display region of the display panel. As such, the light sources are not just located at one side of the display panel, but are preferably dispersed below throughout the entire display region of the display panel. In these figures, arrows indicate a general light emitting direction of the light source, e.g., a general direction in which the light from a light emitting surface of the light source is emitted, but the light from the light source may emit not necessarily in a single line but through an area in the indicated direction.

According to various embodiments of the invention, any one or more features from one embodiment/example/variation of the invention can be applied to (e.g., added, substituted, modified, etc.) any one or more other embodiments/examples/variations discussed below according to the invention. Further any operations/methods discussed below can be implemented in any of these devices/units or other suitable devices/units.

Figure 1:
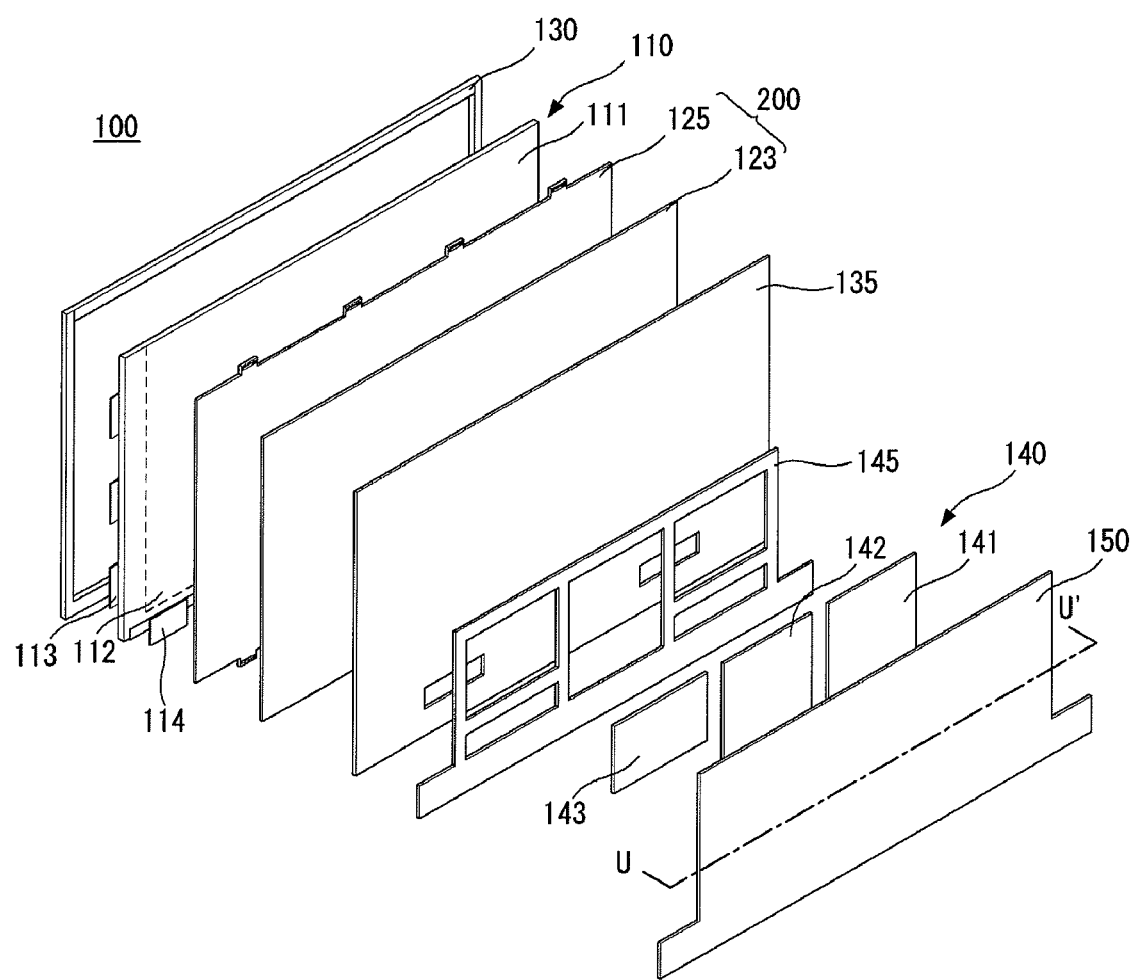
FIG. 1 illustrates a display device according to an exemplary embodiment of the invention.

FIG. 1 illustrates a display device according to an exemplary embodiment of the invention.

As shown in FIG. 1, a display device 100 according to an exemplary embodiment of the invention may include a display panel 110, a backlight unit 200, a cover 130, a bottom plate 135, a driver 140, and a back case 150.

The display panel 110 is an image displaying element and may include a first substrate 111 and a second substrate 112 that are positioned opposite each other and are attached to each other with a liquid crystal layer interposed therebetween. Although it is not shown, a plurality of scan lines and a plurality of data lines may cross each other in a matrix form on the first substrate 111 also referred to as a thin film transistor (TFT) array substrate, thereby defining a plurality of pixels. Each pixel may include a thin film transistor capable of switching on and off a signal and a pixel electrode connected to the thin film transistor.

Red (R), green (G), and blue (B) color filters corresponding to each pixel and black matrixes may be positioned on the second substrate 112 also referred to as a color filter substrate. The black matrixes may surround the R, G, and B color filters and may cover a non-display element such as the scan lines, the data line, and the thin film transistors. A transparent common electrode covering the R, G, and B color filters and the black matrixes may be positioned on the second substrate 112.

A printed circuit board (PCB) may be connected to at least one side of the display panel 110 through a connection member such as a flexible circuit board and a tape carrier package (TCP), and the display panel 110 may be closely attached to a back surface of the bottom plate 135 in a module process.

When the thin film transistors selected by each scan line are switched on in response to an on/off signal that is transferred from a gate driving circuit 113 through the scan lines, a data voltage of a data driving circuit 114 is transferred to the corresponding pixel electrode through the data lines and an arrangement direction of liquid crustal molecules changes by an electric field between the pixel electrode and the common electrode. Hence, the display panel 110 having the above-described structure displays an image by adjusting a transmittance difference resulting from changes in the arrangement direction of the liquid crustal molecules.

The backlight unit 200 may provide light from a back surface of the display panel 110 to the display panel 110. The backlight unit 200 may include an optical assembly 123 and a plurality of optical sheets 125 positioned on the optical assembly 123. The backlight unit 200 will be described later in detail.

The display panel 110 and the backlight unit 200 may form a module using the cover 130 and the bottom plate 135. The cover 130 positioned on a front surface of the display panel 110 may be a top cover and may have a rectangular frame shape covering an upper surface and a side surface of the display panel 110. An image achieved by the display panel 110 may be displayed by opening a front surface of the cover 130.

The bottom plate 135 positioned on a back surface of the backlight unit 200 may be a bottom cover and may have a rectangular plate shape. The bottom plate 135 may serve as a base element of the display device 100 when the display panel 110 and the backlight unit 200 form the module.

The driver 140 may be positioned on one surface of the bottom plate 135 by a driver chassis 145. The driver 140 may includes a driving controller 141, a main board 142, and a power supply unit 143. The driving controller 141 may be a timing controller and controls operation timing of each of driving circuits of the display panel 110. The main board 142 transfers a vertical synchronous signal, a horizontal synchronous signal, and a RGB resolution signal to the driving controller 141. The power supply unit 143 applies a power to the display panel 110 and the backlight unit 200. The driver 140 may be covered by the back case 150.

Figure 2:
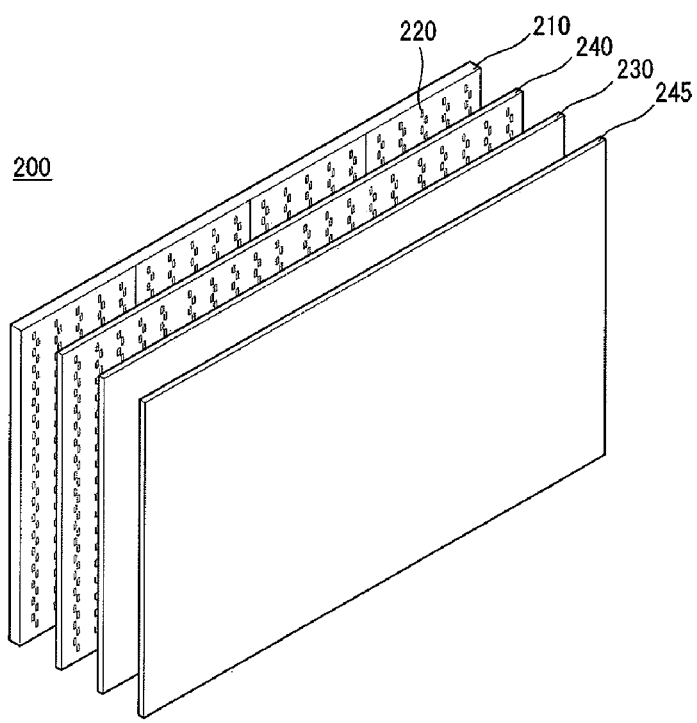
FIGS. 2 and 3 illustrate a first exemplary configuration of a backlight unit according to an exemplary embodiment of the invention.
Figure 3:
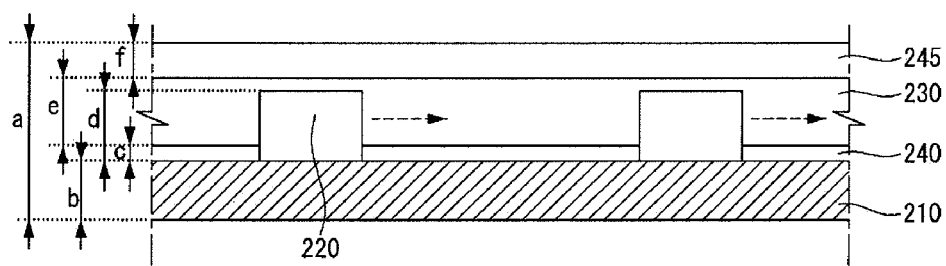

FIGS. 2 and 3 illustrate a first exemplary configuration of the backlight unit according to the exemplary embodiment of the invention. As shown in FIGS. 2 and 3, the backlight unit 200 according to the first exemplary configuration may include a first layer 210, a plurality of light sources 220, a second layer 230, and a reflection layer 240.

The plurality of light sources 220 may be formed on the first layer 210, and the second layer 230 may be formed on the first layer 210 so as to cover the light sources 220.

The first layer 210 may be a substrate on which the plurality of light sources 220 are mounted. An electrode pattern for connecting the light sources 220 to an adapter for a power supply may be formed on the first layer 210. For example, a carbon nanotube electrode pattern for connecting the light sources 220 to the adapter may be formed on the first layer 210.

The first layer 210 may be formed of polyethylene terephthalate (PET), glass, polycarbonate (PC), or silicon. The first layer 210 may be a printed circuit board (PCB) substrate, on which the plurality of light sources 220 are mounted, and may be formed in a film form.

The light source 220 may be one of a light emitting diode (LED) chip and a light emitting diode package having at least one light emitting diode chip, but can be other type. In the embodiment of the invention, the light emitting diode package is described as an example of the light source 220.

The LED package constituting the light source 220 may be classified into a top view type LED package and a side view type LED package based on a facing direction of a light emitting surface of the LED package. In the embodiment of the invention, the light source 220 may be configured using at least one of the top view type LED package, in which the light emitting surface is upward formed, and the side view type LED package in which the light emitting surface is formed toward the side.

If the side view type LED package is used as the light source 220 in the embodiment of the invention, each of the light sources 220 may have a light emitting surface at a side thereof and may emit light in a lateral direction, i.e., in an extension direction of the first layer 210 or the reflection layer 240. Thus, a thin profile of the backlight unit 200 may be achieved by reducing a thickness "e" of the second layer 230 formed on the light sources 220. As a result, a thin profile of the display device 100 may be achieved.

The light source 220 may be configured by a colored LED emitting at least one of red light, green light, blue light, etc. or a white LED emitting white light. In addition, the colored LED may include at least one of a red LED, a blue LED, and a green LED. The disposition and emitting light of the light emitting diode can be variously changed within a technical scope of the embodiment.

The second layer 230 transmits light emitted by the light sources 220, and at the same time diffuses the light emitted by the light sources 220, thereby allowing the light sources 220 to uniformly provide the light to the display panel 110. The second layer 230 encapsulates (entirely covers) the light sources 220 on the first layer 210.

The reflection layer 240 is positioned on the first layer 210 and reflects light emitted by the light sources 220. The reflection layer 240 may be formed in an area excluding a formation area of the light sources 220 from the first layer 210. The reflection layer 240 reflects light emitted from the light sources 220 and again reflects light totally reflected from a boundary of the second layer 230, thereby more widely diffusing light. The reflection layer 240 is a layer capable of reflecting the impinging light or a part thereof.

The reflection layer 240 may contain at least one of metal and metal oxide that are a reflection material. For example, the reflection layer 240 may contain metal or metal oxide having a high reflectance, such as aluminum (Al), silver (Ag), gold (Au), and titanium dioxide ($TiO_2$). In this case, the reflection layer 240 may be formed by depositing or coating the metal or the metal oxide on the first layer 210 or by printing a metal ink on the first layer 210. The deposition method may use a heat deposition method, an evaporation method, or a vacuum deposition method such as a sputtering method. The coating method or the printing method may use a gravure coating method or a silk screen method.

The second layer 230 on the first layer 210 may be formed of a material capable of transmitting light, for example, silicon or acrylic resin. Other materials may be used for the second layer 230. For example, various types of resin may be used. Further, the second layer 230 may be formed of a resin having a refractive index of approximately 1.4 to 1.6, so that the backlight unit 200 has a uniform luminance by diffusing light emitted from the light sources 220. For example, the second layer 230 may be formed of any one material selected from the group consisting of polyethylene terephthalate (PET), polycarbonate (PC), polypropylene, polyethylene, polystyrene, polyepoxy, silicon, acryl, etc.

The second layer 230 may contain a polymer resin having an adhesion so as to tightly and closely adhere to the light sources 220 and the reflection layer 240. For example, the second layer 230 may contain an acrylic resin such as unsaturated polyester, methylmethacrylate, ethylmethacrylate, isobutylmethacrylate, normal butylmethacrylate, normal butylmethylmethacrylate, acrylic acid, methacrylic acid, hydroxy ethylmethacrylate, hydroxy propylmethacrylate, hydroxy ethylacrylate, acrylamide, methylol acrylamide, glycidyl methacrylate, ethylacrylate, isobutylacrlate, normal butylacrylate, 2-ethylhexyl acrylate polymer, copolymer, or terpolymer, etc., an urethane resin, an epoxy resin, a melamine resin, etc.

The second layer 230 may be formed by applying and curing a liquid or gel-type resin on the first layer 210 on which the light sources 220 and the reflection layer 240 are formed. Alternatively, the second layer 230 may be formed by applying and partially curing a resin on a support sheet and then attaching the resin to the first layer 210.

A diffusion plate 245 may be formed on the second layer 230 to upward diffuse light emitted from the light sources 220. The diffusion plate 24 may be directly attached to the second layer 230 or may be attached to the second layer 230 using a separate adhesive member.

A thickness of the backlight unit 200 having the above-described structure and a thickness of each of components constituting the backlight unit 200 may be adjusted so as to efficiently use light provided to the display panel 110.

More specifically, a total thickness "a" of the backlight unit 200 may be approximately 1.7 mm to 3.5 mm, for example, approximately 2.8 mm. A thickness "b" of the first layer 210 constituting the backlight unit 200 may be approximately 0.2 mm to 0.8 mm, for example, approximately 0.5 mm. A thickness "c" of the reflection layer 240 on the first layer 210 may be approximately 0.02 mm to 0.08 mm, for example, approximately 0.05 mm. Further, a thickness "d" of the light source 220 arranged on the first layer 210 may be approximately 0.8 mm to 1.6 mm, for example, approximately 1.2 mm. The thickness "e" of the second layer 230 covering the light source 220 may be approximately 0.8 mm to 2.4 mm, for example, approximately 1.3 mm. A thickness "f" of the diffusion plate 245 on the second layer 230 may be approximately 0.7 mm to 1.3 mm, for example, approximately 1.0 mm.

As the thickness "e" of the second layer 230 increases, light emitted from the light sources 220 may be more widely diffused. Hence, the backlight unit 200 may provide light having the uniform luminance to the display panel 110. On the other hand, as the thickness "e" of the second layer 230 increases, an amount of light absorbed in the second layer 230 may increase. Hence, the luminance of light which the backlight unit 200 provides to the display panel 110 may entirely decrease.

Accordingly, the thickness "e" of the second layer 230 may be equal to the thickness "d" of the light source 220 or may be equal to or less than 1.5 times the thickness "d" of the light source 220, so that the backlight unit 200 can provide light having the uniform luminance to the display panel 110 without an excessive reduction in the luminance.

Figure 4:
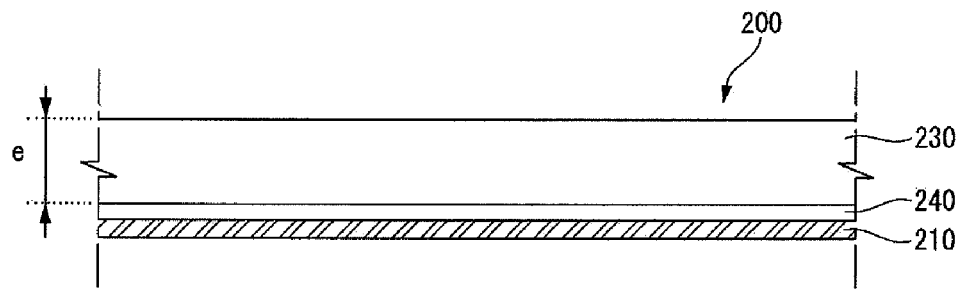
FIG. 4 illustrates a cross-sectional shape of an area excluding a formation area of light sources from an entire area of a backlight unit according to an embodiment of the invention.

FIG. 4 illustrates a cross-sectional shape of an area (i.e., a non-formation area of the light sources 220 where the light sources 220 are not present) excluding a formation area of the light sources 220 (where the light sources 220 are located) from an entire area of the backlight unit 200.

As shown in FIG. 4, the backlight unit 200 may have the structure in which the reflection layer 240 covers an upper surface of the first layer 210 in the non-formation area of the light sources 220. For example, the reflection layer 240 may be formed on the first layer 210 and may have a plurality of holes, into which the light sources 220 may be inserted, at a location corresponding to a formation location of the light sources 220. The light sources 220 may upwardly protrude from the holes of the reflection layer 240 and may be covered by the second layer 230.

Figure 5:
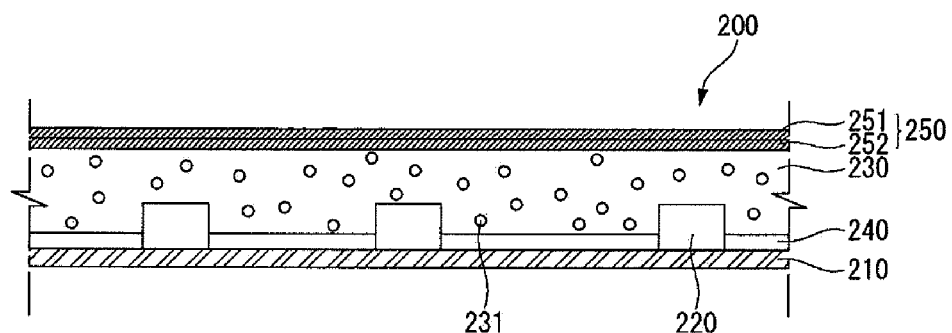
FIG. 5 illustrates a second exemplary configuration of a backlight unit according to an exemplary embodiment of the invention.

FIG. 5 illustrates a second exemplary configuration of the backlight unit according to the embodiment of the invention. Structures and components identical or equivalent to those described in the first exemplary configuration of the backlight unit may be designated with the same reference numerals in the second exemplary configuration, and a further description may be briefly made or may be entirely omitted.

As shown in FIG. 5, the plurality of light sources 220 may be mounted on the first layer 210, and the second layer 230 may be disposed on the first layer 210. The reflection layer 240 may be formed between the first layer 210 and the second layer 230, more particularly, on an upper surface of the first layer 210.

The second layer 230 may include a plurality of scattering particles 231. The scattering particles 231 may scatter or refract incident light, thereby more widely diffusing light emitted from the light sources 220.

The scattering particles 231 may be formed of a material having a refractive index different from a formation material of the second layer 230 so as to scatter or refract the light emitted from the light source 220. More particularly, the scattering particles 231 may be formed of a material having a refractive index greater than silicon-based resin or acrylic resin forming the second layer 230. For example, the scattering particles 231 may be formed of polymethylmethacrylate (PMMA)/styrene copolymer (MS), polymethylmethacrylate (PMMA), polystyrene (PS), silicon, titanium dioxide ($TiO_2$), and silicon dioxide ($SiO_2$), or a combination thereof. Further, the scattering particles 231 may be formed of a material having a refractive index less than the formation material of the second layer 230. For example, the scattering particles 231 may be formed by generating bubbles in the second layer 230. Other materials may be used for the second layer 230. For example, the scattering particle 231 may be formed using various polymer materials or inorganic particles.

An optical sheet 250 may be disposed on the top of the second layer 230. The optical sheet 250 may include at least one prism sheet 251 and/or at least one diffusion sheet 252. In this case, a plurality of sheets constituting the optical sheet 250 are not separated from one another and are attached to one another. Thus, the thickness of the optical sheet 250 or the thickness of the backlight unit 200 may be reduced because of the above structure of the optical sheet 250.

A lower surface of the optical sheet 250 may closely adhere to the second layer 230, and an upper surface of the optical sheet 250 may closely adhere to the lower surface of the display panel 110, i.e., the lower polarizing plate 140.

The diffusion sheet 252 may diffuse incident light to thereby prevent light coming from the second layer 230 from being partially concentrated. Hence, the diffusion sheet 252 may further uniformize the luminance of light. Further, the prism sheet 251 may focus light coming from the diffusion sheet 252, thereby allowing the light to be vertically incident on the display panel 110.

In the embodiment of the invention, at least one of the prism sheet 251 and the diffusion sheet 252 constituting the optical sheet 250 may be removed. The optical sheet 250 may further include other functional layers in addition to the prism sheet 251 and/or the diffusion sheet 252.

The reflection layer 240 may include a plurality of holes (not shown) at locations corresponding to formation locations of the light sources 220, and the light sources 220 on the first layer 210 underlying the reflection layer 240 may be inserted into the holes.

In this case, the light sources 220 are downwardly inserted into the holes of the reflection layer 240, and at least a portion of each of the light sources 220 may protrude from the upper surface of the reflection layer 240. Because the backlight unit 200 is configured using the structure in which the light sources 220 are respectively inserted into the holes of the reflection layer 240, a fixation strength between the first layer 210 and the reflection layer 240 can be further improved.

Figure 6:
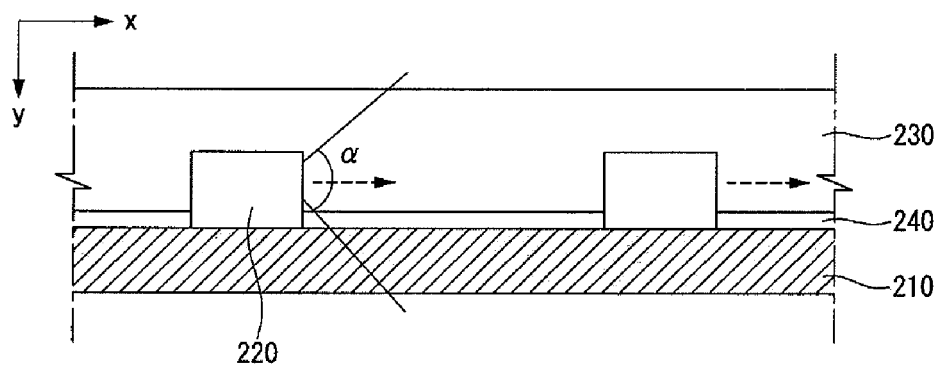
FIG. 6 illustrates a third exemplary configuration of a backlight unit according to an exemplary embodiment of the invention.

FIG. 6 illustrates a third exemplary configuration of the backlight unit according to the embodiment of the invention. Structures and components identical or equivalent to those described in the first and second exemplary configurations may be designated with the same reference numerals in the third exemplary configuration, and a further description may be briefly made or may be entirely omitted.

As shown in FIG. 6, each of the plurality of light sources 220 of the backlight unit 200 has the light emitting surface on the side thereof and can emit light in a lateral direction, e.g., a direction in which the first layer 210 or the reflection layer 240 extends.

For example, the plurality of light sources 220 may be configured using the side view type LED package. As a result, it is possible to address a problem that the light sources 220 are observed as a hot spot on the screen and to slim the backlight unit 200. Furthermore, the thin profile of the display device 100 can be achieved because of a reduction of the thickness "e" of the second layer 230.

In this case, the light sources 220 may emit light having a predetermined orientation angle of α being, for example, 90° to 150° about a first direction x (indicated by an arrow). Hereinafter, a direction of light emitted from the light sources 220 is indicated as the first direction x.

In the embodiment of the invention, light is emitted and diffused upward from the light sources 220 by forming a pattern on the second layer 230, and thus the backlight unit 200 can emit light having a uniform luminance.

FIGS. 7 to 14 illustrate a fourth exemplary configuration of the backlight unit according to examples of the invention. Structures and components identical or equivalent to those described in the first to third exemplary configurations may be designated with the same reference numerals in the fourth exemplary configuration, and a further description may be briefly made or may be entirely omitted.

The light sources 220 illustrated in FIGS. 7 to 14 may emit light from the side of the light sources 220 in a lateral direction in the same manner as FIG. 6. Other manners may be used. For example, the light sources 220 may emit light from the top of the light sources 220.

Figure 7:
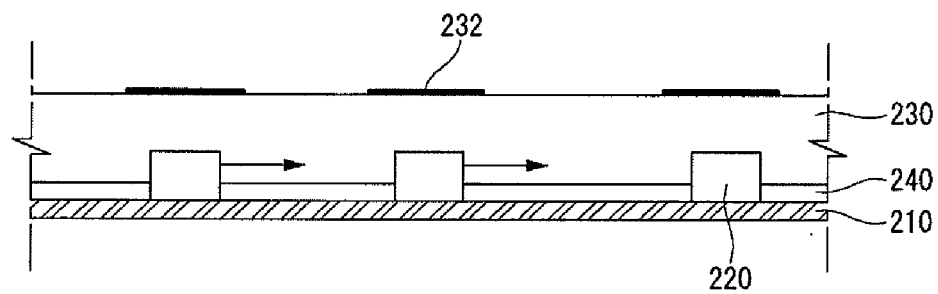
FIGS. 7 to 14 illustrate a fourth exemplary configuration of a backlight unit according to an exemplary embodiment of the invention.

As shown in FIG. 7, a pattern layer including a plurality of first patterns 232 may be formed on the top of the second layer 230 of the backlight unit 200 including the light sources 220. More specifically, the plurality of first patterns 232 of the pattern layer may be formed on the second layer 230 at locations corresponding to the formation locations of the light sources 220 (i.e., where the light sources 220 are located).

For example, the first patterns 232 formed on the top of the second layer 230 may be a pattern capable of reflecting at least a portion of light emitted from the light sources 220.

The first patterns 232 on the second layer 230 may prevent an increase in a luminance of light in an area adjacent to the light sources 220, and thus the backlight unit 200 may provide light having the uniform luminance.

In other words, the first patterns 232 are formed on the second layer 230 at the locations corresponding to the formation locations of the light sources 220 and selectively reflect light emitted upward from the light sources 220, thereby reducing the luminance of light in the area adjacent to the light sources 220. The light reflected by the first patterns 232 may be diffused in a lateral direction.

More specifically, the light emitted upward from the light sources 220 is diffused in the lateral direction by the first patterns 232, and at the same time is reflected downward. The light reflected by the first patterns 232 is again diffused in the lateral direction by the reflection layer 240, and at the same time is reflected upward. In other words, the first patterns 232 may reflect 100% of incident light. Alternatively, the first patterns 232 may reflect a portion of the incident light and may transmit a portion of the incident light. As above, the first patterns 232 may control the transfer of light passing through the second layer 230 and the first patterns 232. As a result, the light emitted from the light sources 220 may be widely diffused in the lateral direction and other directions as well as the upward direction, and thus the backlight unit 200 may emit the light having the uniform luminance.

The first patterns 232 may include a reflection material such as metal. For example, the first patterns 232 may include metal having a reflectance of 90% or more such as aluminum, silver, and gold. For example, the first patterns 232 may be formed of a material capable of transmitting 10% or less of incident light and reflecting 90% or more of the incident light.

In this case, the first patterns 232 may be formed by depositing or coating the above-described metal. As another method, the first patterns 232 may be formed through a printing process using a reflection ink including a metal, for example, a silver ink in accordance with a previously determined pattern.

Further, the first patterns 232 may have a color having a high brightness, for example, a color close to white so as to improve a reflection effect of the first patterns 232. More specifically, the first pattern 232 may have a color having a brightness greater than the second layer 230.

The first patterns 232 may contain metal oxide. For example, the first patterns 232 may include titanium dioxide ($TiO_2$). More specifically, the first patterns 232 may be formed by printing a reflection ink containing titanium dioxide ($TiO_2$) in accordance with a previously determined pattern.

Figure 8:
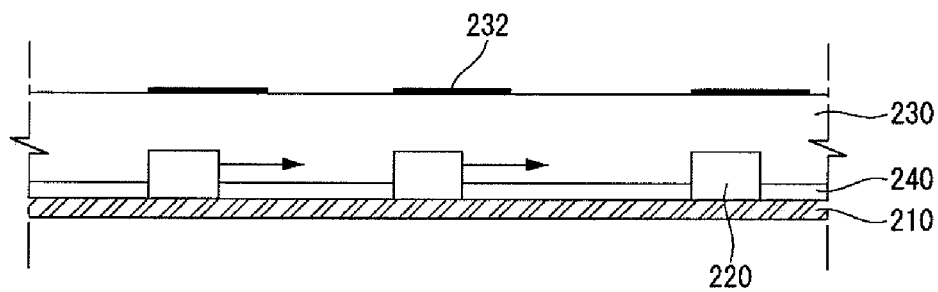
Figure 9:
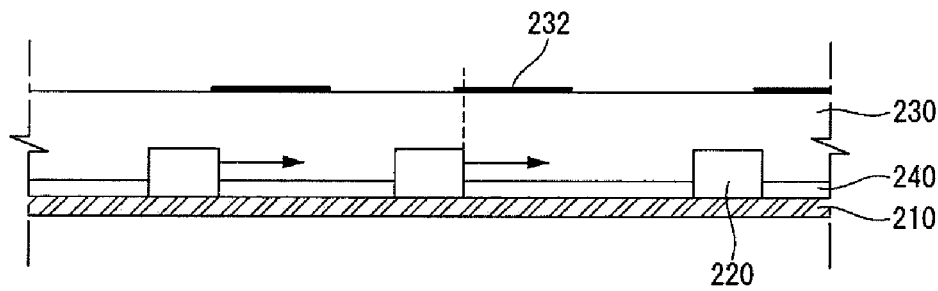
Figure 10:
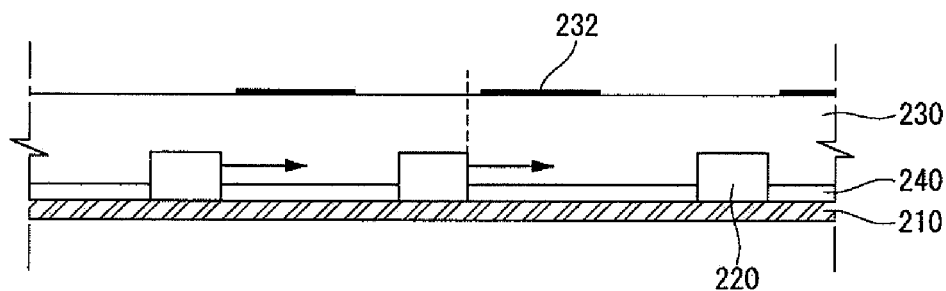

As shown in FIGS. 7 to 10, the formation of the first patterns 232 at the locations corresponding to the locations of the light sources 220 may include a case where a middle portion of the first pattern 232 coincides with a middle portion of the light source 220 corresponding to the first pattern 23 as shown in FIG. 7, and cases where the middle portion of the first pattern 232 does not necessarily coincide with the middle portion of the corresponding light source 220 by a predetermined distance as shown in FIGS. 8-10.

As shown in FIG. 8, the middle portion of the first pattern 232 may not coincide with the middle portion of the light source 220 corresponding to the first pattern 232.

For example, when the light emitting surface of the light source 220 faces not the upward direction but the lateral direction and therefore light is emitted from the light source 220 in the lateral direction, a luminance of light emitted from the side of the light source 220 may decrease while the light emitted from the side of the light source 220 travels through the second layer 230 in a direction indicated by an arrow of FIG. 8. Hence, light in a first area directly adjacent to the light emitting surface of the light source 220 may have a luminance greater than light in an area around the light emitting surface of the light source 220. Light in a second area adjacent to an opposite direction of the light emitting surface may have a luminance less than the light in the first area. Thus, the first pattern 232 may be formed by moving in an emission direction of light from the light source 220. In other words, the middle portion of the first pattern 232 may be formed at a location (slightly) deviated from the middle portion of the corresponding light source 220 toward the light emitting direction.

As shown in FIG. 9, the first pattern 232 may be formed at a location deviated further than the first pattern 232 illustrated in FIG. 8 toward the light emitting direction. In other words, a distance between the middle portion of the first pattern 232 and the middle portion of the corresponding light source 220 in FIG. 9 may be longer than a distance between the middle portion of the first pattern 232 and the middle portion of the corresponding light source 220 in FIG. 8. For example, the light emitting surface of the light source 220 may overlap a left end portion of the first pattern 232.

As shown in FIG. 10, the first pattern 232 may be formed at a location deviated further than the first pattern 232 illustrated in FIG. 9 toward the light emitting direction. In other words, a formation area of the first pattern 232 may not overlap a formation area of the corresponding light source 220. Hence, a left end portion of the first pattern 232 may be separated from the light emitting surface of the light source 220 by a predetermined distance.

Figure 11:
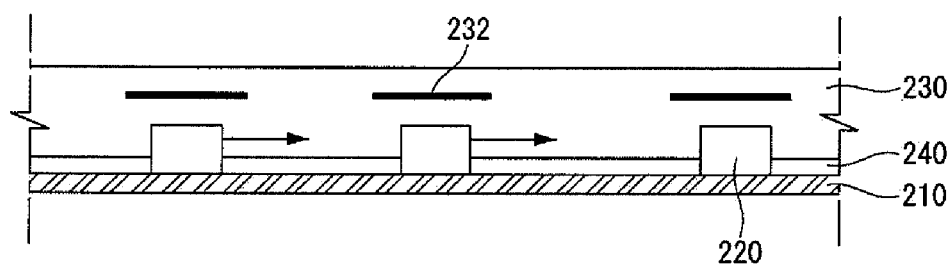

As shown in FIG. 11, the first pattern 232 may be formed inside the second layer 230. In this case, the middle portion of the first pattern 232 may be formed to coincide with the middle portion of the corresponding light source 220 or may be formed at a location deviated from the middle portion of the corresponding light source 220 toward the light emitting direction in the same manner as FIGS. 8 to 10.

Figure 12:
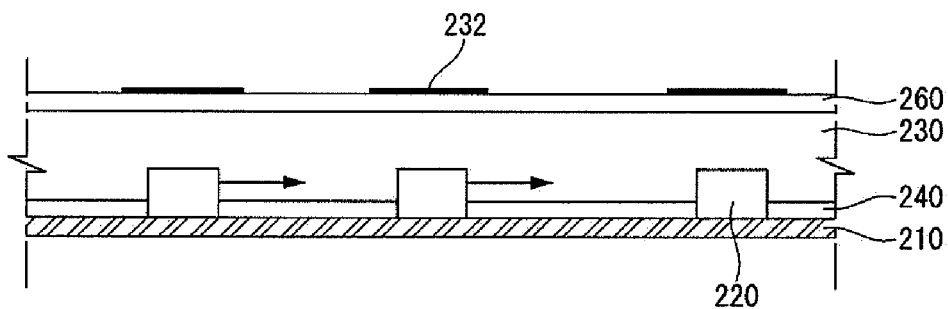

As shown in FIG. 12, the first pattern 232 may be manufactured in a sheet form. In this case, the pattern layer including the plurality of first patterns 232 may be formed on the second layer 230.

For example, after the plurality of first patterns 232 are formed on one surface of a transparent film 260 through the printing process, etc. to form the pattern layer, the pattern layer including the transparent film 260 may be stacked on the second layer 230. More specifically, a plurality of dots may be printed on the transparent film 260 to form the first patterns 232.

Figure 13:
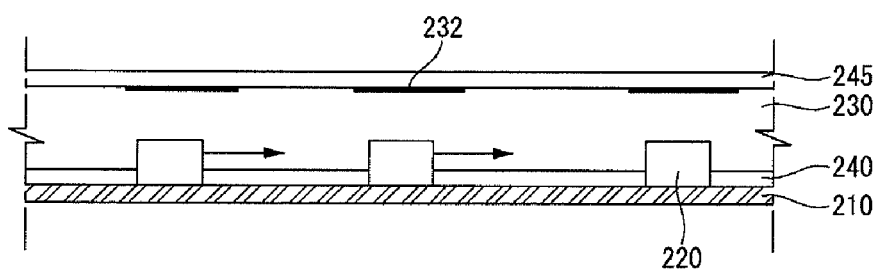

As shown in FIG. 13, the plurality of first patterns 232 may be formed on one surface of the diffusion plate 245 illustrated in FIG. 3. In this case, the first patterns 232 may be coated on one surface of the diffusion plate 245, and the diffusion plate 245 may be formed on the second layer 230 so that the first patterns 232 contact the second layer 230.

Figure 14:
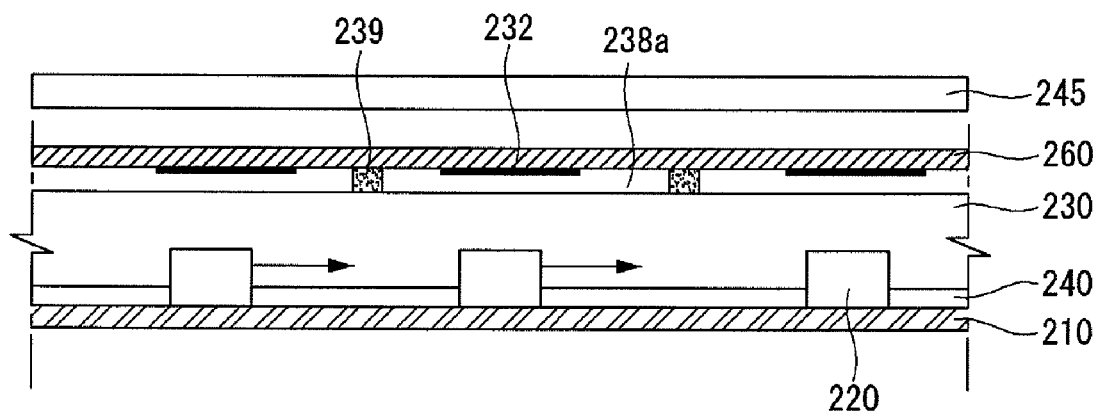

Unlike FIG. 13, as shown in FIG. 14, the plurality of first patterns 232 may be formed on one surface of the transparent film 260, and the transparent film 260, on which the first patterns 232 are formed, may be stacked on the second layer 230.

A first air layer 238*a* may be formed between the transparent film 260 and the second layer 230. A refractive index of the first air layer 238*a* is substantially 1 and may be different from a refractive index of the second layer 230 and a refractive index of the transparent film 260. Hence, the first air layer 238*a* may efficiently diffuse light emitted from the light source 220.

Further, an adhesive layer 239 may be formed between the transparent film 260 and the second layer 230. The adhesive layer 239 may attach the transparent film 260 to the second layer 230. Further, the adhesive layer 239 may provide a gap between the transparent film 260 and the second layer 230, thereby facilitating a formation of the first air layer 238*a*.

The diffusion plate 245 may be positioned on the transparent film 260. Because the diffusion plate 245 has a hard plate shape, the diffusion plate 245 may serve as a supporter of other functional layers and may diffuse light emitted from the light source 220. Although it is not shown, the diffusion plate 245 may include a plurality of beads. The diffusion plate 245 may scatter incident light using the beads to thereby prevent a concentration of light in a predetermined portion.

As a percentage of a formation area of the first pattern 232 increases, an aperture ratio may decrease. Hence, the entire luminance of light which the backlight unit 200 provides to the display panel 110 may decrease. The aperture ratio may indicate the size of an area of the second layer 230 that is not occupied by the first pattern 232.

Thus, the aperture ratio of the pattern layer including the first patterns 232 may be equal to or greater than 70%, so as to prevent the degradation of the image quality resulting from an excessive reduction in the luminance of light provided to the display panel 110. That is, the percentage of the area of the second layer 230 occupied by the first pattern 232 is equal to or less 30% of the total area of the second layer 230.

FIGS. 15 to 18 illustrate a disposition of the first patterns formed in the backlight unit according to the fourth exemplary configuration. Although these are top plan views, the first patterns 232 and the light sources 220 are shown merely to illustrate the relationship therebetween. As described above, the first patterns 232 may be formed at a location corresponding to the light sources 220.

Figure 15:
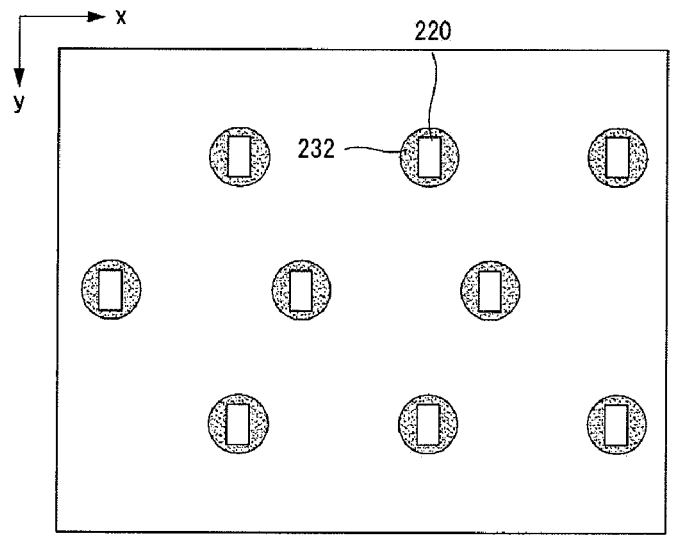
FIGS. 15 to 18 illustrate a location of a first pattern formed in the backlight unit according to the fourth exemplary configuration.

As shown in FIG. 15, the first pattern 232 may have a circle or circular shape or an oval shape around a formation location of the corresponding light source 220. Other shapes and sizes may be used for the first pattern 232. The middle portion of the first pattern 232 may be formed at a location deviated slightly from the middle portion of the corresponding light source 220 toward the light emitting direction in the same manner as FIGS. 8 to 10.

Figure 16:
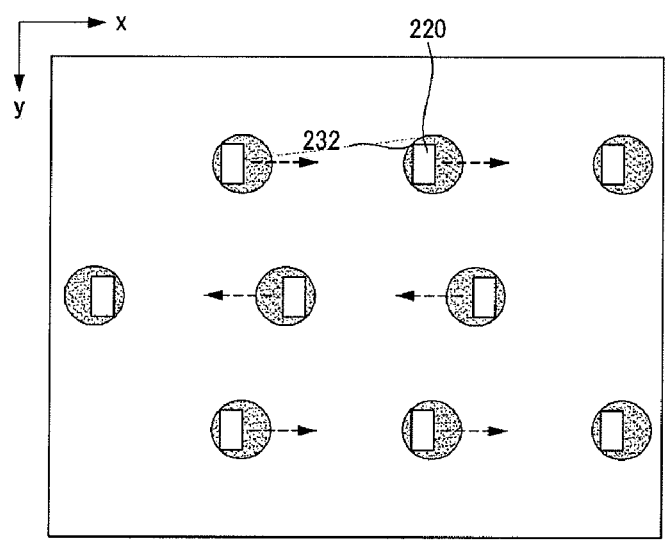

As shown in FIG. 16, the first pattern 232 may be moved in the light emitting direction (e.g., an x-axis direction in FIG. 15) in comparison with that of FIG. 15. Hence, the middle portion of the first pattern 232 may be formed at a location deviated from the middle portion of the corresponding light source 220 toward the light emitting direction by a predetermined distance.

Figure 17:
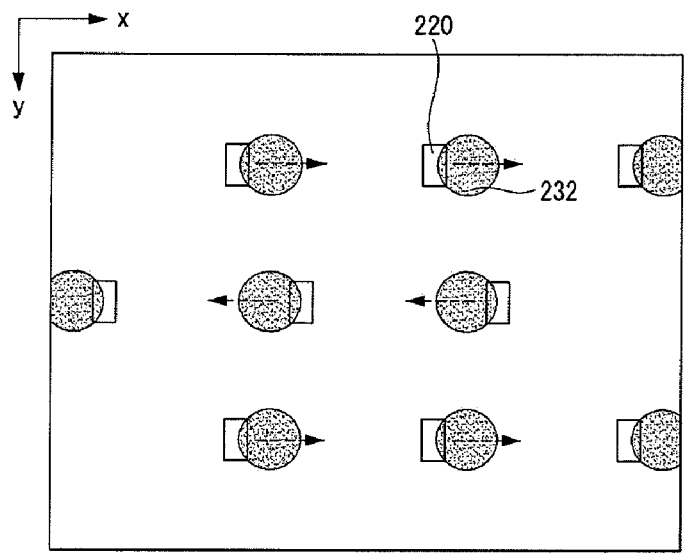

As shown in FIG. 17, the first pattern 232 may be moved toward the light emitting direction further than the first pattern 232 shown in FIG. 16. Hence, a portion of the formation area of the light source 220 may overlap a formation area of the first pattern 232.

Figure 18:
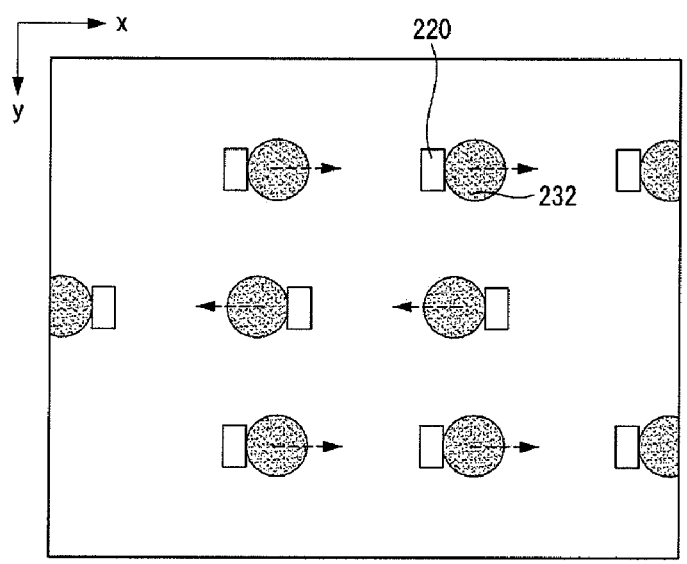

As shown in FIG. 18, the first pattern 232 may be moved toward the light emitting direction further than the first pattern 232 shown in FIG. 17 and thus may be positioned outside the formation area of the light source 220. Hence, the formation area of the light source 220 may not overlap a formation area of the first pattern 232.

FIGS. 19 to 22 illustrate various shapes of each first pattern 232. In FIGS. 19 to 22, the first pattern 232 may be configured by the plurality of dots or regions, and each dot or each region may contain a reflection material, for example, metal or metal oxide.

Figure 19:
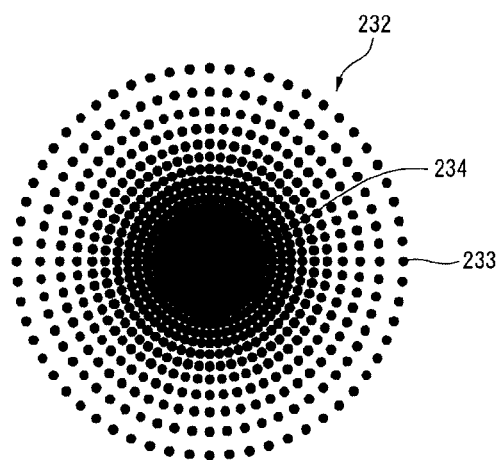
FIGS. 19 to 22 illustrate a shape of a first pattern formed in the backlight unit according to the fourth exemplary configuration.

As shown in FIG. 19, the first pattern 232 may have a circle or circular shape around the formation location of the light source 220. Other shapes such as a diamond may be used. A reflectance of the first pattern 232 may decrease as the first pattern 232 extends from a middle portion 234 of the first pattern 232 to the outwardly direction. The reflectance of the first pattern 232 may gradually decrease as the first pattern 232 extends from the middle portion 234 to the outwardly direction, because the number of dots or a reflectance of a material forming the first pattern 232 decreases as the first pattern 232 extends from the middle portion 234 to the outwardly direction.

Further, as the first pattern 232 extends from the middle portion 234 to the outwardly direction, a transmittance or an aperture ratio of light may increase. Hence, the formation location of the light source 220, more specifically, the middle portion 234 of the first pattern 232 corresponding to the middle portion of the light source 220 may have a maximum reflectance (for example, the middle portion 234 having the maximum reflectance does not transmit most of light) and a minimum transmittance or a minimum aperture ratio. As a result, the hot spot generated when light is concentrated in the formation area of the light source 220 may be more effectively prevented.

For example, an aperture ratio of the middle portion of the first pattern 232 overlapping the light source 220 may be equal to or less than 5% so as to prevent the generation of the hot spot.

In the plurality of dots 233 constituting the first pattern 232, a distance between the adjacent dots 233 may increase as the first pattern 232 extends from the middle portion 234 to the outwardly direction. Hence, as described above, as the first pattern 232 extends from the middle portion 234 to the outwardly direction, the transmittance or the aperture ratio of the first pattern 232 may increase while the reflectance of the first pattern 232 decreases.

Figure 20:
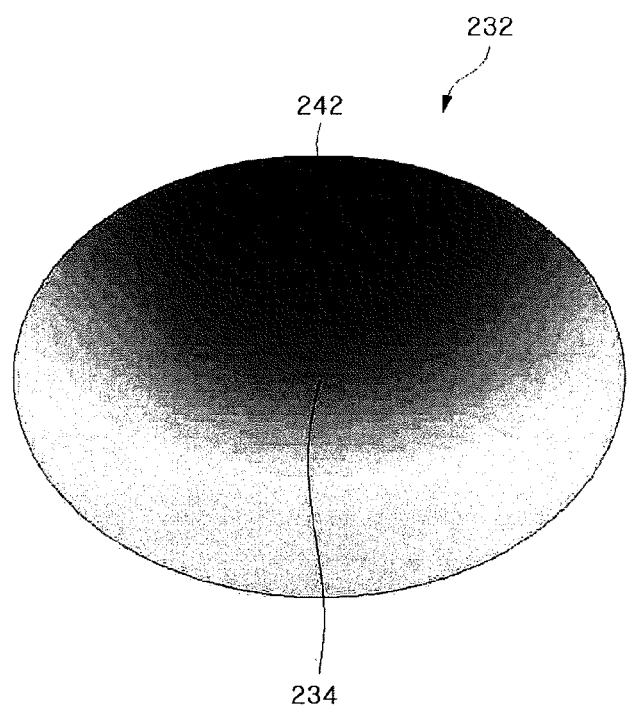

As shown in FIG. 20, the first pattern 232 may have an oval shape. The middle portion 234 of the first pattern 232 may coincide with the middle portion of the corresponding light source 220. Alternatively, the middle portion 234 of the first pattern 232 may not coincide with the middle portion of the corresponding light source 220. In other words, the middle portion 234 of the first pattern 232 may be formed at a location deviated from the middle portion of the corresponding light source 220 toward one direction (for example, a light emitting direction of the corresponding light source 220) in the same manner as FIGS. 8 to 10.

In this case, as the first pattern 232 extends from a portion 242 of the first pattern 232 corresponding to the middle portion of the light source 220 to the outwardly direction, the reflectance of the first pattern 232 may decrease or the transmittance of the first pattern 232 may increase. That is, the portion 242 of the first pattern 232 may be positioned at a location deviated from the middle portion 234 of the first pattern 232 in one direction. The portion 242 of the first pattern 232 may have a maximum reflectance or a minimum transmittance.

Figure 21:
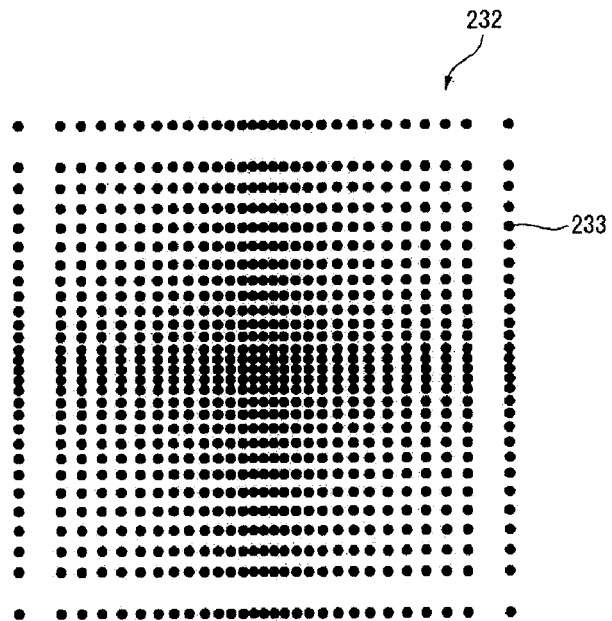
Figure 22:
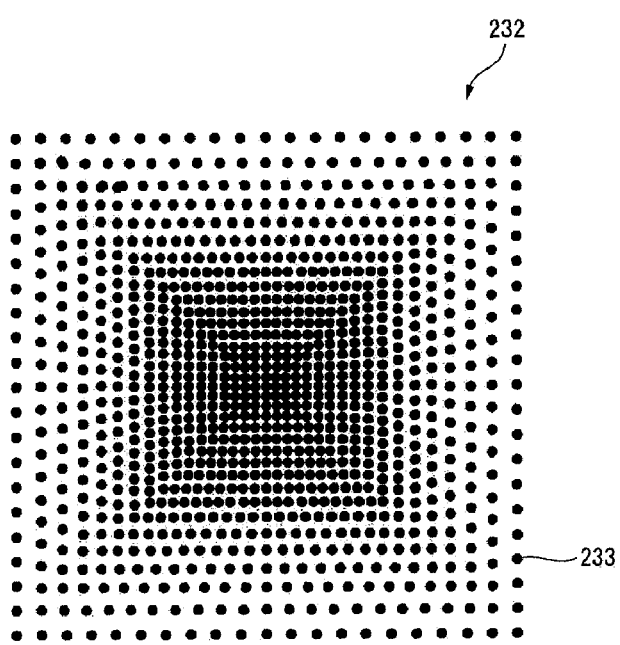

As shown in FIGS. 21 and 22, the first pattern 232 may have a rectangle or rectangular shape around the formation location of the light source 220. As the first pattern 232 extends from the middle portion to the outwardly direction, a reflectance of the first pattern 232 may decrease and a transmittance or an aperture ratio may increase.

The first rectangular pattern 232 shown in FIGS. 21 and 22 may have the same characteristics as the first pattern 232 shown in FIGS. 19 and 20. For example, an aperture ratio of the middle portion of the first pattern 232 overlapping the light source 220 may be equal to or less than 5% so as to prevent the generation of the hot spot.

Further, as shown in FIGS. 21 and 22, in the plurality of dots 233 constituting the first pattern 232, a distance between the adjacent dots 233 may increase as the first pattern 232 extends from the middle portion to the outwardly direction.

In the embodiment of the invention, the first pattern 232 is configured to include the plurality of dots as shown in FIGS. 19 to 22. However, other configurations may be used. The first pattern 232 may have any configuration as long as the reflectance of the first pattern 232 decreases and the transmittance or the aperture ratio of the first pattern 232 increases as the first pattern 232 extends from the middle portion to the outwardly direction.

For example, as the first pattern 232 extends from the middle portion to the outwardly direction, a concentration of a reflection material, for example, metal or metal oxide may decrease. Hence, the reflectance of the first pattern 232 may decrease and the transmittance or the aperture ratio of the first pattern 232 may increase. As a result, the concentration of light in an area adjacent to the light source 220 may be reduced.

Figure 23:
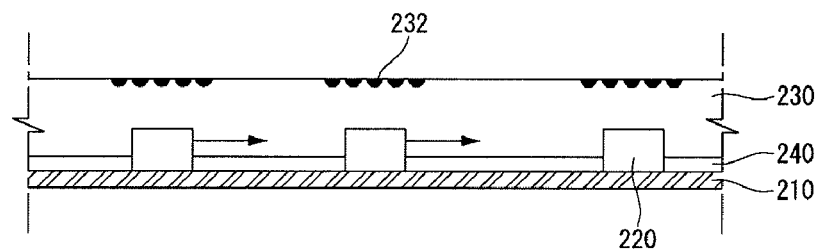
FIGS. 23 and 24 illustrate a fifth exemplary configuration of a backlight unit according to an exemplary embodiment of the invention.
Figure 24:
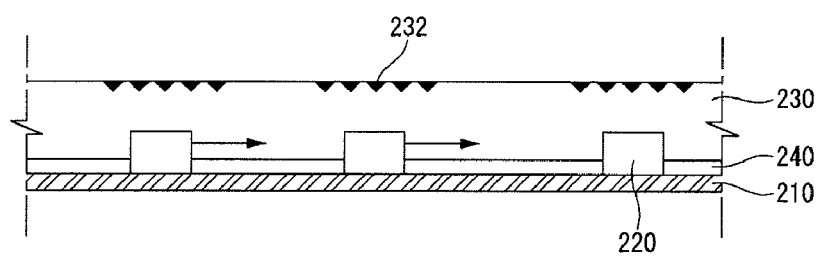

FIGS. 23 and 24 illustrate a fifth exemplary configuration of the backlight unit according to the embodiment of the invention. Structures and components identical or equivalent to those described in the first to fourth exemplary configurations may be designated with the same reference numerals in the fifth exemplary configuration, and a further description may be briefly made or may be entirely omitted.

As shown in FIG. 23, the first pattern 232 may have a convex shape protruding toward the light source 220. For example, the first pattern 232 may have a shape similar to a semicircle. A cross-sectional shape of the first pattern 232 may have a semicircle shape or an oval shape protruding toward the light source 220.

The first pattern 232 having the convex shape may reflect incident light at various angles. Hence, the first pattern 232 may uniformize the luminance of light emitted upward from the second layer 230 by diffusing more widely light emitted from the light source 220.

The first pattern 232 may include the reflection material such as metal or metal oxide as described above. For example, the first pattern 232 may be formed by forming a pattern on top of the second layer 230 by an intaglio method and then filling the intaglio pattern with a reflection material. Alternatively, the first pattern 232 may be formed on top of the second layer 230 by printing the reflection material on a film type sheet or attaching beads or metallic particles to the film type sheet and then pressing the film type sheet onto the second layer 230.

A cross-sectional shape of the first pattern 232 may have various shapes protruding toward the light source 220 in addition to a shape similar to the semicircle shown in FIG. 23. For example, as shown in FIG. 24, the cross-sectional shape of the first pattern 232 may have a triangular shape protruding toward the light source 220. In this case, the first pattern 232 may have a pyramid shape or a prism shape.

Figure 25:
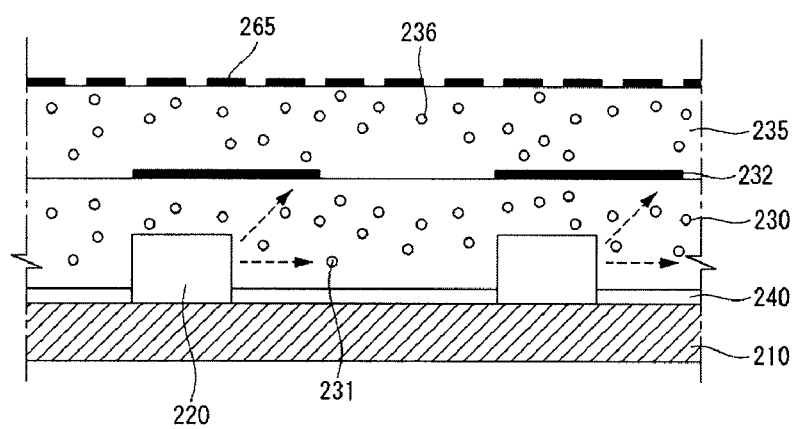
FIGS. 25 and 26 illustrate a sixth exemplary configuration of a backlight unit according to an exemplary embodiment of the invention.
Figure 26:
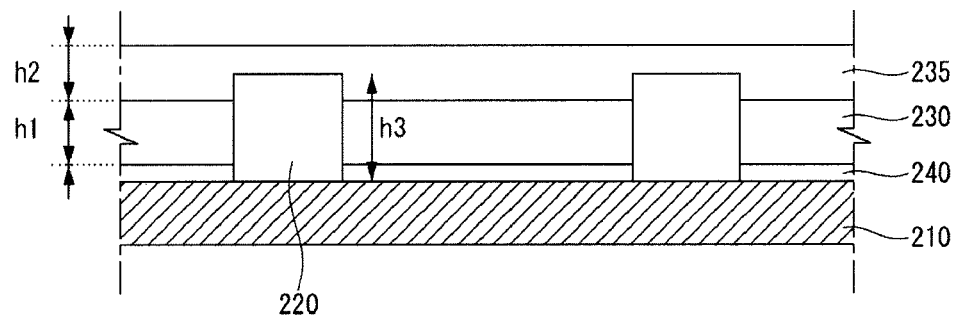

FIGS. 25 and 26 illustrate a sixth exemplary configuration of the backlight unit according to the embodiment of the invention. Structures and components identical or equivalent to those described in the first to fifth exemplary configurations may be designated with the same reference numerals in the sixth exemplary configuration, and a further description may be briefly made or may be entirely omitted.

Referring to FIG. 25, light emitted from the light source 220 may be diffused by the second layer 230 and may be emitted upward. Further, the second layer 230 can include the plurality of scattering particles 231 to scatter or refract the upward emitted light, thereby making the luminance of the upward emitted light more uniform.

In the embodiment of the invention, a third layer 235 may be disposed on top of the second layer 230. The third layer 235 may be formed of the same material as or a different material from the second layer 230 and may improve the uniformity of the luminance of the light of the backlight unit 200 by diffusing the light emitted upward from the second layer 230.

The third layer 235 may be formed of a material having a refractive index equal to or different from a refractive index of a material forming the second layer 230. For example, when the third layer 235 is formed of a material having a refractive index greater than the second layer 230, the third layer 235 can more widely diffuse the light emitted from the second layer 230. In contrast, when the third layer 235 is formed of a material having a refractive index less than the second layer 230, a reflectance of light, which is emitted from the second layer 230 and is reflected on the bottom of the third layer 235, can be improved. Hence, the third layer 235 may allow the light emitted from the light source 220 to easily travel along the second layer 230.

The third layer 235 may also include a plurality of scattering particles 236. In this case, a density of the scattering particles 236 of the third layer 235 may be greater higher than a density of the scattering particles 231 of the second layer 230.

As described above, because the third layer 235 includes the scattering particles 236 having the density greater than the scattering particles 231 of the second layer 230, the third layer 235 can more widely diffuse the light emitted upward from the second layer 230, thereby making the luminance of the light emitted from the backlight unit 200 more uniform.

In the embodiment of the invention, the first pattern 232 explained by referring to FIGS. 7 to 19 may be formed between the second layer 230 and the third layer 235 or inside at least one of the second layer 230 and the third layer 235.

As shown in FIG. 25, another pattern layer may be formed on top of the third layer 235. The pattern layer on the third layer 235 may include a plurality of second patterns 265.

The second patterns 265 on the top of the third layer 235 may be reflection patterns capable of reflecting at least a portion of light emitted from the second layer 230. Thus, the second patterns 265 may uniformize the luminance of light emitted from the third layer 235.

For example, when the light upward emitted from the third layer 235 is concentrated in a predetermined portion and is observed as light having a high luminance on the screen, the second patterns 265 may be formed in a region corresponding to the predetermined portion of the top of the third layer 235. Hence, the second patterns 265 may uniformize the luminance of light emitted from the backlight unit 200 by reducing the luminance of the light in the predetermined portion.

The second pattern 265 may be formed of titanium dioxide ($TiO_2$). In this case, a portion of light emitted from the third layer 235 may be reflected downward from the second patterns 265, and a remaining portion of the light emitted from the third layer 235 may be transmitted.

As shown in FIG. 26, a thickness h1 of the second layer 230 may be less than a height h3 of the light source 220. Hence, the second layer 230 may cover a portion of a lower part of the light source 220, and the third layer 235 may cover a portion of an upper part of the light source 220.

The second layer 230 may be formed of resin having a high adhesive strength. For example, an adhesive strength of the second layer 230 may be greater than the third layer 235. Hence, the light emitting surface of the light source 220 may be strongly attached to the second layer 230, and a space between the light emitting surface of the light source 220 and the second layer 230 may not be formed.

In the embodiment of the invention, the second layer 230 may be formed of silicon-based resin having a high adhesive strength, and the third layer 235 may be formed of acrylic resin. In this case, the refractive index of the second layer 230 may be greater than the refractive index of the third layer 235, and each of the second and third layers 230 and 235 may have the refractive index of approximately 1.4 to 1.6. Further, a thickness h2 of the third layer 235 may be less than the height h3 of the light source 220.

FIGS. 27 to 36 illustrate a seventh exemplary configuration of the backlight unit according to the exemplary embodiment of the invention. Structures and components identical or equivalent to those described in the first to sixth exemplary configurations may be designated with the same reference numerals in the seventh exemplary configuration, and a further description may be briefly made or may be entirely omitted.

Figure 27:
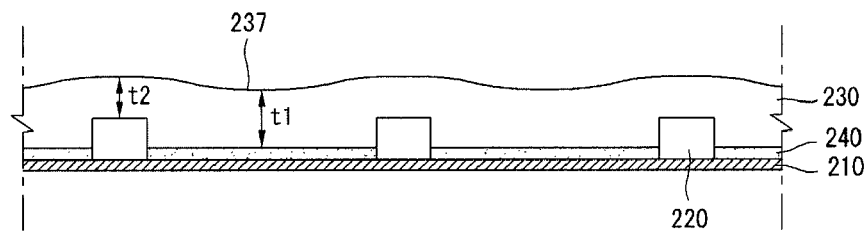
FIGS. 27 to 36 illustrate a seventh exemplary configuration of a backlight unit according to an exemplary embodiment of the invention.

As shown in FIG. 27, the second layer 230 on the first layer 210 on which the light sources 220 are positioned may include a depression 237 depressed toward the first layer 210. The depression 237 may be positioned between the two adjacent light sources 220. In other words, the second layer 230 may be concavely depressed between the two adjacent light sources 220. Further, both ends of the depression 237 may be respectively separated from both the light sources 220 adjacent to the depression 237 by a predetermined distance.

As above, when the second layer 230 includes the depression 237, a contact area between the second layer 230 and other layer (for example, an optical sheet) may increase. Hence, an adhesive strength between the second layer 230 and the other layer may be improved. As a result, a structural stability of the backlight unit 200 may be improved. Further, because the depression 237 of the second layer 230 may increase a contact area between the second layer 230 and other layer, an adhesive strength between the second layer 230 and the other layer may be sufficiently secured even if a relatively small amount of an adhesive is used. Accordingly, the thickness of the backlight unit 200 may be reduced.

The thickness of the second layer 230 may be sufficiently reduced so as to reduce the total thickness of the backlight unit 200. On the other hand, the second layer 230 may be formed on the light sources 220 so as to protect the light sources 220 from an external impact. Considering the above description, the thin second layer 230 may be formed on the light sources 220 so as to protect the light sources 220 from the external impact while reducing the total thickness of the backlight unit 200. Hence, a minimum thickness t1 of the second layer 230 in the depression 237 may be greater than a thickness t2 of the second layer 230 at a location corresponding to the light sources 220.

When the side view type light sources 220 are used, the depression 237 of the second layer 230 further diffuses the light transmitting through second layer 230, and may improve optical characteristics of the backlight unit.

Figure 28:
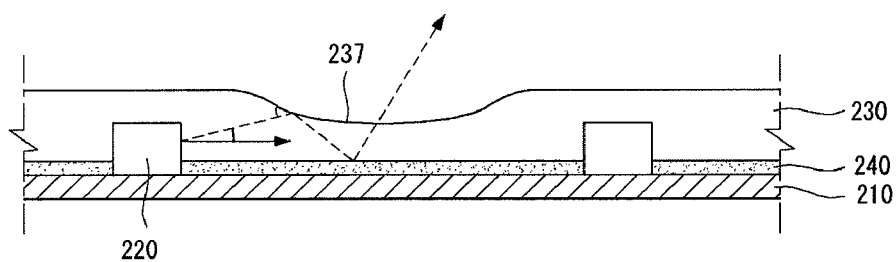

As shown in FIG. 28, light emitted from the light source 220 at a predetermined angle from the first layer 210 may reach the depression 237 of the second layer 230. The light reaching the depression 237 may be reflected by the depression 237. The light reflected by the inclined depression 237 may be incident on the reflection layer 240 at a relatively large angle and may be reflected again by the reflection layer 240. In other words, the light reflected by the reflection layer 240 may reach the surface of the second layer 230 at a relatively large angle and then may pass through the second layer 230. Thus, the depression 237 of the second layer 230 may improve the light efficiency.

Figure 29:
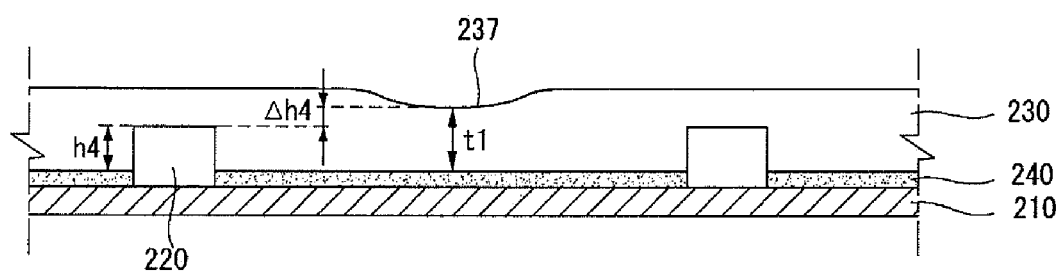

A minimum thickness of the depression 237 of the second layer 230 may vary. For example, as shown in FIG. 29, a minimum thickness t1 of the second layer 230 at the depression 237 area (i.e., the minimum thickness t1 of the depression 237) may be greater than a height h4 of the light source 220 measured from the reflection layer 240 by Δh4. In this case, a process for forming the depression 237 may be easily performed. In other words, it may be preferable that the minimum thickness t1 of the depression 237 is greater than the height h4 of the light source 220 measured from the reflection layer 240 in consideration of the easy formation process of the depression 237.

Figure 30:
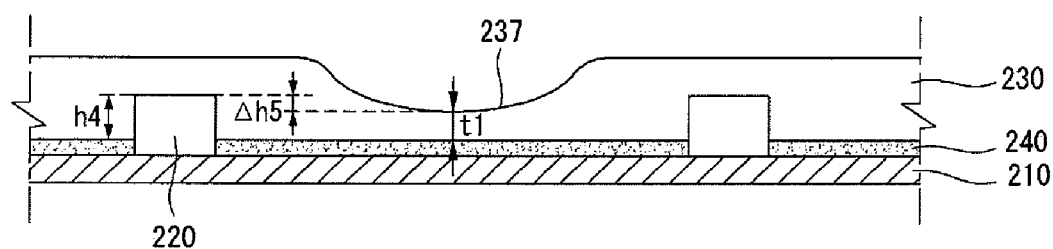

Alternatively, as shown in FIG. 30, the minimum thickness t1 of the second layer 230 in the depression 237 may be less than the height h4 of the light source 220 measured from the reflection layer 240 by Δh5. In this case, the depression 237 may reflect light emitted from the side of the side view type light source 220 toward the reflection layer 240, thereby improving light characteristics.

Figure 31:
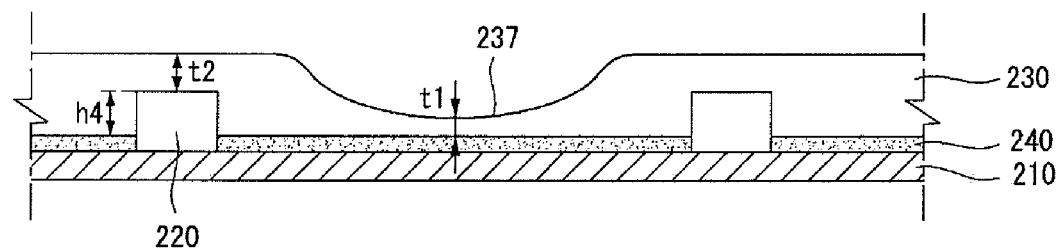

Alternatively, as shown in FIG. 31, the minimum thickness t1 of the second layer 230 in the depression 237 may be less than the height h4 of the light source 220 measured from the reflection layer 240 and may be less than the thickness t2 of the second layer 230 at a location corresponding to the light source 220. In this case, the reflection of light by the depression 237 may further increase, and thus the light characteristics may be further improved.

Figure 32:
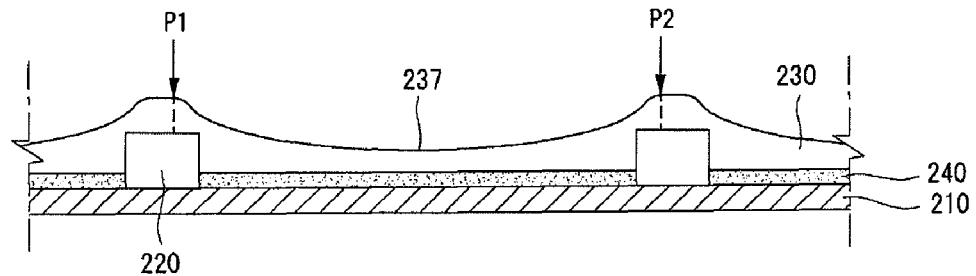
Figure 33:
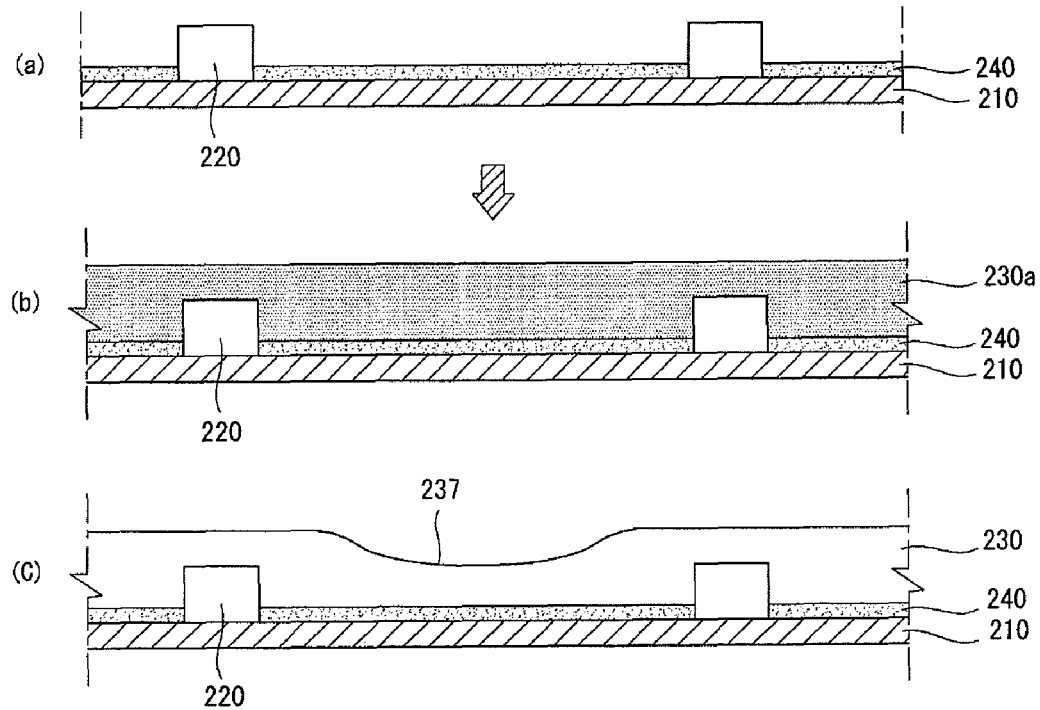

Alternatively, as shown in FIG. 32, a portion of the depression 237 may overlap the light source 220. For example, both ends P1 and P2 of the depression 237 may be respectively positioned on both the light sources 220 adjacent to the depression 237. In this case, the light characteristics may be further improved.

A method for forming the depression 237 according to an embodiment of the invention is described below.

As shown in FIG. 33(a), the light source 220 may be mounted on the first layer 210, and then the reflection layer 240 may be formed on the first layer 210.

Subsequently, as shown in FIG. 33(b), a liquid or gel type resin material may be coated on the first layer 210, on which the light source 220 and the reflection layer 240 are disposed, to form a resin material layer 230a. Alternatively, a previously manufactured sheet type resin material layer 230a may be laminated on the first layer 210.

Subsequently, the resin material layer 230a may be dried. Alternatively, low heat may be applied to the resin material layer 230a to dry the resin material layer 230a. Hence, as shown in FIG. 33(c), the resin material layer 230a may contract to form the depression 237. As a variation, heat may be applied to dry certain portions of the resin material layer 230a where the depressions are to be formed.

It may be preferable that when a drying process is used to form the depression 237 as described above, a viscosity of the resin material layer 230a is properly adjusted. For example, when the viscosity of the resin material layer 230a is excessively small, the depression 237 may has an excessively small depth or may not be formed. Further, when the viscosity of the resin material layer 230a is excessively large, the resin material layer 230a may flow downward. Hence, the thickness of the second layer 230 formed in a subsequent process may be excessively small.

Figure 34:
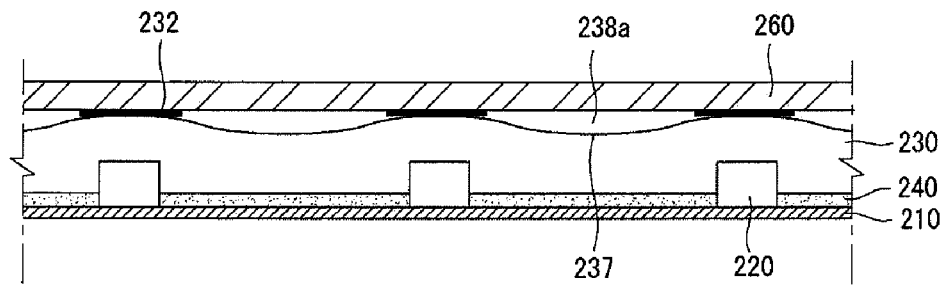
Figure 35:
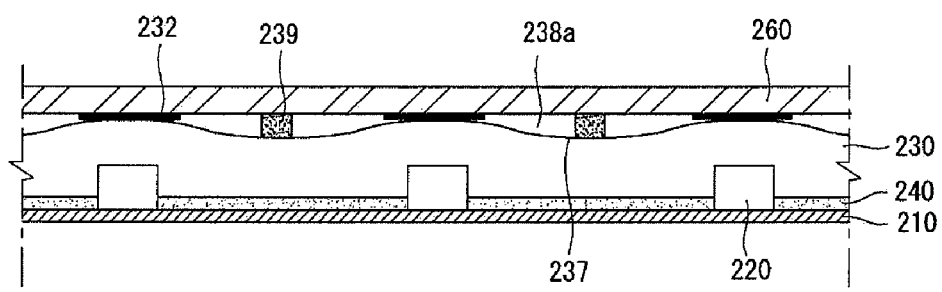
Figure 36:
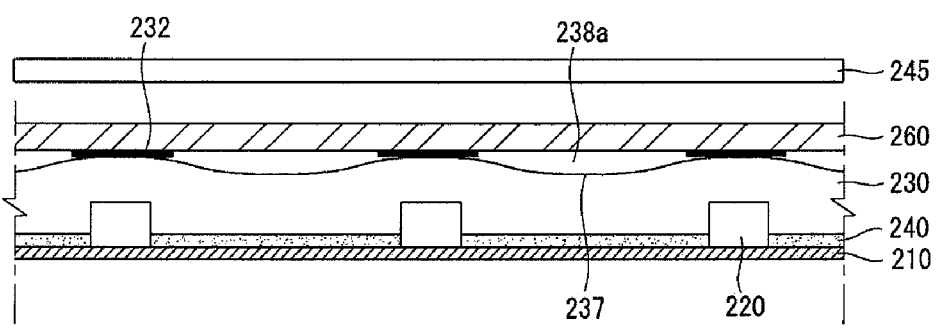

FIGS. 34 to 36 illustrate examples of the case where the transparent film and the first patterns are formed.

As shown in FIG. 34, the transparent film 260 may be positioned on the second layer 230 having the depression 237. The transparent film 260 may have the plurality of first patterns 232 formed on one surface of the transparent film 260 through the printing process in the same manner as FIG. 12. The transparent film 260 having the first patterns 232 may be stacked on the second layer 230.

The first air layer 238a may be formed between the transparent film 260 and the second layer 230. In other words, the first air layer 238a may be formed between the transparent film 260 and the second layer 230 having the depression 237 at a location corresponding to the depression 237. The first air layer 238 preferably refers to air gaps. A refractive index of the first air layer 238a is substantially 1 and may be different from a refractive index of the second layer 230 and a refractive index of the transparent film 260. Hence, the first air layer 238a may efficiently diffuse light emitted from the light source 220.

Further, as shown in FIG. 35, the adhesive layer 239 may be formed between the transparent film 260 and the second layer 230 having the depression 237. The adhesive layer 239 may attach the transparent film 260 to the second layer 230. Further, the adhesive layer 239 may provide a gap between the transparent film 260 and the second layer 230, thereby facilitating a formation of the first air layer 238a.

Further, as shown in FIG. 36, the diffusion plate 245 may be positioned on the transparent film 260. Because the diffusion plate 245 has a hard plate shape, the diffusion plate 245 may serve as a supporter of other functional layers and may diffuse light emitted from the light source 220. Although it is not shown, the diffusion plate 245 may include a plurality of beads. The diffusion plate 245 may scatter incident light using the beads to thereby prevent a concentration of light in a predetermined portion.

Figure 37:
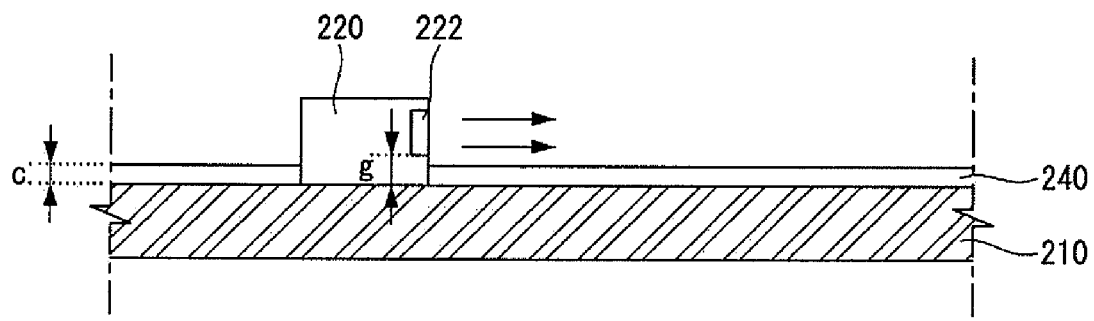
FIG. 37 illustrates a location relationship between light sources and a reflection layer of a backlight unit according to an embodiment of the invention.

FIG. 37 illustrates a location relationship between the light source 220 and the reflection layer 240 of the backlight unit according to an embodiment of the invention.

As shown in FIG. 37, because the reflection layer 240 is disposed at a side of the light source 220, a portion of light emitted from the light source 220 toward the side of the light source 220 may be incident on the reflection layer 240 and may be lost.

The loss of light emitted from the light source 220 decreases an amount of the light that is incident on the second layer 230 and then passes through the second layer 230. Hence, an amount of light incident on the display panel 110 from the backlight unit 200 may decrease. As a result, the luminance of the image displayed on the display device may be reduced.

Each of the light sources 220 may include a light emitting unit 222 (e.g., LED) emitting light. The light emitting unit 222 may be positioned at a location separated from the surface of the first layer 210 by a predetermined height "g".

The thickness "c" of the reflection layer 240 may be equal to or less than the height "g" of the light emitting unit 222. Hence, the light source 220 may be positioned above the reflection layer 240.

Accordingly, the thickness "c" of the reflection layer 240 may be approximately 0.02 mm to 0.08 mm. When the thickness "c" of the reflection layer 240 is equal to or greater than 0.02 mm, the reflection layer 240 may have a light reflectance within a reliable range. When the thickness "c" of the reflection layer 240 is equal to or less than 0.08 mm, the reflection layer 240 may cover the light emitting unit 222 of the light source 220. Hence, a loss of light emitted from the light source 220 may be prevented.

Accordingly, the thickness "c" of the reflection layer 240 may be approximately 0.02 mm to 0.08 mm, so that the reflection layer 240 improves an incident efficiency of light emitted from the light source 220 and reflects most of light emitted from the light source 220.

Figure 38:
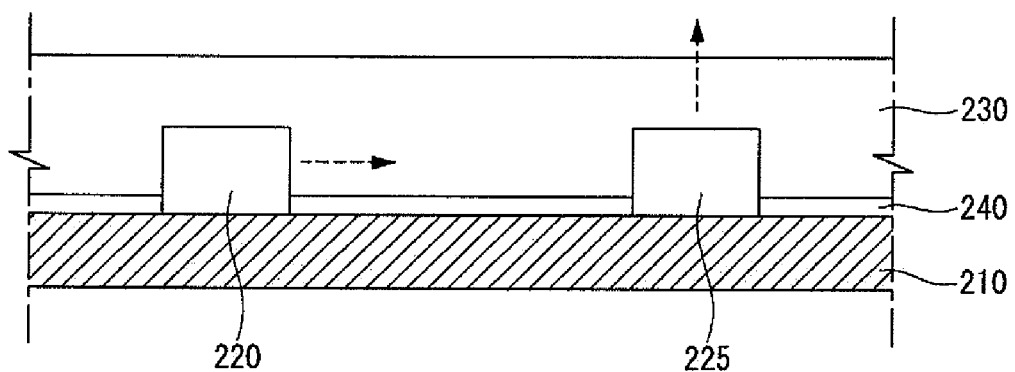
FIG. 38 illustrates a structure of a plurality of light sources of a backlight unit according to an embodiment of the invention.

FIG. 38 illustrates a structure of the light source of the backlight unit according to an embodiment of the invention.

As shown in FIG. 38, a first light source 220 and a second light source 225 of the plurality of light sources 220 of the backlight unit 200 may emit light in different directions.

For example, the first light source 220 may emit light in the lateral direction. For this, the first light source 220 may be configured using the side view type LED package. The second light source 225 may emit light in the upward direction. For this, the second light source 225 may be configured using the top view type LED package. In other words, the plurality of light sources 220 of the backlight unit 200 may be configured by combining the side view type LED packages and the top view type LED packages.

As described above, because the backlight unit 200 is configured by combining two or more light sources that emit light in different directions, an increase and a reduction in the luminance of light in a predetermined area may be prevented. As a result, the backlight unit 200 may provide light with the uniform luminance to the display panel 110.

In FIG. 38, the embodiment of the invention is described using a case where the first light source 220 emitting the light in the lateral direction and the second light source 225 emitting the light in the upward direction are disposed adjacent to each other as an example, but the invention is not limited thereto. For example, the side view type light sources may be disposed adjacent to each other or the top view type light sources may be disposed adjacent to each other.

Figure 39:
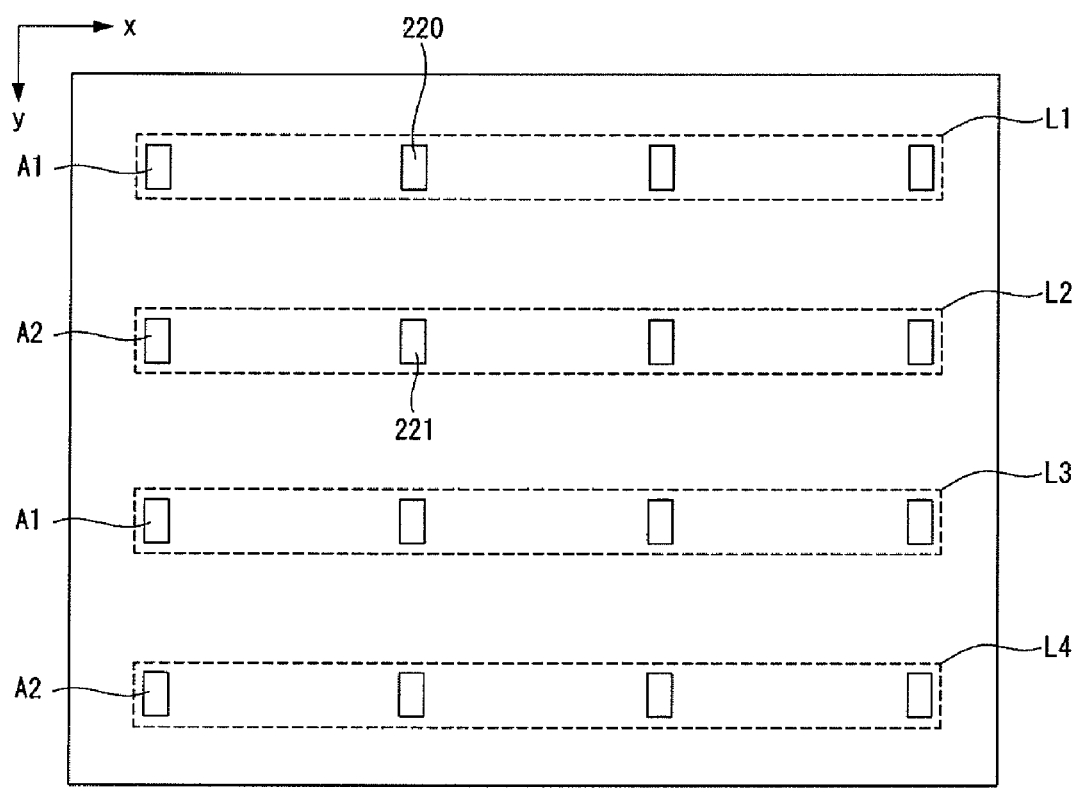
FIGS. 39 to 41 illustrate a front shape of a backlight unit according to an exemplary embodiment of the invention.
Figure 40:
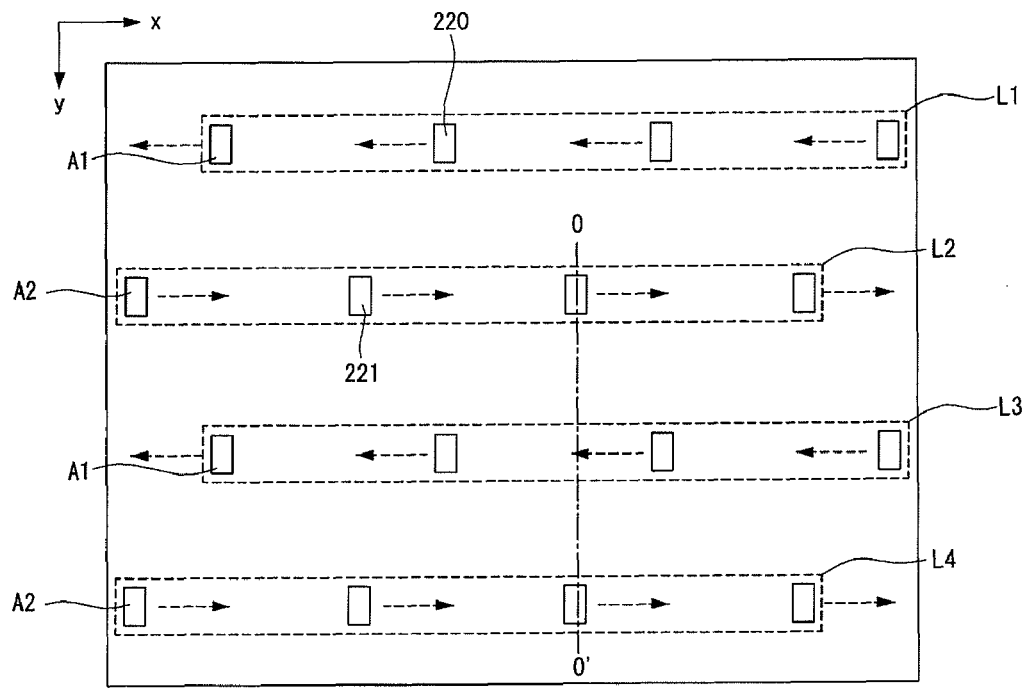
Figure 41:
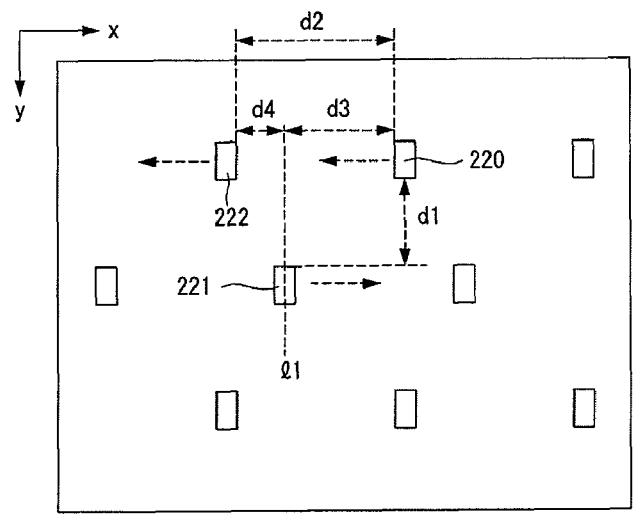

FIGS. 39 to 41 are front views and illustrate examples of a backlight unit according to the exemplary embodiment of the invention. Although these are front views of the backlight, the light sources are shown to illustrate the arrangement of the light sources.

As shown in FIG. 39, the plurality of light sources 220 and 221 of the backlight unit 200 may be divided into a plurality of arrays, for example, a first light source array A1 and a second light source array A2.

Each of the first light source array A1 and the second light source array A2 may include a plurality of light source lines each including light sources. For example, the first light source array A1 may include a plurality of light source lines L1 each including at least two light sources, and the second light source array A2 may include a plurality of light source lines L2 each including at least two light sources The plurality of light source lines L1 of the first light source array A1 and the plurality of light source lines L2 of the second light source array A2 may be alternately disposed so as to correspond to the display area of the display panel 110.

In the embodiment of the invention, the first light source array A1 may include odd-numbered light source lines each including at least two light sources from the top of the plurality of light source lines, and the second light source array A2 may include even-numbered light source lines each including at least two light sources from the top of the plurality of light source lines.

In the embodiment of the invention, the backlight unit 200 may be configured so that a first light source line L1 of the first light source array A1 and a second light source line L2 of the second light source array A2 are disposed adjacent to each other up and down and the first light source line L1 and the second light source line L2 are alternately disposed.

Further, the light source 220 of the first light source array A1 and the light source 221 of the second light source array A2 may emit light in the same direction or in different directions.

As shown in FIG. 40, the backlight unit 200 may include two or more light sources that emit light in different directions.

In other words, the light sources 220 of the first light source array A1 and the light sources 221 of the second light source array A2 may emit light in different directions. For this, a facing direction of light emitting surfaces of the light sources 220 of the first light source array A1 face may be different from a facing direction of light emitting surfaces of the light sources 221 of the second light source array A2.

More specifically, the light emitting surface of the first light source 220 of the first light source array A1 and the light emitting surface of the second light source 221 of the second light source array A2 may face in opposite directions or substantially opposite directions. For example, the first light source 220 of the first light source array A1 and the second light source 221 of the second light source array A2 may emit light in opposite directions or substantially opposite directions. In this case, each of the light sources of the backlight unit 200 may emit light in the lateral direction and may be configured by using the side view-type LED package.

The plurality of light sources of the backlight unit 200 may be disposed while forming two or more lines. Two or more light sources on the same line may emit light in the same direction. For example, light sources adjacent to right and left sides of the first light source 220 may emit light in the same direction as the first light source 220, i.e., in the opposite direction of the x-axis direction. Light sources adjacent to right and left sides of the second light source 221 may emit light in the same direction as the second light source 221, i.e., in the x-axis direction.

As described above, the light sources (for example, the first light source 220 and the second light source 221) disposed adjacent to each other in a y-axis direction may be configured so that their light emitting directions are opposite to each other. Hence, the luminance of light emitted from the light sources may be prevented from being increased or reduced in a predetermined area of the backlight unit 200.

For instance, because the light emitted from the first light source 220 travels toward the light source adjacent to the first light source 220, a luminance of light may be reduced. As a result, the luminance of the light, which is emitted from the first light source 220, travels to an area distant from the first light source 220, and is emitted from the area in a direction of the display panel 110, may be reduced.

Accordingly, because the first light source 220 and the second light source 221 emit light in the opposite directions in the embodiment of the invention, a luminance of light emitted from the first light source 220 and the second light source 221 may be complementarily prevented from increasing in the area adjacent to the light source and from being reduced in the area distant from the light source. Hence, the luminance of light provided by the backlight unit 200 may be uniformized.

Further, the light sources of the first light source line L1 of the first light source array A1 and the light sources of the second light source line L2 of the second light source array A2 may not be disposed in a straight line in a vertical direction and may be staggered in the vertical direction. As a result, the uniformity of light emitted from the backlight unit 200 can be improved. That is, the first light source 220 of the first light source array A1 and the second light source 221 of the second light source array A2 may be disposed adjacent to each other in a diagonal direction or in a staggered manner.

As shown in FIG. 41, two vertically adjacent light source lines (for example, the first and second light source lines L1 and L2) respectively included in the first and second light source arrays A1 and A2 may be separated from each other by a predetermined distance d1. In other words, the first light source 220 of the first light source array A1 and the second light source 221 of the second light source array A2 may be separated from each other by the predetermined distance d1 based on the y-axis direction perpendicular to an x-axis being a light emitting direction.

As the distance d1 between the first and second light source lines L1 and L2 increases, an area which light emitted from the first light source 220 or the second light source 221 cannot reach may be generated. Thus, the luminance of light in the non-reach area may be greatly reduced. Further, as the distance d1 between the first and second light source lines L1 and L2 decreases, the light emitted from the first light source 220 and the light emitted from the second light source 221 may interfere with each other. In this case, the division driving efficiency of the light sources may be deteriorated.

Accordingly, the distance d1 between the adjacent light source lines (for example, the first and second light source lines L1 and L2) in a crossing direction of the light emitting direction may be approximately 5 mm to 22 mm, so as to uniformize the luminance of the light emitted from the backlight unit 200 while reducing the interference between the light sources.

Further, the third light source 222 included in the first light source line L1 of the first light source array A1 may be disposed adjacent to the first light source 220 in the light emitting direction. The first light source 220 and the third light source 222 may be separated from each other by a predetermined distance d2.

A light orientation angle $\theta$ from the light source and a light orientation angle $\theta'$ inside the second layer 230 may satisfy the following Equation 1 in accordance with Snell's law. The angle α of FIG. 6 may be an example of the light orientation angle θ.

$$\frac{n1}{n2} = \frac{\sin\theta'}{\sin\theta} \quad \text{[Equation 1]}$$

Considering that a light emitting portion of the light source is an air layer (having a refractive index n1 of 1) and the orientation angle θ of light emitted from the light source is generally 60°, the light orientation angle θ' inside the second layer 230 may have a value indicated in the following Equation 2 in accordance with the above Equation 1.

$$\sin\theta' = \frac{\sin 60°}{n2} \quad \text{[Equation 2]}$$

Further, when the second layer 230 is formed of an acrylic resin such as polymethyl methacrylate (PMMA), the second layer 230 has a refractive index of approximately 1.5. Therefore, the light orientation angle θ' inside the second layer 230 may be approximately 35.5° in accordance with the above Equation 2.

As described with reference to the above Equations 1 and 2, the light orientation angle θ' of the light emitted from the light source in the second layer 230 may be less than 45°. As a result, a travelling range of light emitted from the light source in the y-axis direction may be less than a travelling range of the light emitted from the light source in the x-axis direction.

Accordingly, the distance d1 between two adjacent light sources (for example, the first and second light sources 220 and 221) in a crossing direction of the light emitting direction may be smaller than the distance d2 between two adjacent light sources (for example, the first and third light sources 220 and 222) in the light emitting direction. As a result, the luminance of the light emitted from the backlight unit 200 can be uniformized.

Considering the distance d1 between the two adjacent light sources having the above-described range, the distance d2 between two adjacent light sources (for example, the first and third light sources 220 and 222) in the light emitting direction may be approximately 9 mm to 27 mm, so as to uniformize the luminance of the light emitted from the backlight unit 200 while reducing the interference between the light sources.

The second light source 221 of the second light source array A2 may be disposed between the adjacent first and third light sources 220 and 222 included in the first light source array A1.

That is, the second light source 221 may be disposed adjacent to the first light source 220 and the third light source 222 in the y-axis direction and may be disposed on a straight line l passing between the first light source 220 and the third light source 222. In this case, a distance d3 between the straight line l on which the second light source 221 is disposed and the first light source 220 may be greater than a distance d4 between the straight line l and the third light source 222.

Light emitted from the second light source 221 travels in the opposite direction to a light emitting direction of the third light source 222, and thus the luminance of light emitted toward the display panel 110 may be reduced in an area adjacent to the third light source 222.

Accordingly, in the embodiment of the invention, because the second light source 221 is disposed closer to the third light source 222 than to the first light source 220, the reduction in the luminance of light in the area adjacent to the third light source 222 may be compensated using an increase in the luminance of light in the area adjacent to the second light source 221.

Figure 42:
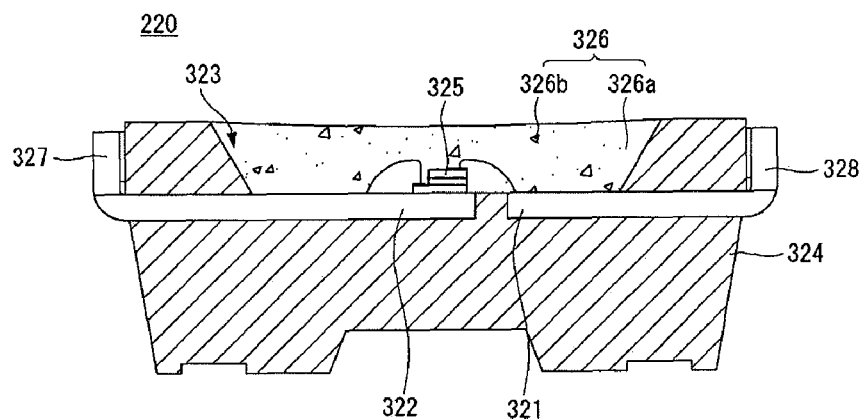
FIGS. 42 to 48 illustrate a structure of a plurality of light sources of a backlight unit according to an embodiment of the invention.
Figure 43:
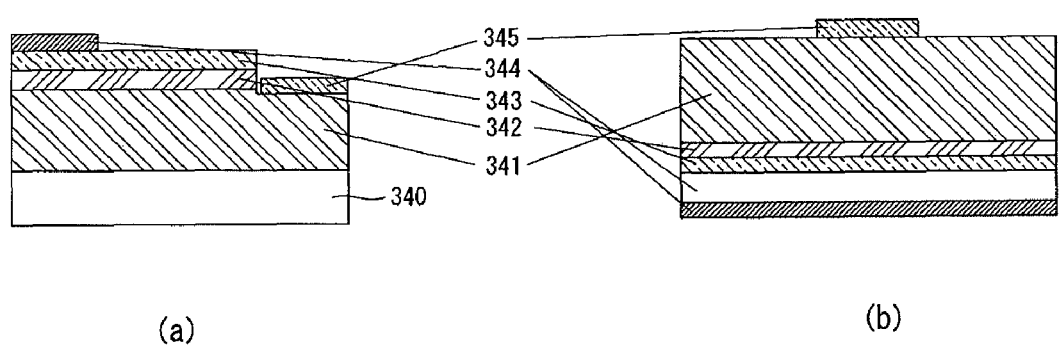
Figure 44:
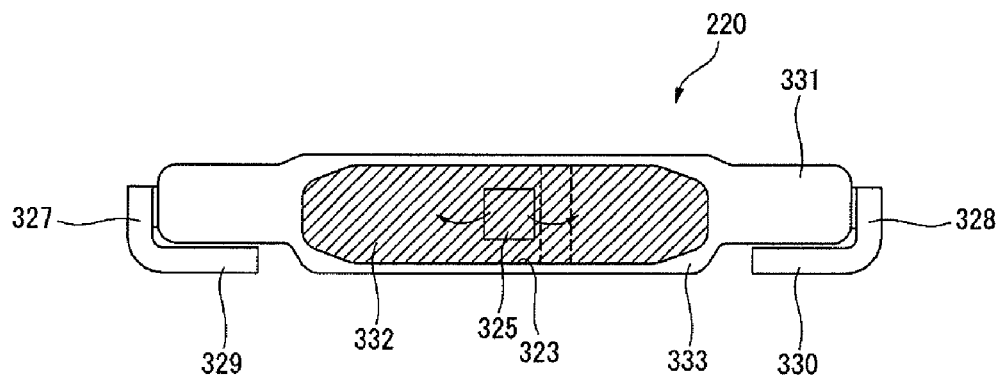
Figure 45:
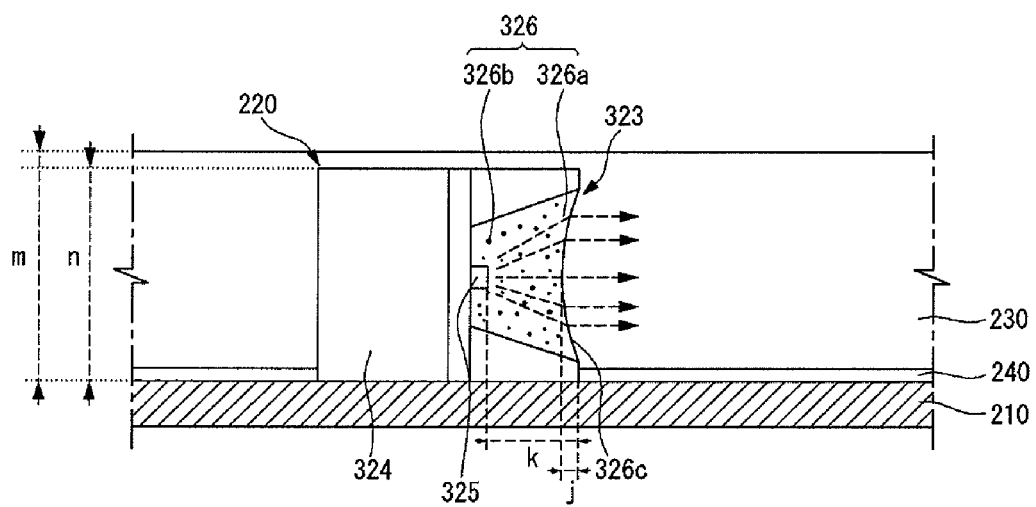
Figure 46:
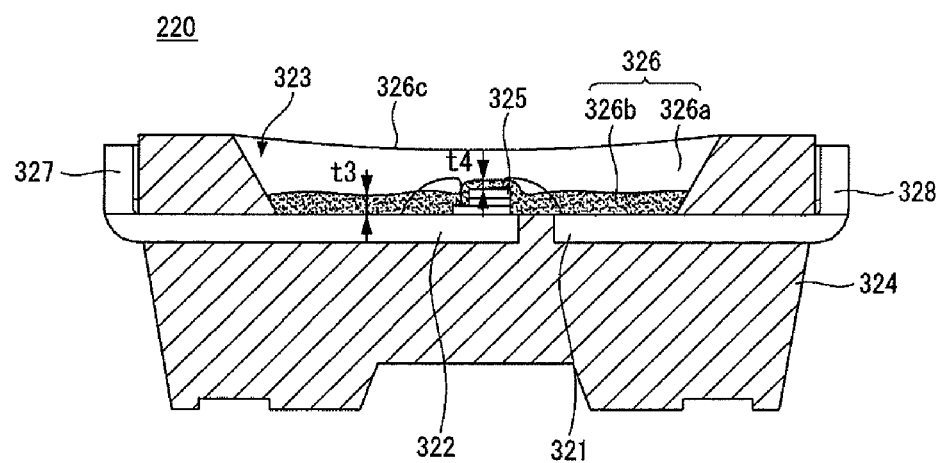
Figure 47:
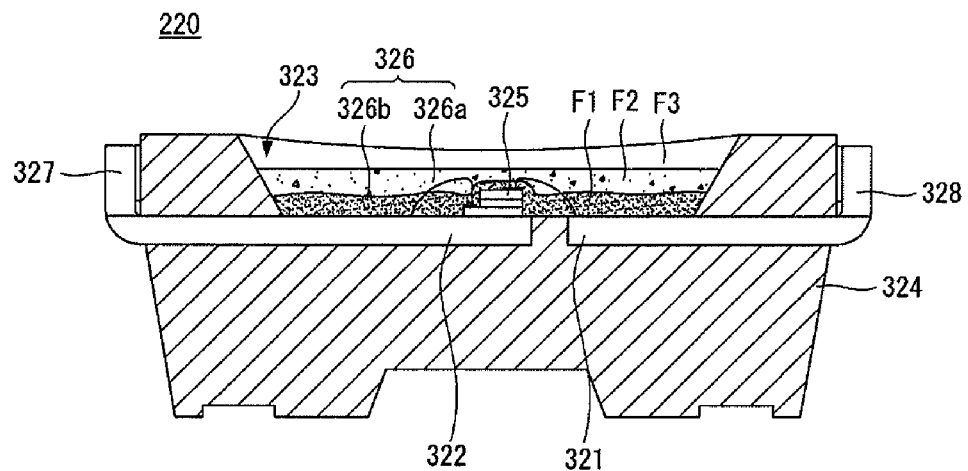

FIGS. 42 to 48 illustrate examples of a structure of the light source of the backlight unit according to an embodiment of the invention. More specifically, FIGS. 42, 46, and 47 illustrate examples of the structure of the light source when viewed from the side of the light source, FIG. 43 is a cross-sectional view of a light emitting element of the light source, FIG. 44 illustrates a structure of the light source when viewed from the front of the light source, and FIG. 45 illustrates a structure of the light source on the first layer 210.

As shown in FIG. 42, the light source 220 may include a plurality of lead frames 321 and 322, a mold part 324 having a cavity 323, a light emitting element 325 that is connected to the lead frames 321 and 322 and is mounted in the cavity 323, an encapsulation material 326 for filling the cavity 323 in which the light emitting element 325 is mounted.

The light emitting element 325 may be a light emitting diode (LED) chip. The LED chip may be configured by a blue LED chip or an infrared LED chip or may be configured by at least one of a red LED chip, a green LED chip, a blue LED chip, a yellow green LED chip, and a white LED chip or a combination thereof. The light emitting element 325 may be classified into a horizontal type light emitting element and a vertical type light emitting element depending on its structure.

As shown in FIG. 43(*a*), the horizontal type light emitting element may be positioned on a substrate 340. The substrate 340 may be a single crystal substrate formed of sapphire, spinel, silicon carbide, zinc oxide, magnesium oxide, GaN, AlGaN, AlN, NGO (NdGaO$_3$), LGO (LiGaO$_2$), LAO (LaAlO$_3$), etc.

An n-type semiconductor layer 341 may be positioned on the substrate 340 and may be formed of, for example, n-GaN. An active layer 342 may be positioned on the n-type semiconductor later 341 and may be formed of, for example, InGaN. A p-type semiconductor later 343 may be positioned on the active layer 342 and may be formed of, for example, p-GaN. A p-type electrode 344 may be positioned on the p-type semiconductor layer 343 and may contain at least one of chromium (Cr), nickel (Ni), and gold (Au). An n-type electrode 345 may be positioned on the n-type semiconductor layer 341 and may contain at least one of chromium (Cr), nickel (Ni), and gold (Au).

As shown in FIG. 43(*b*), the vertical type light emitting element may have the structure in which the p-type electrode 345, the n-type semiconductor layer 341, the active layer 342, and the p-type semiconductor layer 343 are stacked on the n-type electrode 344.

In the light emitting element shown in FIGS. 43(*a*) and 43(*b*), when a voltage is applied to the p-type electrode 344 and the n-type electrode 345, holes and electrons are combined on the active layer 342. The light emitting element shown in FIGS. 43(*a*) and 43(*b*) may operate by emitting light energy corresponding to a height difference (i.e., an energy gap) between a conduction band and a valence band.

Referring again to FIG. 42, the light emitting element 325 may be packaged in the mold part 324 constituting a body of the light source 220. For this, the cavity 323 may be formed at one side of the center of the mold part 324. The mold part 324 may be injection-molded with a resin material such as polyphtalamide (PPA) to a press (Cu/Ni/Ag substrate), and the cavity 323 of the mold part 324 may serve as a reflection cup. The shape or structure of the mold part 324 may be changed and is not limited thereto.

Each of the lead frames 321 and 322 may penetrate the mold part 324 in a long axis direction of the mold part 324. Ends 327 and 328 of the lead frames 321 and 322 may be exposed to the outside of the mold part 324. Herein, when viewed from the bottom of the cavity 323 where the light emitting element 325 is disposed, a long-direction symmetrical axis of the mold part 324 is referred to as a long axis and a short-direction symmetrical axis of the mold part 324 is referred to as a short axis.

A semiconductor device such as a light receiving element and a protection element may be selectively mounted on the lead frames 321 and 322 in the cavity 323 along with the light emitting element 325. That is, the protection device such as a zener diode for protecting the light emitting element 325 from electrostatic discharge (ESD) may be mounted on the lead frames 321 and 322 along with the light emitting element 325.

The light emitting element 325 may attach to any one lead frame (for example, the lead frame 322) positioned on the bottom of the cavity 323, and then may be bonded by wire bonding or flip chip bonding.

After the light emitting element 325 is connected inside the cavity 323, a mounting area may be filled with the encapsulation material 326. The encapsulation material 326 may include a liquid resin 326a and a phosphor 326b. The liquid resin 326a may be silicon or an epoxy material and may be a transparent material. A color of the phosphor 326b depends on a color of light that the light emitting element 325 emits. For example, when the light emitting element 325 emits blue light, the phosphor 326b may be yellow.

At least one side of the cavity 323 may be inclined, and the inclined side of the cavity 323 may serve as a reflection surface or a reflection layer for selectively reflecting incident light. The cavity 323 may have a polygonal exterior shape and may have other shapes other than a polygonal shape.

As shown in FIG. 44, a head part 331 of each light source 220 corresponding to a light emitting part may include a light emitting surface 332, from which light is actually emitted, and a non-emitting surface 333, which is a surface other than the light emitting surface 332 and does not emit light.

More specifically, the light emitting surface 332 of the head part 331 of the light source 220 may be formed by the mold part 324 and may be defined by the cavity 323 in which the light emitting element 325 is positioned. For example, the light emitting element 325 may be disposed in the cavity 323 of the mold part 324, and light emitted from the light emitting element 325 may be emitted through the light emitting surface 332 surrounded by the mold part 324. Further, the non-emitting surface 333 of the head part 331 of the light source 220 may be a portion where the mold part 324 is formed and the light is not emitted.

Further, the light emitting surface 332 of the head part 331 of the light source 220 may have a shape in which a transverse length is longer than a longitudinal length. Other shapes may be used for the light emitting surface 332 of the head part 331. For example, the light emitting surface 332 may have a rectangular shape.

In addition, the non-emitting surface 333 of the light source 220 may be positioned at upper, lower, left, or right side of the light emitting surface 332 of the head part 331 of the light source 220.

The ends 327 and 328 of the lead frames 321 and 321 may be first formed to extend to the outside of the mold part 324 and then may be secondly formed in one groove of the mold part 324. Hence, the ends 327 and 328 may be disposed in first and second lead electrodes 329 and 330. Herein, the number of forming operations may vary.

The first and second lead electrodes 329 and 330 of the lead frames 321 and 322 may be formed to be received in grooves formed at both sides of the bottom of the mold part 324. Further, the first and second lead electrodes 329 and 330 may be formed to have a plate structure of a predetermined shape and may have a shape in which solder bonding is easily performed in surface mounting.

As shown in FIG. 45, the encapsulation material 326 may include the liquid resin 326a and the phosphor 326b and may be positioned in the cavity 323. The encapsulation material 326 may protect the light emitting element 325 and may convert a color of light emitted from the light emitting element 325. A surface 326c of the encapsulation material 326 may have a concave lens shape with respect to an upper part of the cavity 323. The surface 326c of the encapsulation material 326 may indicate an area where light emitted from the light emitting element 325 is emitted to the outside of the encapsulation material 326. A refractive index of light emitted from the light emitting element 325 may vary depending on a shape of the surface 326c of the encapsulation material 326.

In the embodiment of the invention, because the surface 326c of the encapsulation material 326 has the concave lens shape with respect to the upper part of the cavity 323, light emitted from the light emitting element 325 may be refracted by the surface 326c of the encapsulation material 326 and may travel in a direction parallel to the first layer 210.

As described above, light emitted from the light sources 220 of the backlight unit 200 according to the embodiment of the invention has to reach the light source 220 adjacent to each light source 220. For example, light emitted from one light source 220 has to reach another light source 200 adjacent to the one light source 220 in an emitting direction of the light. Hence, the backlight unit 200 may provide light with the uniform luminance.

Accordingly, in the embodiment of the invention, because light emitted from the light emitting element 325 is refracted by the surface 326c of the encapsulation material 326 and travels in the direction parallel to the first layer 210, light emitted from one light source 220 is directed towards the neighboring light source 220. As a result, the backlight unit 200 may provide light with the uniform luminance.

The concave lens-shaped surface 326c of the encapsulation material 326 may have a predetermined concave depth depending on the optical characteristics. For example, a concave depth "j" of the surface 326c of the encapsulation material 326 may approximately occupy 1% to 30% of a depth "K" ranging from the top of the light emitting element 325 to the top of the cavity 323.

When an occupying percentage of the concave depth "j" of the surface 326c is equal or greater than 1% of the depth "K", light emitted from the light emitting element 325 may be refracted by the surface 326c of the encapsulation material 326 and may travel in the direction parallel to the first layer 210. Hence, light emitted from the light source 220 may reach the neighboring light source 220, and the backlight unit 200 may provide light with the uniform luminance. Further, when the occupying percentage of the concave depth "j" of the surface 326c is equal or less than 30% of the depth "K", the surface 326c may serve as a buffer so that the phosphor 326b may convert a color of light emitted from the light emitting element 325 into another color. Hence, various colors of light may be sufficiently achieved. For example, when the light emitting element 325 emits blue light and the phosphor 326b is yellow, the light source 220 may emit white light because of the blue light and the yellow phosphor 326b.

Further, the concave depth "j" of the surface 326c of the encapsulation material 326 may approximately occupy 5% to 15% of the depth "K" ranging from the top of the light emitting element 325 to the top of the cavity 323. Accordingly, light emitted from the light emitting element 325 of the light source 220 may reach the adjacent light source 200, and the backlight unit 200 may provide light with a more uniform luminance. Further, the phosphor 326b may sufficiently convert light emitted from the light emitting element 325.

As shown in FIG. 45, the second layer 230 may be formed on the light source 220 to cover the light source 220. In particular, the surface 326c of the encapsulation material 326 of the light source 220 may contact the second layer 230. The second layer 230 formed of a resin may have a predetermined adhesive strength. When the surface 326c of the encapsulation material 326 of the light source 220 has the concave lens shape, an attachable effective area of the surface 326c of the encapsulation material 326 attached to the second layer 230 may increase. Accordingly, an adhesive area between the second layer 230 formed of the resin and the surface 326c of the encapsulation material 326 may increase, and an adhesive strength between the second layer 230 and the surface 326c of the encapsulation material 326 may increase.

When the light emitting element 325 of the light source 220 is driven, the light emitting element 325 may generate much heat. Thus, a height "m" ranging from the top of the first layer 210 to the top of the second layer 230 may be equal to or greater than a height "n" ranging from the top of the first layer 210 to the top of the light source 220.

When the height "m" is equal to the height "n", heat generated by the light emitting element 325 may be easily emitted to the outside through the second layer 230. Further, the height "m" is greater than the height "n", the light source 220 may be protected from an external impact. Further, the height "m" ranging from the top of the first layer 210 to the top of the second layer 230 may be similar to the height "n" ranging from the top of the first layer 210 to the top of the light source 220.

The light emitting element 325 may contact the encapsulation material 326 covering the light emitting element 325, and the encapsulation material 326 may contact the second layer 230. As described above, when the light emitting element 325 of the light source 220 is driven, the light emitting element 325 may generate much heat.

Because the light source 220 according to the embodiment of the invention has the structure in which the encapsulation material 326 formed of a resin on the light emitting element 325 contacts the second layer 230, heat generated in the light emitting element 325 is conducted to the encapsulation material 326 contacting the light emitting element 325, and the heat conducted to the encapsulation material 326 may be discharged to the outside through the second layer 230 contacting the encapsulation material 326. Accordingly, the heat generated in the light emitting element 325 may be easily discharged to the outside, and a reduction in the reliability of the backlight unit 200 resulting from the heat of the light emitting element 325 may be prevented.

In the light source 220 having the above-described structure, light emitted from the light emitting element 325 may be transmitted by the encapsulation material 326 and then may be transmitted by the second layer 230 contacting the encapsulation material 326. In other words, light emitted from the light emitting element 325 may sequentially pass through the encapsulation material 326 and the second layer 230 and then may be provided to the display panel.

As shown in FIG. 46, the light emitting element 325 of the light source 220 may be mounted in the cavity 323, and the cavity 323 including the light emitting element 325 may be filled with the encapsulation material 326.

The encapsulation material 326 may further include the phosphor 326b, and the phosphor 326b may cover the top of the light emitting element 325. The phosphor 326b may cover the light emitting element 325 so as to convert a color of light emitted from the light emitting element 325.

The phosphor 326b may have a predetermined thickness. The phosphor 326b may have a thickness t3 ranging from the bottom of the cavity 323, in which the light emitting element 325 is not positioned, to the surface of the phosphor 326b and a thickness t4 ranging from the surface of the light emitting element 325 to the surface of the phosphor 326b. In the phosphor 326b, the thickness t3 may be greater than the thickness t4.

For example, when the light emitting element 325 emits blue light and the phosphor 326b is yellow, the phosphor 326b may convert the blue light into white light so that the light source 220 emits the white light.

When the thickness t3 is greater than the thickness t4, the white light converted by the phosphor 326b may have the uniformity and may be widely diffused. In particular, a thickness of the phosphor 326b has to increase in an area where the light emitting element 325 is not positioned, so that light emitted from the side of the light emitting element 325 may be widely diffused.

Accordingly, in the embodiment of the invention, because the thickness t3 ranging from the bottom of the cavity 323, in which the light emitting element 325 is not positioned, to the surface of the phosphor 326b is greater than the thickness t4 ranging from the surface of the light emitting element 325 to the surface of the phosphor 326b, light emitted from the side of the light emitting element 325 may be widely diffused. Further, the white conversion efficiency may be improved.

As described above, in the embodiment of the invention, because the surface of the encapsulation material 326 of the light source 220 has the concave lens shape, the linearity of light emitted from the light source 220 may be improved so that the light may reach the adjacent light source 220. Further, because the an adhesive area between the encapsulation material 326 and the second layer 230 increases, the adhesive strength between the encapsulation material 326 and the second layer 230 may increase.

As described above, the encapsulation material 326 filled in the cavity 323 of the light source 220 may have the structure in which the phosphor 326b of the encapsulation material 326 is an underlying layer covering the light emitting element 325 and the liquid resin 326a is an upper layer covering the phosphor 326b being the underlying layer.

As shown in FIG. 47, the encapsulation material 326 may have the structure in which a phosphor layer F1 formed of only the phosphor 326b, a mixed layer F2 in which the liquid resin 326a and the phosphor 326b are mixed with each other, and a liquid resin layer F3 formed of only the liquid resin 326a are sequentially stacked in the order named.

In other words, in the encapsulation material 326, the phosphor layer F1 may be formed using the phosphor 326b covering the light emitting element 325 corresponding to the underlying layer, the mixed layer F2 may be formed by partially mixing the phosphor 326b with the liquid resin 326a, and liquid resin layer F3 may be formed using the liquid resin 326a corresponding to the upper layer The embodiment of the invention may use all of the shapes of the encapsulation material 326 shown in FIGS. 42, 45, 46, and 47 and may achieve white light because the phosphor 326b covers and surrounds the light emitting element 325.

Figure 48:
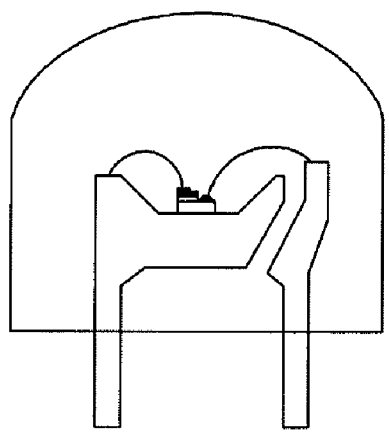
Figure 48:
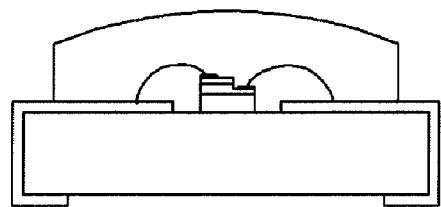
Figure 48:
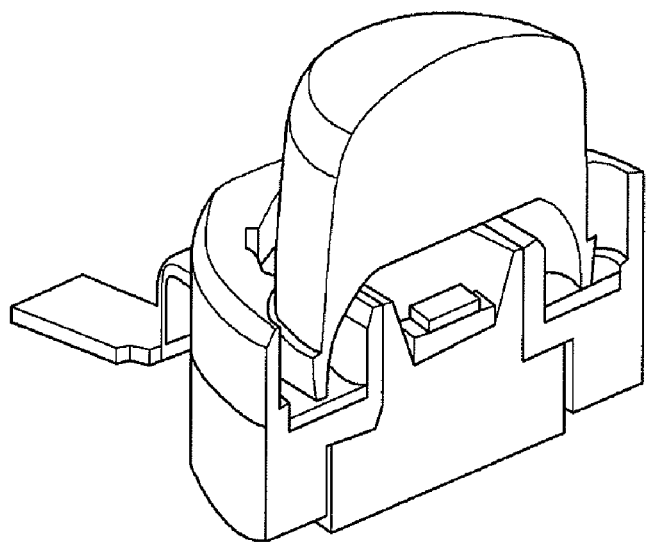

As shown in FIG. 48, the light source 220 may be classified into a lead type light source, a SMD type light source, and a flip-chip type light source depending on a packaging form of the LED chip. The lead type, SMD type, and flip-chip type light sources may be applied to the embodiment of the invention. Other types may be used.

FIGS. 49 to 58 illustrate an eighth exemplary configuration of the backlight unit according to the exemplary embodiment of the invention. Structures and components identical or equivalent to those described in the first to seventh exemplary configurations may be designated with the same reference numerals in the eighth exemplary configuration, and a further description may be briefly made or may be entirely omitted.

Figure 49:
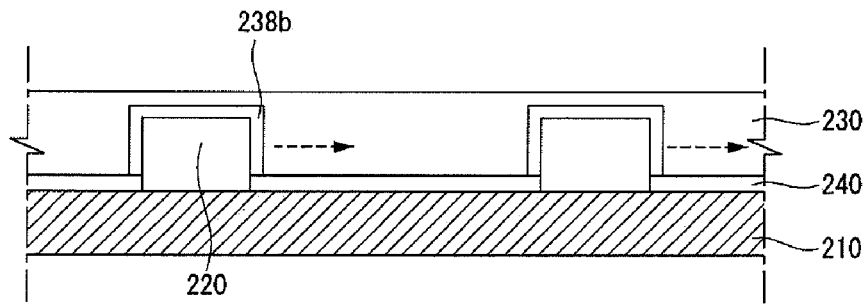
FIGS. 49 to 58 illustrate an eighth exemplary configuration of a backlight unit according to an exemplary embodiment of the invention.

As shown in FIG. 49, a second air layer 238b may be positioned between the second layer 230 and at least a portion of each light source 220 (or at least one light source 220). The second air layer 238b is a separated area between the second layer 230 and the light sources 220 and may be an area where light emitted from the light sources 220 is mixed and diffused in an interface between the second air layer 238b and the second layer 230 using a difference between refractive indexes of the second air layer 238b and the second layer 230. That is, the second air layer 238b can be referred to herein as air gaps.

Figure 50:
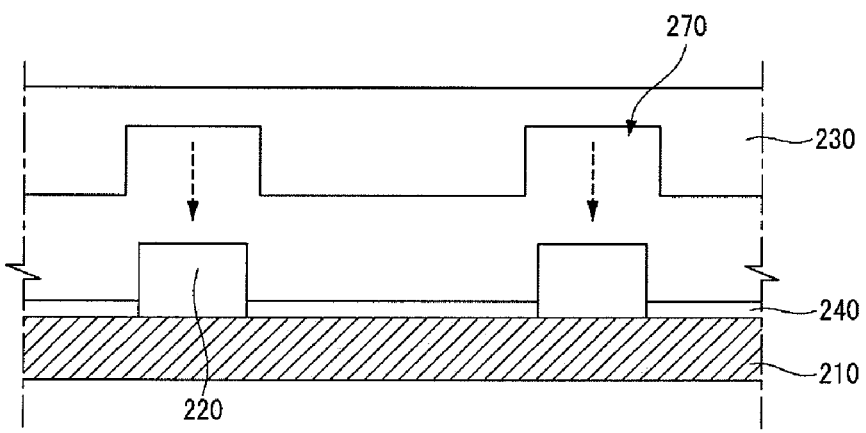

The second air layer 238b shown in FIG. 49 may be formed as follows. As shown in FIG. 50, the second air layer 238b may be formed by attaching the second layer 230 having a plurality of grooves 270 to the first layer 210 on which the light sources 220 are formed. For instance, a resin plate, on which the plurality of grooves 270 respectively corresponding to the light sources 220 are formed, is formed by coating a resin used to form the second layer 230 on the mold part and hardening the coated resin. Then, the second air layer 238b may be formed by attaching the second layer 230 formed of the resin plate to the first layer 210 on which the light sources 220 and the reflection layer 240 are positioned.

As shown in FIG. 49, at least a portion of the surfaces of each light source 220 is separated from the second layer 230, and the second air layer 238b is positioned between the second layer 230 and the light sources 220. The second air layer 238b may mix and diffuse light emitted from the light sources 220 in the interface between the second air layer 238b and the second layer 230 using the difference between the refractive indexes of the second air layer 238b and the second layer 230, thereby achieving white light of the light sources 220. For instance, the second air layer 238b further diffuses the light therethrough for a more uniform light emission.

Figure 51:
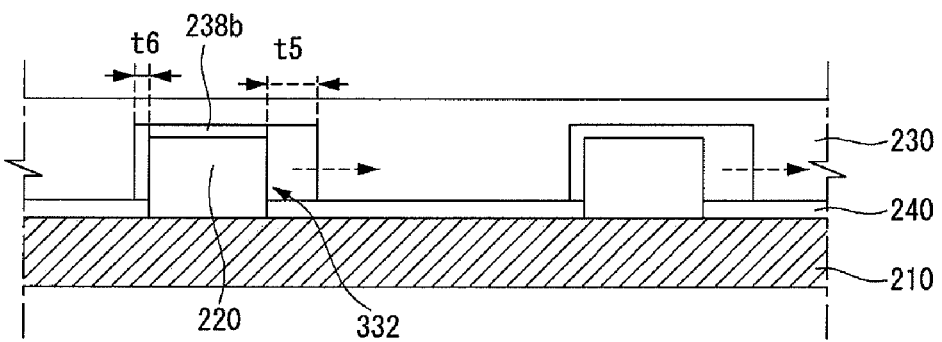

As shown in FIG. 51 for example, all the surfaces of each light source 220, which are exposed to the second layer 230, may be separated from the second layer 230 to provide air gaps (second air layer 238b) therebetween. As a variation, only certain surfaces of the light source 220 may be separated from the second layer 230 to provide air gaps therebetween. A thickness t5 of the second air layer 238b positioned between the light emitting surface 332 of the light source 220 and the second layer 230 may be greater than a thickness t6 of the second air layer 238b positioned between one surface of the light source 220 excluding the light emitting surface 332 from the light source 220 and the second layer 230. In other words, because the second air layer 238b between the light emitting surface 332 of the light source 220 and the second layer 230 mixes light emitted from the light sources 220 to achieve white light of the light sources 220, the thickness t6 of the second air layer 238b between one surface of the light source 220 excluding the light emitting surface 332 from the light source 220 and the second layer 230 is not important. Namely, it is not necessary that the second air layer 238b is thick.

Figure 52:
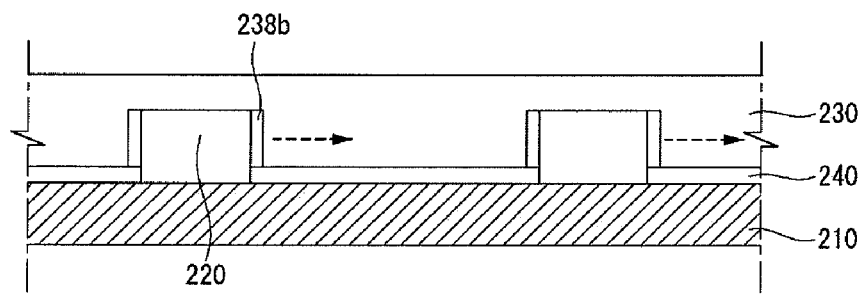

For example, as shown in FIG. 52, an upper surface of the light source 220 may contact the second layer 230, and other surfaces of the light source 220 including the light emitting surface are separated from the second layer 230 by air gaps. Hence, the second air layer 238b may be formed in a separated area between the light source 220 and the second layer 230.

Figure 53:
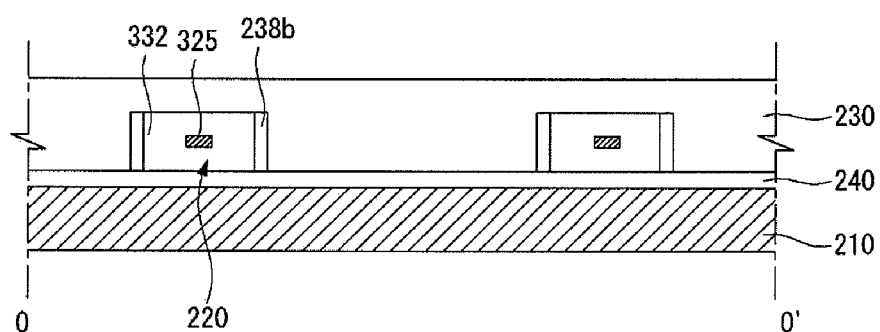

As shown in FIG. 53 which is a cross-sectional view taken along line O-O' of FIG. 40, the second air layers 238b separated from the second layer 230 may be respectively formed at left and right sides of the light emitting surface 332 of the light source 220.

Figure 54:
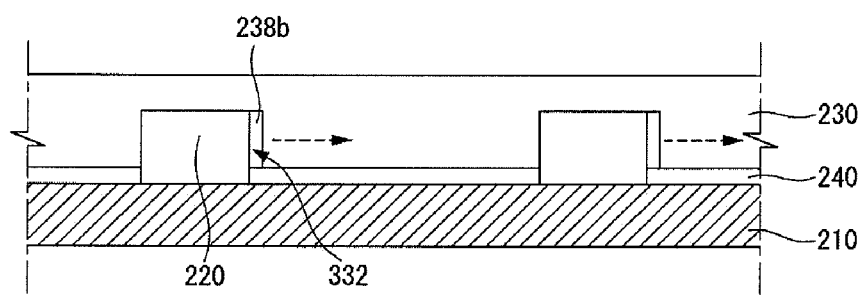

The embodiment of the invention is not limited to the configuration illustrated in FIG. 53. The effect of the embodiment of the invention may be achieved as long as at least one surface (for example, the light emitting surface 332) of the light source 220 is separated from the second layer 230 to have an air gap therebetween and the second air layer 238 exists between the light emitting surface 332 of the light source 220 and the second layer 230 as shown in FIG. 54.

Although the embodiment of the invention describes the case where the second layer 230 is a resin plate formed in a mold, the second layer 230 may be a film or a liquid resin.

Figure 55:
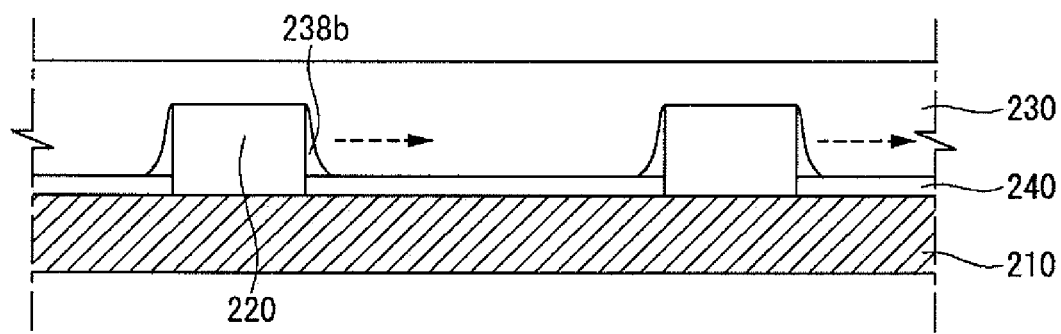

As shown in FIG. 55, the second air layer 238b may be positioned between the second layer 230 and at least a portion of each light source 220. The second air layer 238b is a separated area between the second layer 230 and the light sources 220 and may be an area where light emitted from the light sources 220 is mixed and diffused in an interface between the second air layer 238b and the second layer 230 using a difference between refractive indexes of the second air layer 238b and the second layer 230.

Figure 56:
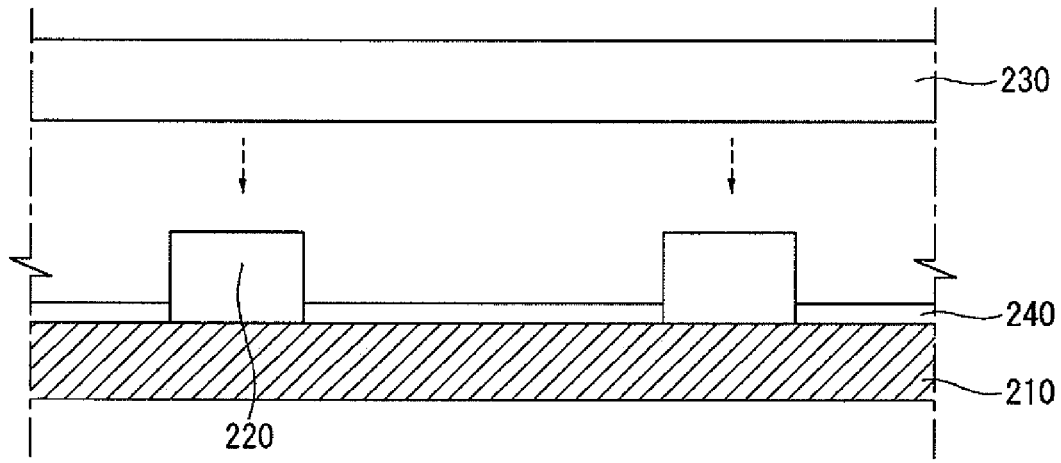

The second layer 230 and the second air layer 238b shown in FIG. 55 may be formed as follows. As shown in FIG. 56, the second layer 230 may be formed by coating the above-described resin on a support sheet, partially drying the coated resin to form the sheet type second layer 230, and attaching the sheet type second layer 230 on the first layer 210 on which the light sources 220 are formed. Alternatively, the second layer 230 may be formed by directly coating the above-described resin on the first layer 210 on which the light sources 220 are formed and then drying the coated resin.

When the second air layer 238b is formed through the above-described drying process, it may be preferable that a viscosity of the second layer 230 formed of a resin is properly adjusted. When the second layer 230 is formed on the first layer 210 and then is dried, the second air layer 238b may be formed between the light source 220 and the second layer 230 because the second layer 230 formed of the resin contracts. In particular, the second air layer 238b may not be formed on the upper part of the light source 220 that is relatively widely attached to the second layer 230, and the second air layer 238b may be formed on the step-shaped sides of the light source 220.

Figure 57:
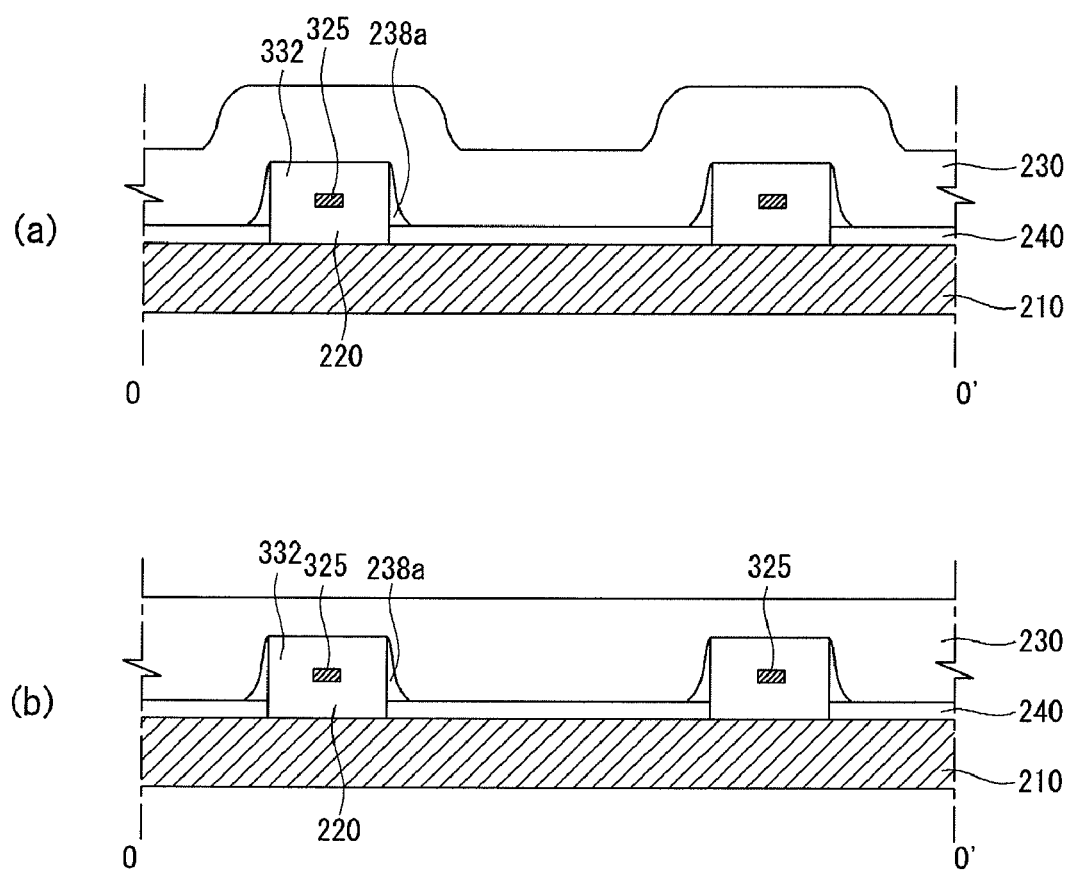

As shown in examples of FIG. 57 which is a cross-sectional view taken along the line O-O' of FIG. 40, when the second air layer 238b is manufactured in a sheet type and is positioned on the light sources 220, as shown in one example of FIG. 57(a), the second layer 230 may protrude from the upper part of the light source 220 because of a height difference of the step-shaped light source 220 to form a bending portion.

On the other hand, as shown in another example of FIG. 57(b), when the second layer 230 is formed on the light sources 220 by coating a resin, the surface of the second layer 230 on the light sources 220 may be flat.

Accordingly, as shown in FIG. 57, the light source 220 and the second layer 230 may be separated from each other at the left and right sides of the light emitting surface 332 of each light source 220, and the first air layer 238a may be formed between the light source 220 and the second layer 230.

Figure 58:
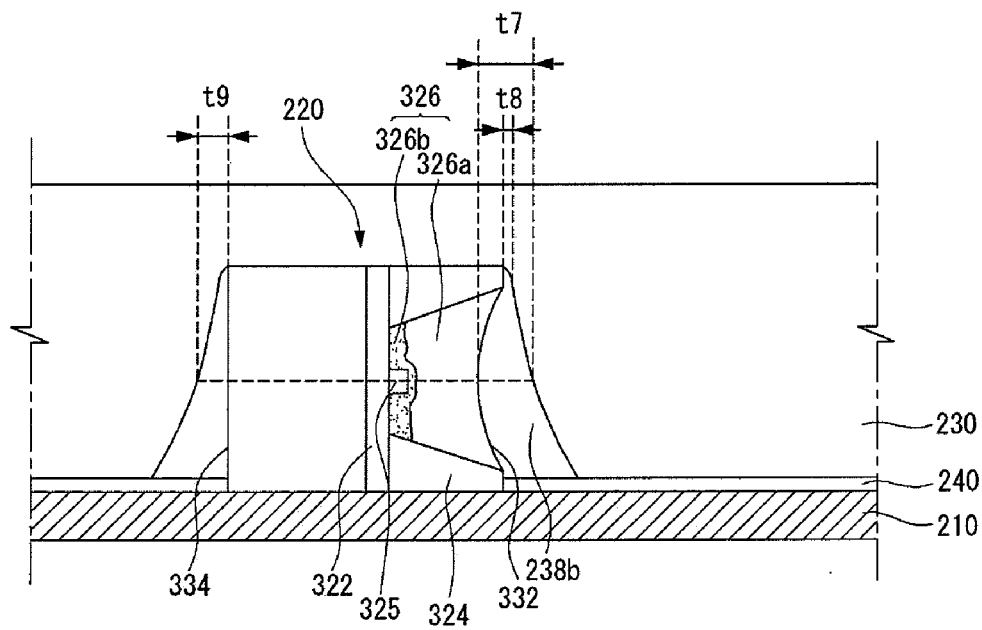

As shown in FIG. 58 illustrating in detail a contact between the light source 220 and the second layer 230, the upper surface of the light source 220 contacts the second layer 230, and the side surfaces of the light source 220 are separated from the second layer 230 according to an embodiment of the invention. Thus, the second air layer 238b may be formed between the side surfaces of the light source 220 and the second layer 230.

A separated distance t7 between a middle portion of the light emitting surface 332 of the light source 220 and the second layer 230 may be greater than a separated distance t8 between the mold part 324 of the light source 220 and the second layer 230. As the light source 220 goes from the upper part toward the lower part of the light source 220, a separated distance between the light source 220 and the second layer 230 increases. For instance, a relatively large contact area is formed between the upper surface of the light source 220 and the second layer 230. However, because the side surfaces of the light source 220 are inclined at an angle near to 90°, an adhesive strength between the side surfaces of the light source 220 and the second layer 230 decreases.

Further, the separated distance t7 between the middle portion of the light emitting surface 332 of the light source 220 and the second layer 230 may be greater than a separated distance t9 between a side surface 334 except the light emitting surface 332 of the light source 220 and the second layer 230. The light emitting surface 332 of the light source 220 may be an exposure surface of the encapsulation material 326. Because the encapsulation material 326 is depressed toward the light emitting element 324 as shown in FIG. 58, the separated distance t7 between the light emitting surface 332 of the light source 220 and the second layer 230 increases.

As described above, the second air layer 238b may mix and diffuse light emitted from the light sources 220 in the interface between the second air layer 238b and the second layer 230 using the difference between the refractive indexes of the second air layer 238b and the second layer 230, thereby achieving white light of the light sources 220.

In the embodiment of the invention, the light source 220 may be variously designed depending on its structure.

Figure 59:
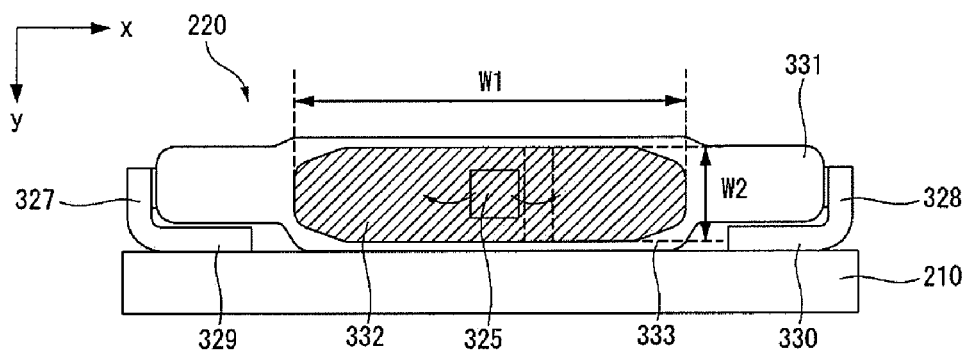
FIGS. 59 to 66 illustrate a ninth exemplary configuration of a backlight unit according to an exemplary embodiment of the invention.
Figure 60:
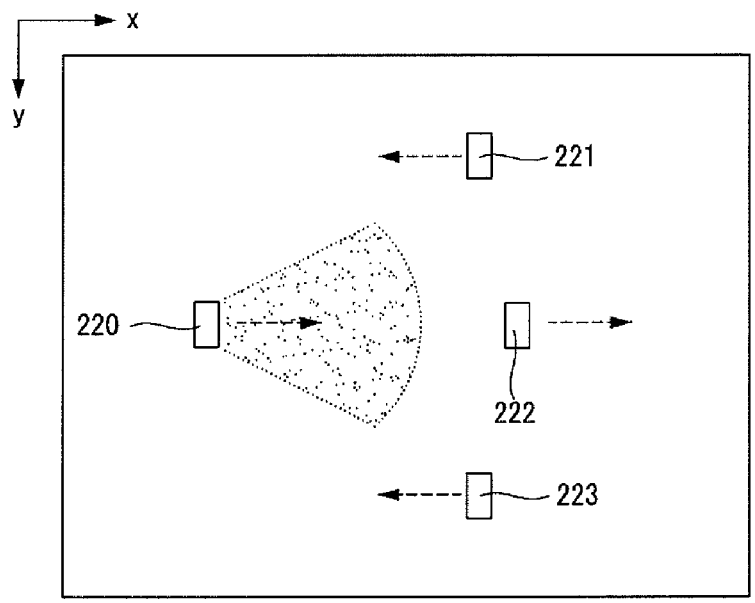
Figure 61:
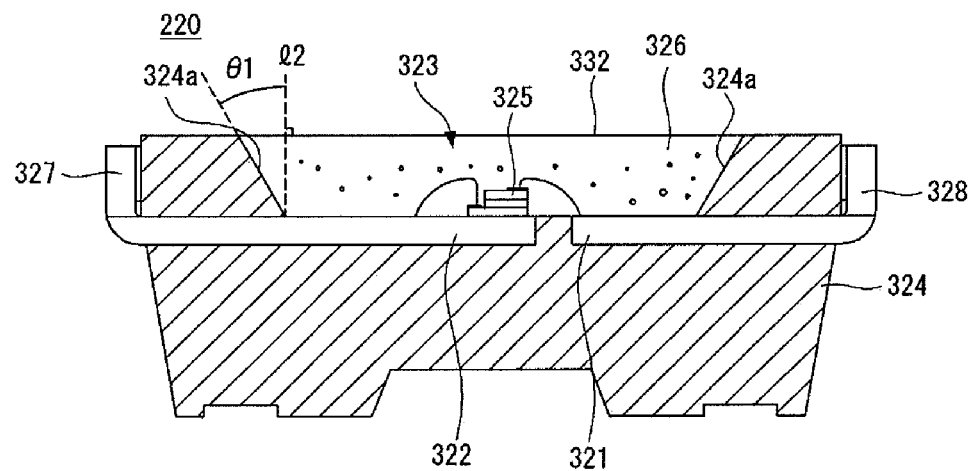

FIGS. 59 to 66 illustrate a ninth exemplary configuration of the backlight unit according to the exemplary embodiment of the invention. More specifically, FIG. 59 is a front view of the light source, FIG. 60 illustrates a front/top view of the backlight unit, and FIG. 61 illustrates an internal configuration of the light source. In these and other figures, in reality, some components may not be visible from the identified views, but are illustrated anyway to demonstrate their relationships with other components.

As shown in FIG. 59, the light emitting surface 332 of the light source 220 may have the shape in which its transverse length W1 is greater than its longitudinal length W2.

In the ninth exemplary configuration of the backlight unit, the light source 220 may be a side view type light source in which the light emitting surface 332 is positioned perpendicular to the first layer 210. The light emitting surface 332 of the light source 220 is a surface, from which light is emitted from the light emitting element 325 to the outside of the light source 220, and may be an exposure surface of the encapsulation material 326 filled in the cavity 323.

The transverse length W1 of the light emitting surface 332 may indicate a length in a transverse direction of the light emitting surface 332 parallel to the first layer 210 on which the light source 220 is positioned. The longitudinal length W2 of the light emitting surface 332 may indicate a length in a longitudinal direction of the light emitting surface 332 perpendicular to the first layer 210.

In other words, as shown in FIG. 59, a length in an x-axis direction of the light emitting surface 332 may be the transverse length W1, and a length in a y-axis direction of the light emitting surface 332 may be the longitudinal length W2.

In the backlight unit according to the ninth exemplary configuration, the plurality of light sources 220 are positioned on the first layer 210 and may achieve a surface light source through light emitted from the light sources 220.

The light source 220 may be a side view type light source in which light is emitted from the side of the light source 220, so as to achieve the surface light source. A hot spot phenomenon, in which a bright luminance is achieved in a formation area of the light source 220 and a dark luminance is achieved in a non-formation area of the light source 220, is not generated in the side view type light source 220. The backlight unit according to the ninth exemplary configuration includes the plurality of side view type light sources 220, thereby keeping luminances of the adjacent light sources 220 constant.

More specifically, as shown in FIG. 60, the backlight unit may include a first light source 220 emitting light in the x-axis direction and a second light source 221 that emits light in an opposite (or different) direction of the light emitting direction (i.e., the x-axis direction) of the first light source 220. The second light source 221 is diagonally positioned across the first light source 220 in the light emitting direction of the first light source 220. Further, the backlight unit may further include a third light source 222 emitting light in the same direction as the first light source 220 and a fourth light source 223 that emits light in the opposite direction of the light emitting direction of the first light source 220. The third light source 222 is positioned on the same line as the first light source 220 in the light emitting direction of the first light source 220. The fourth light source 223 is diagonally positioned across the first light source 220 in the light emitting direction of the first light source 220 and is positioned adjacent to the second light source 221 with the third light source 222 interposed therebetween. The first through fourth light sources 220, 221, 222 and 223 are merely designated examples of the light sources 220 discussed in the present specification.

Light emitted from the first light source 220 has to widely reach an area surrounded by the second, third, and fourth light sources 221, 222, and 223, so that the backlight unit according to the embodiment of the invention achieves the surface light source. For this, in each of the plurality of light sources 220, the transverse length W1 of the light emitting surface 332 may be greater than the longitudinal length W2 of the light emitting surface 332. Hence, light emitted from the light sources 220 (i.e., light emitted from the light emitting element 325 mounted inside each light source 220) is widely diffused in the y-axis direction depending on the shape of the light emitting surface 332.

As shown in FIG. 60, because the light sources 220 each having the light emitting surface 332, in which the transverse length W1 is greater than the longitudinal length W2, emit widely light, the light emitted from the light sources 220 may reach up to an area adjacent to the second and fourth light sources 221 and 223. Accordingly, the light sources 220 may achieve the surface light source having the uniform luminance on a front surface of the first layer 210.

FIG. 61 is a cross-sectional view of an example of the light source 220, and FIGS. 62 to 66 illustrate examples of an arrangement of the light sources depending on the structure of the light sources according to an embodiment of the invention. An inner surface of the mold part 324 of the light source 220 may be inclined at a predetermined angle.

As shown in FIG. 61, an inner surface 324a of the mold part 324 constituting a body of the light source 220 may form an angle θ1 of 2° to 70° with a line l2 perpendicular to the light emitting surface 332 of the light source 220. Preferably the angle θ1 ranges from 20° to 50°.

The cavity 323 is formed in the mold part 324 of the light source 220 so that the light emitting element 325 can be mounted in the mold part 324 of the light source 220. The inner surface 324a of the mold part 324 may define the cavity 323 and may define the light emitting surface 332.

More specifically, when the inner surface 324a of the mold part 324 and the line l2 perpendicular to the light emitting surface 332 form the angle θ1, an area of the light emitting surface 332 increases by the angle θ1 of the inner surface 324a of the mold part 324. Hence, because light emitted from the light emitting element 325 may be widely diffused because of an increase in the area of the light emitting surface 332, light may reach an area adjacent to the second and fourth light sources 221 and 223 as illustrated in FIG. 59.

Accordingly, the inner surface 324a of the mold part 324 and the line l2 perpendicular to the light emitting surface 332 may form the angle θ1 of 2° to 70°. When the inner surface 324a of the mold part 324 and the line l2 form the angle θ1 equal to or greater than 2°, an area of the light emitting surface 332 may increase. Hence, the light source 220 may widely emit light. When the inner surface 324a of the mold part 324 and the line l2 form the angle θ1 equal to or less than 70°, an amount of light that is emitted from the light emitting surface 332 and then is reflected by the inner surface 324a of the mold part 324 inside the cavity 323 may decrease. Hence, light may be prevented from being reflected inside the cavity 323.

Preferably, the inner surface 324a of the mold part 324 and the line l2 perpendicular to the light emitting surface 332 may form the angle θ1 of 20° to 50°. When the inner surface 324a of the mold part 324 and the line l2 form the angle θ1 equal to or greater than 20°, an area of the light emitting surface 332 may increase. Hence, the light source 220 may widely emit light. When the inner surface 324a of the mold part 324 and the line l2 form the angle θ1 equal to or less than 50°, light emitted from the light emitting element 325 may be wide diffused and may reach a long distance.

The plurality of light sources 220 each having the above-described structure may be regularly disposed on the first layer 210.

Figure 62:
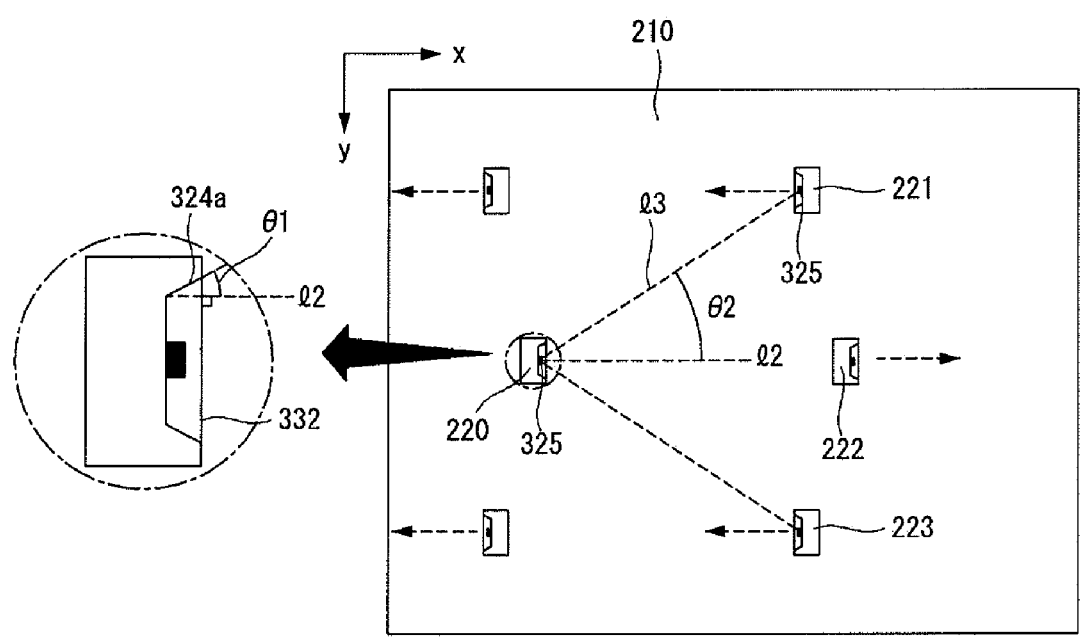

As shown in an example of FIG. 62, the backlight unit may include a first light source 220 emitting light in the x-axis direction and a second light source 221 that emits light in the opposite direction of a light emitting direction (i.e., the x-axis direction) of the first light source 220. The second light source 221 is diagonally positioned across the first light source 220 in the light emitting direction of the first light source 220. Further, the backlight unit may further include a third light source 222 emitting light in the same direction as the first light source 220 and a fourth light source 223 that emits light in the opposite direction of the light emitting direction of the first light source 220. The third light source 222 is positioned on the same line as the first light source 220 in the light emitting direction of the first light source 220. The fourth light source 223 is diagonally positioned across the first light source 220 in the light emitting direction of the first light source 220 and is positioned adjacent to the second light source 221 with the third light source 222 interposed therebetween. The second, third and fourth light sources 221, 222 and 223 may be staggeredly disposed as shown.

As described with reference to FIG. 61, the inner surface 324a of the mold part 324 and the line l2 perpendicular to the light emitting surface 332 of the first light source 220 form the angle θ1 of 2° to 70°, preferably 20° to 50°.

The orientation angle of light emitted from the light emitting element 325 of the light source may be generally 60° as described above. However, when the inner surface 324a of the mold part 324 and the line l2 perpendicular to the light emitting surface 332 form a predetermined angle, the orientation angle of light emitted from the light emitting element 325 is greater than 60°. Accordingly, in the embodiment of the invention, the arrangement of the light sources 220 may vary depending on the angle θ1 formed by the inner surface 324a of the mold part 324 and the line l2 perpendicular to the light emitting surface 332. As shown in FIG. 62, the arrangement of the first, second, and fourth light sources 220, 221, and 223 may vary.

In other words, a connection line l3 between the light emitting element 325 of the first light source 220 and the light emitting element 325 of the second light source 221 and the line l2 perpendicular to the light emitting surface 332 of the first light source 220 may form an angle θ2 of 10° to 80°, preferably, 20° to 50°. For example, when the inner surface 324a of the mold part 324 of the first light source 220 and the line l2 perpendicular to the light emitting surface 332 of the first light source 220 form the angle θ1 of 2° to 70°, preferably 20° to 50°, the connection line l3 between the light emitting element 325 of the first light source 220 and the light emitting element 325 of the second light source 221 and the line l2 perpendicular to the light emitting surface 332 of the first light source 220 may form the angle θ2 of 20° to 50°. As such, the (positive) difference between the two angles, θ1 and θ2, ranges from 0° to 78°, preferably 0° to 30°. Here, although the specific values are given, these angles and the difference in the angles may be about or near such values. Further, in these and other examples, the lines such as l3 are formed by connecting a line between a middle portion of the corresponding entity (e.g., light emitting element 325 of the first light source 220) to a middle portion of another corresponding entity (e.g., light emitting element 325 of the second light source 221).

Figure 63:
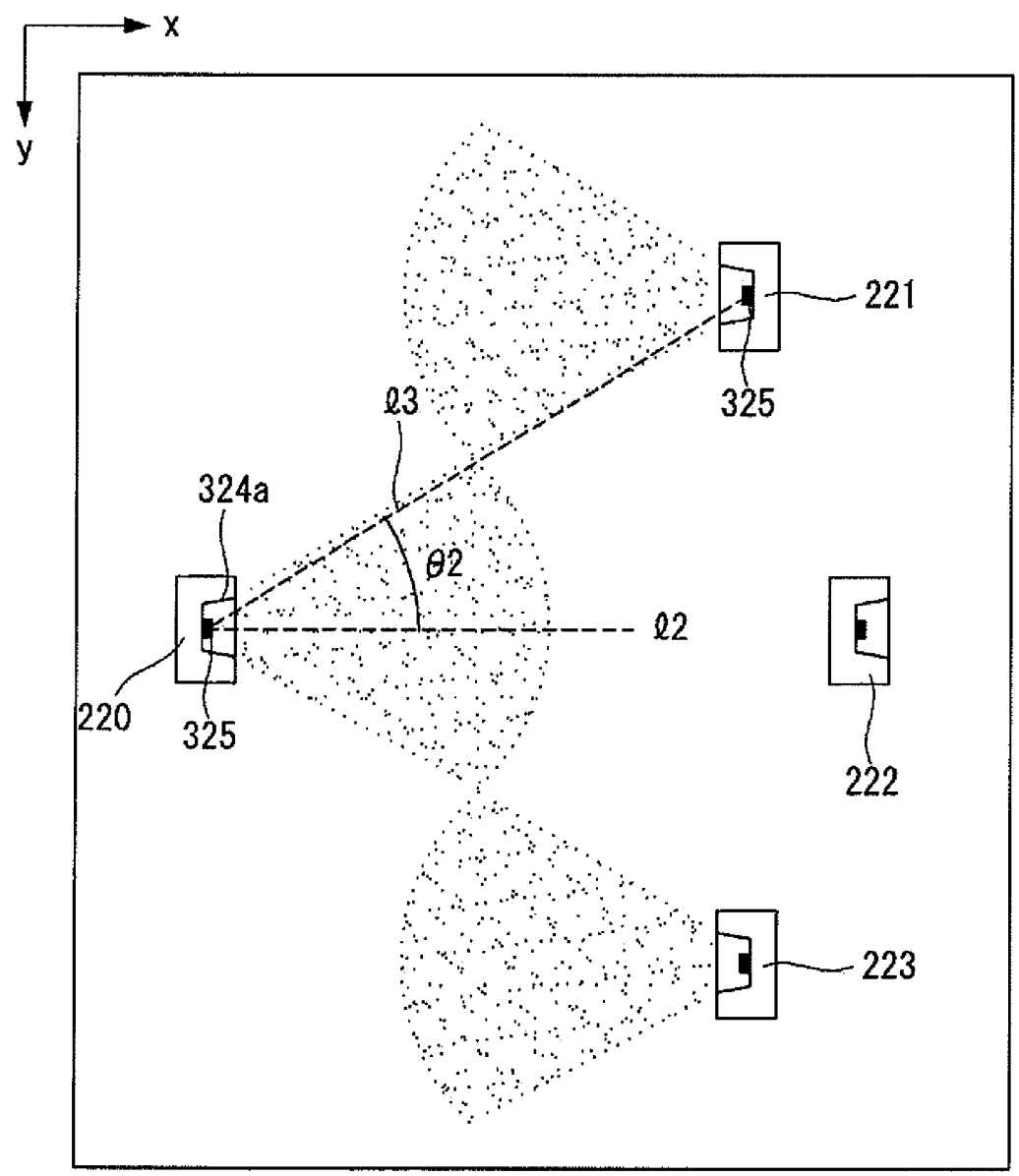

As shown in FIG. 63, because the inner surface 324a of the mold part 324 of the first light source 220 is inclined at the angle θ1, an orientation angle of light emitted from the light emitting element 325 of the first light source 220 is preferably greater than 60°. Hence, the arrangement of the second light source 221 emitting light in the opposite direction of the light emitting direction of the first light source 220 may vary depending on the orientation angle of the first light source 220.

It is preferable that there is no area where light emitted from the first light source 220 and light emitted from the second light source 221 overlap each other or do not reach in an arrangement relationship between the first and second light sources 220 and 221.

Accordingly, in the embodiment of the invention, when the inner surface 324a of the mold part 324 of the first light source 220 and the line l2 perpendicular to the light emitting surface 332 of the first light source 220 form the angle θ1 of 2° to 70°, preferably 20° to 50°, the first and second light sources 220 and 221 may be arranged so that the connection line l3 between the light emitting element 325 of the first light source 220 and the light emitting element 325 of the second light source 221 and the line l2 perpendicular to the light emitting surface 332 of the first light source 220 form the angle θ2 of 10° to 80°, preferably 20° to 50°.

Referring again to FIG. 62, when the inner surface 324a of the mold part 324 of the first light source 220 and the line l2 perpendicular to the light emitting surface 332 of the first light source 220 form the angle θ1 of 2° to 70°, the connection line l3 between the light emitting element 325 of the first light source 220 and the light emitting element 325 of the second light source 221 and the line l2 perpendicular to the light emitting surface 332 of the first light source 220 may form the angle θ2 of 10° to 80°. As such, the (positive) difference between the two angles, θ1 and θ2, ranges from 0° to 78°, preferably 0° to 30°.

Figure 64:
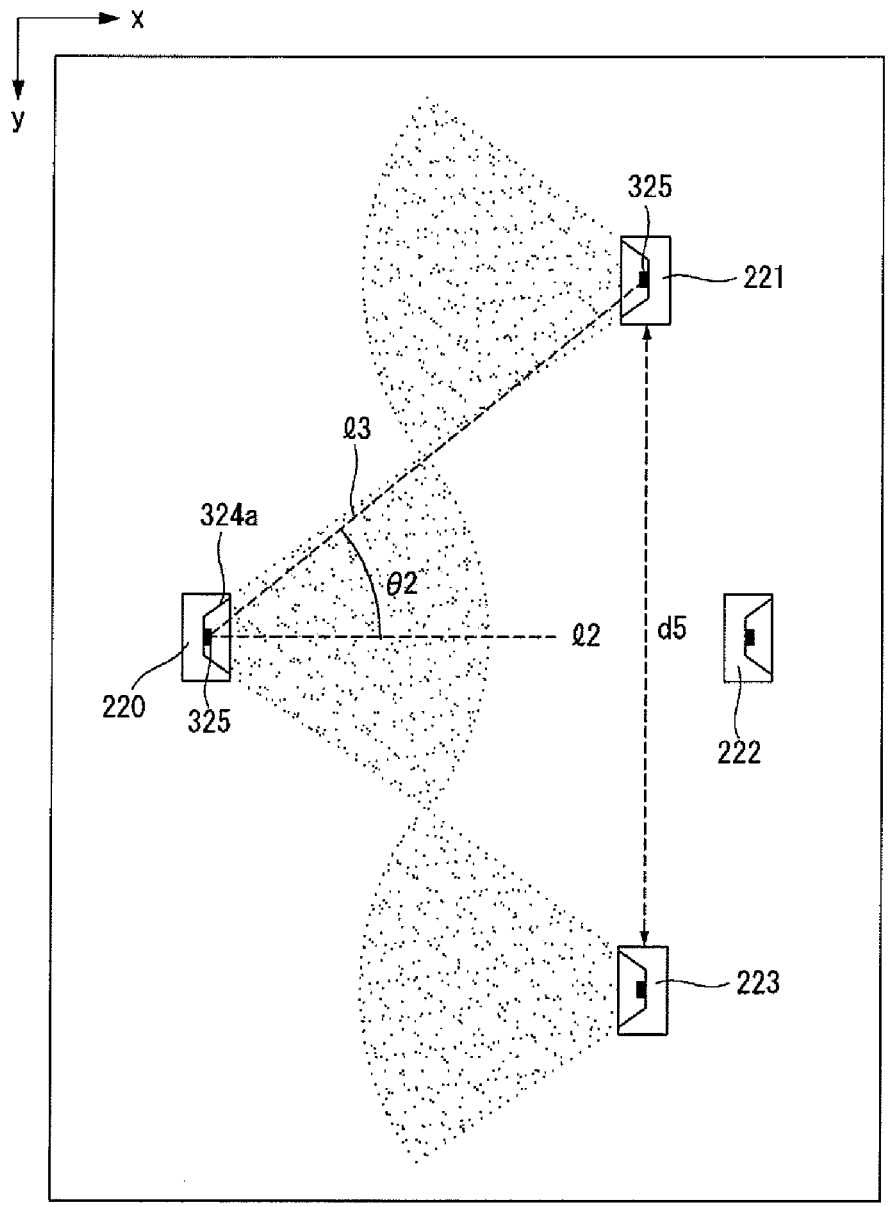

As shown in FIG. 64, in the embodiment of the invention, when the inner surface 324a of the mold part 324 of the first light source 220 and the line l2 perpendicular to the light emitting surface 332 of the first light source 220 form the angle θ1 of 2° to 70°, the first and second light sources 220 and 221 may be arranged so that the connection line l3 between the light emitting element 325 of the first light source 220 and the light emitting element 325 of the second light source 221 and the line l2 perpendicular to the light emitting surface 332 of the first light source 220 form the angle θ2 of 10° to 80°.

An area where light emitted from the light sources 220, 221, and 223 overlaps one another or does not reach may be prevented from being formed by disposing the light sources 220, 221, and 223 based on the inclined angle of the inner surface 324a of the mold part 324 of the light source. Hence, the backlight unit may provide light with the uniform luminance.

In particular, as shown in FIG. 64, when the inclined angle of the inner surface 324a of the mold part 324 of the first light source 220 increases, the formation angle of the connection line l3 between the light emitting element 325 of the first light source 220 and the light emitting element 325 of the second light source 221 increases. Hence, an angle formed by the first and second light sources 220 and 221 may increase, and a distance d5 between the second light source 221 and the fourth light sources 2223 may lengthen.

In other words, the number of light sources formed in the same area may decrease because of an increase in a distance between the light sources 220, 221, 222, and 223. Accordingly, the manufacturing cost of the backlight unit may be reduced and the productivity of the backlight unit increases.

The first light source 220 may emit light with a predetermined orientation angle in the x-axis direction, and the second and fourth light sources 221 and 223 may emit light with a predetermined orientation angle in the opposite direction of the x-axis direction.

Figure 65:
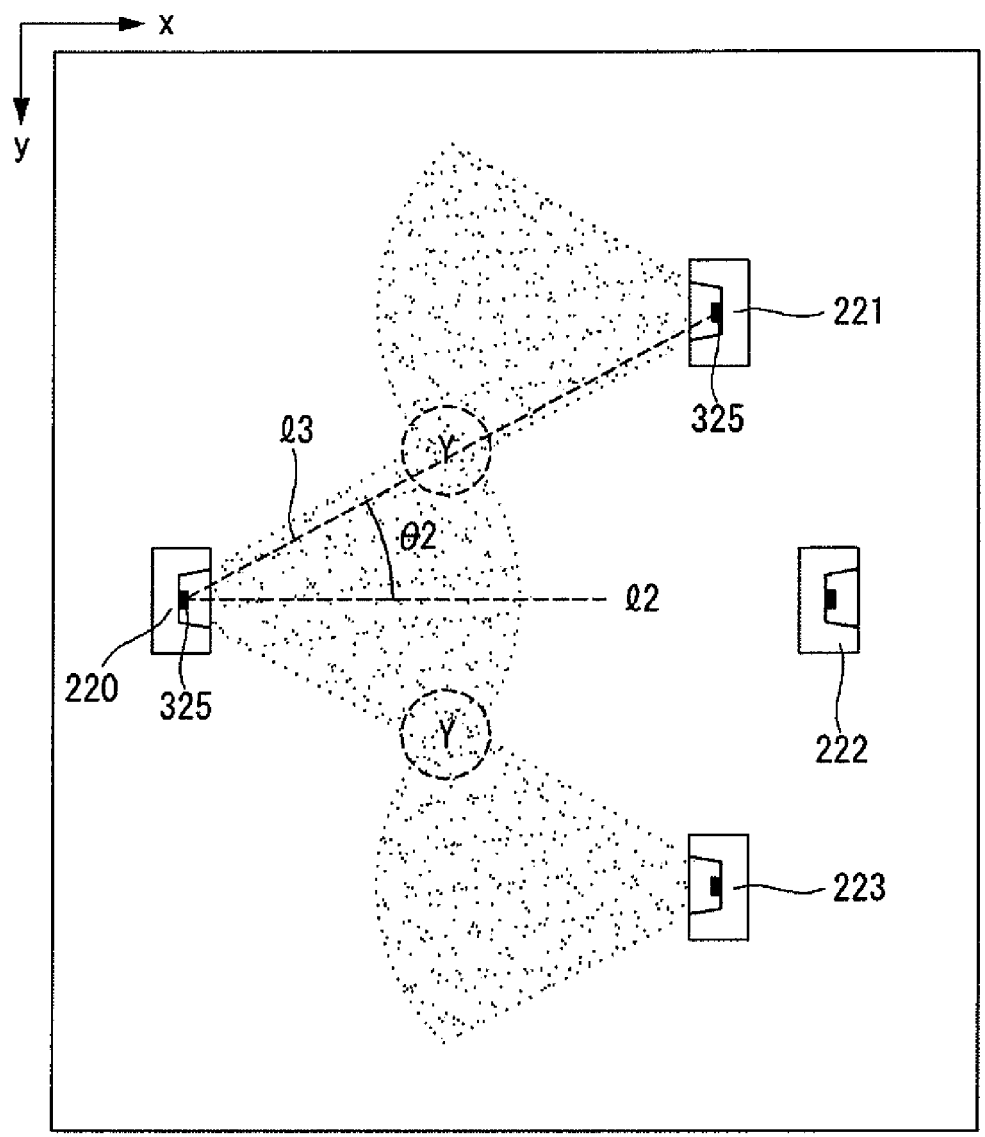

As shown in an example of FIG. 65, when the inner surface 324a of the mold part 324 of the first light source 220 and the line l2 perpendicular to the light emitting surface 332 of the first light source 220 form the angle θ1 of 2°, an area Y where light emitted from the first light source 220 and light emitted from the second light source 221 and/or the fourth light source 223 overlap each other may be generated if the connection line l3 between the light emitting element 325 of the first light source 220 and the light emitting element 325 of the second light source 221 and the line l2 perpendicular to the light emitting surface 332 of the first light source 220 form the angle θ2 less than 8°. Hence, the luminance of light in the area Y may be relatively greater than the luminance of light in other areas, and a relatively bright portion may appear in the area Y.

Figure 66:
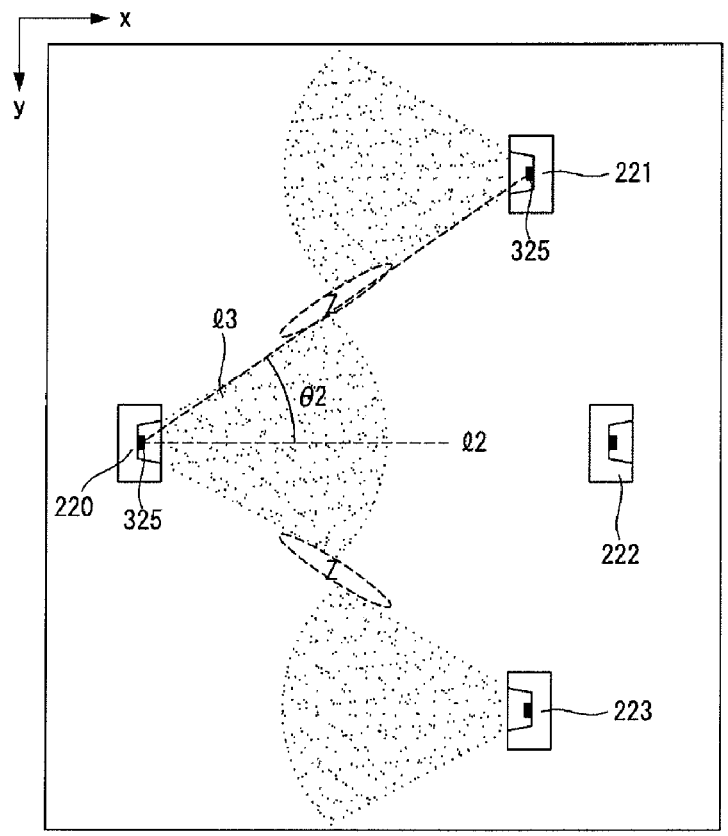

As shown in another example of FIG. 66, when the inner surface 324a of the mold part 324 of the first light source 220 and the line l2 perpendicular to the light emitting surface 332 of the first light source 220 form the angle θ1 of 2°, an area Z where light emitted from the first light source 220 and light emitted from the second light source 221 and/or the fourth light source 223 do not reach may be generated if the connection line l3 between the light emitting element 325 of the first light source 220 and the light emitting element 325 of the second light source 221 and the line l2 perpendicular to the light emitting surface 332 of the first light source 220 form the angle θ2 greater than 85°. Hence, the luminance of light in the area Z may be relatively less than the luminance of light in other areas, and a relatively less portion may appear in the area Z.

As described above, in the embodiment of the invention, the number of light sources used in the backlight unit may decrease by adjusting the arrangement of the light sources depending on the structure of the light sources. Hence, the manufacturing cost of the backlight unit may be reduced and the productivity of the backlight unit may increase.

Figure 67:
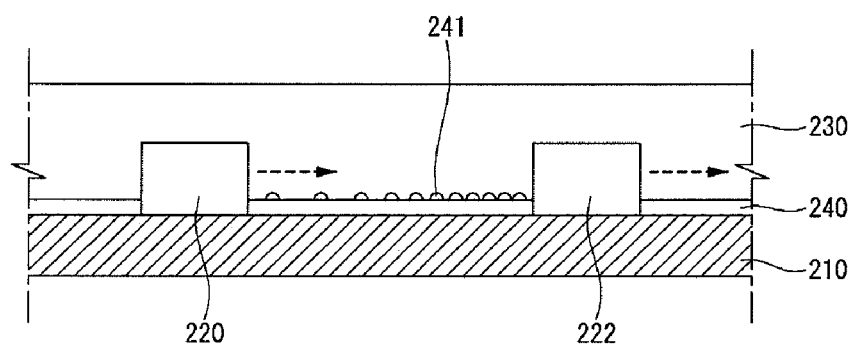
FIGS. 67 and 68 illustrate a tenth exemplary configuration of a backlight unit according to an exemplary embodiment of the invention.
Figure 68:
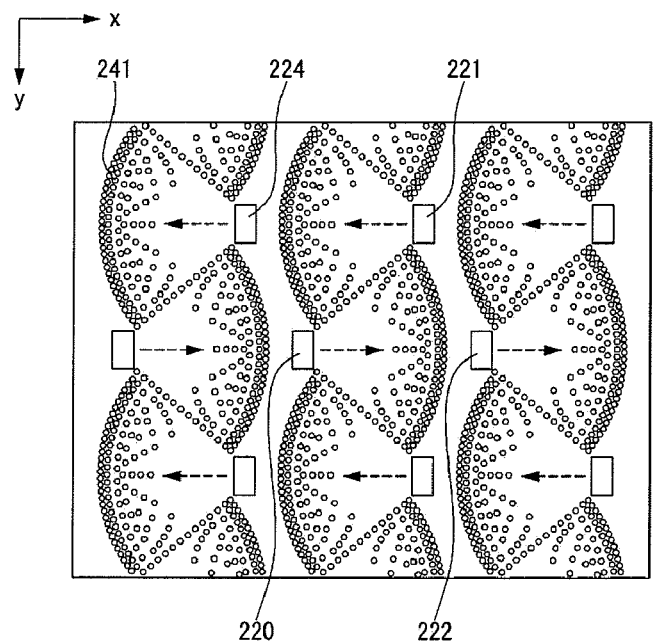

FIGS. 67 and 68 illustrate a tenth exemplary configuration of the backlight unit according to the exemplary embodiment of the invention. Structures and components identical or equivalent to those described in the first to ninth exemplary configurations may be designated with the same reference numerals in the tenth exemplary configuration, and a further description may be briefly made or may be entirely omitted.

As shown in FIG. 67, the backlight unit according to the embodiment of the invention may further include a plurality of diffusion patterns 241 that allow light emitted from the light source 220 on the reflection layer 240 to easily travel to a light source 222 adjacent to the light source 220. The plurality of diffusion patterns 241 may diffuse or refract light emitted from the light source 220.

More specifically, as shown in FIG. 68, the backlight unit 200 according to the embodiment of the invention may further include at least two light sources, each of which emits light in a different direction. For example, the backlight unit 200 may include a first light source 220 and a third light source 222 that emit light in a direction parallel to the x-axis direction (i.e., in a lateral direction). The first light source 220 and the third light source 222 may be positioned adjacent to each other in the x-axis direction. The backlight unit 200 may further include a second light source 221 and a fifth light source 224 that are positioned perpendicular to the x-axis direction and emit light in the opposite direction of a light emitting direction of the first and third light sources 220 and 222. In other words, lines on which the first and third light sources 220 and 222 are arranged and lines on which the second and fifth light sources 222 and 224 are arranged may be arranged to cross one another.

Accordingly, because the light emitting direction of the first and third light sources 220 and 222 is opposite to the light emitting direction of the second and fifth light sources 222 and 224 in the embodiment of the invention, an increase or a reduction in the luminance of light in a predetermined area of the backlight unit 200 may be prevented. In this case, as light emitted from the first light source 220 travels to the third light source 222, a luminance of the light emitted from the first light source 220 may be reduced. Hence, a luminance of light, which is emitted from the first light source 220, travels to an area distant from the first light source 220, and is emitted from the area in a direction of the display panel, may be reduced.

Accordingly, the tenth exemplary configuration of the backlight unit, the plurality of diffusion patterns 241 may be disposed between the first light source 220 and the third light source 222 to diffuse or refract light emitted from the first light source 220. Hence, the plurality of diffusion patterns 241 may allow the backlight unit 200 to provide light with the uniform luminance.

The diffusion patterns 241 may contain at least one of metal and metal oxide that are a reflection material. For example, the diffusion patterns 241 may contain metal or metal oxide having a high reflectance, such as aluminum (Al), silver (Ag), gold (Au), and titanium dioxide ($TiO_2$). In this case, the diffusion patterns 241 may be formed by depositing or coating the metal or the metal oxide on the first layer 210 or by printing a metal ink on the first layer 210. The deposition method may use a heat deposition method, an evaporation method, or a vacuum deposition method such as a sputtering method. The coating method or the printing method may use a gravure coating method or a silk screen method.

Further, the diffusion patterns 241 may have a color having a high brightness, for example, a color close to white so as to improve a reflection or refraction effect of the diffusion patterns 241.

The diffusion patterns 241 may include a plurality of dots formed of the above material. For example, the diffusion patterns 241 may include a plurality of dots having a circle plane shape, an oval plane shape, or a polygon plane shape.

A density of the diffusion patterns 241 may increase as the diffusion patterns 241 extend from the first light source 220 towards the third light source 222 as shown in FIGS. 67 and 68. Hence, a reduction in the luminance of light emitted upward from an area distant from the first light source 220 (i.e., an area around a back surface of the third light source 222) may be prevented. As a result, the luminance of light provided by the backlight unit 200 may be uniformized.

For example, a distance between the two adjacent diffusion patterns 241 each including the dots may increase as the diffusion patterns 241 extend from the light emitting surface of the first light source 220 to the third light source 222. Hence, while light emitted from the first light source 220 travels to the third light source 222, the light is diffused or refracted. As a result, the luminance of the light may be uniformized.

In particular, the diffusion patterns 241 may hardly exist in an area adjacent to the first light source 220. Hence, the light emitted from the first light source 220 is totally reflected by the reflection layer 240 in a non-formation area of the diffusion patterns 241 to travel and is diffused or refracted in a formation area of the diffusion patterns 241. As a result, the luminance of light in the entire area of the backlight unit including an area adjacent to the third light source 222 may be uniformized.

The plurality of diffusion patterns 241 may be disposed between the second light source 221 and the fifth light source 224 that emit light in the opposite direction of the light emitting direction of the first and third light sources 220 and 222.

The density of the diffusion patterns 241 may increase as the diffusion patterns 241 extend from the light emitting surface of the second light source 221 to the fifth light source 224 in the same manner as the first and third light sources 220 and 222, so as to allow the light to propagate more evenly or uniformly through the area between the light sources. Further, a distance between the two adjacent diffusion patterns 241 among the plurality of diffusion patterns 241 between the second light source 221 and the fifth light source 224 may decrease as the diffusion patterns 241 extend from the light emitting surface of the second light source 221 to the fifth light source 224.

The second light source 221 is diagonally positioned across the first light source 220 in the light emitting direction of the first light source 220, and the plurality of diffusion patterns 241 may be disposed on a diagonal line between the first light source 220 and the second light source 221 in a line. Because the first and second light sources 220 and 221 emit light in the opposite directions, the luminance of light may increase in an overlapping area between light emitted from the first light source 220 and light emitted from the second light source 221. However, the plurality of diffusion patterns 241 disposed on the diagonal line between the first light source 220 and the second light source 221 may prevent an increase in the luminance of light in the overlapping area of light.

Accordingly, as shown in FIG. 68, a plane shape of the diffusion patterns 241 between the first and third light sources 220 and 222 may be symmetrical to a plane shape of the diffusion patterns 241 between the second and fifth light sources 221 and 224. For example, the plane shape of the diffusion patterns 241 between the first and third light sources 220 and 222 or between the second and fifth light sources 221 and 224 may be a fan shape.

Because the fan-shaped diffusion patterns 241 are disposed based on the orientation angle of light emitted from the light source, the fan-shaped diffusion patterns 241 efficiently transfer and diffuse the light emitted from the light source. Hence, the entire luminance of light provided by the backlight unit may be uniformized.

FIGS. 69 to 79 illustrate various examples of an eleventh exemplary configuration of the backlight unit according to the exemplary embodiment of the invention. In these figures, various examples of the light sources 220 which may emit light in the same or different directions as discussed above can be used.

As described above with reference to FIGS. 2 to 68, the backlight unit according to the exemplary embodiment of the invention includes the first layer 210, the plurality of light sources 220 on the first layer 210, the second layer 230 covering the plurality of light sources 220, and the reflection layer 240 between the first layer 210 and the second layer 230.

Figure 69:
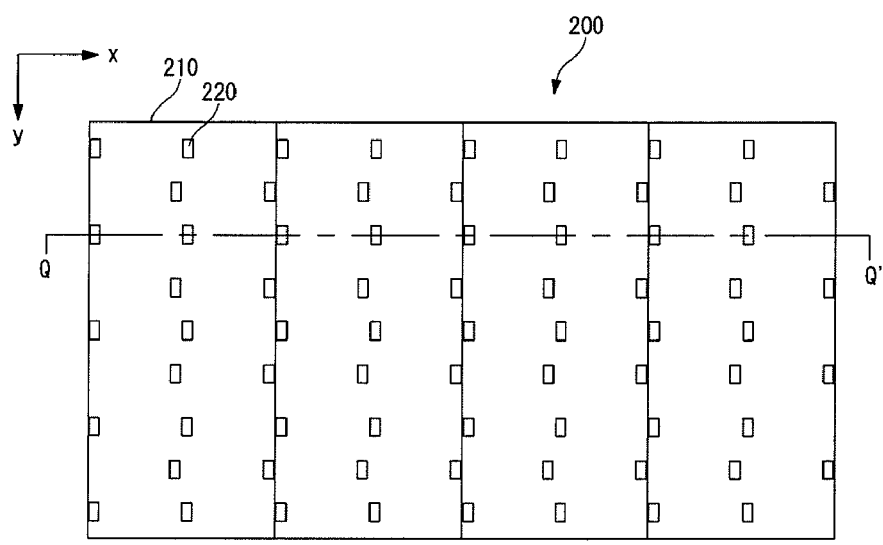
FIGS. 69 to 79 illustrate an eleventh exemplary configuration of a backlight unit according to an exemplary embodiment of the invention.
Figure 70:
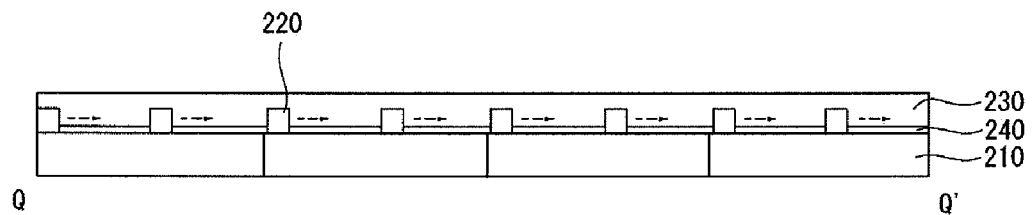

As shown in FIGS. 69 to 70, the backlight unit 200 according to the eleventh exemplary configuration may include the plurality of first layers 210, the plurality of light sources 220 positioned on each of the plurality of first layers 210, at least one reflection layer 240 positioned on the plurality of first layers 210 excluding the plurality of light sources 220 from the plurality of first layers 210, and the second layer 230 that is positioned on the plurality of first layers 210 and covers the at least one reflection layer 240 and at least a portion of each of the plurality of light sources 220.

More specifically, the plurality of first layers 210 may be disposed parallel to one another on the same plane in the x-axis direction. The plurality of first layers 210 may be disposed adjacent to one another to form one circle plate.

As described above with reference to FIGS. 67 and 68, the plurality of diffusion patterns are positioned on the reflection layer 240 and may reflect light emitted from the light sources 220 on the light source 220 adjacent to each light source 220.

The second layer 230 is positioned on front surfaces of the first layers 210, on which the light sources 220 and the reflection layer 240 are positioned, and may diffuse light emitted from the light sources 220 to form a surface light source.

In the backlight unit 200 according to the eleventh exemplary configuration, the M first layers 210 may be disposed parallel to one another in the x-axis direction, where M is a natural number equal to or greater than 1.

FIG. 69 illustrates the backlight unit 200 including the four first layers 210 (e.g., formed adjacent to each other). However, since the configuration of the backlight unit 200 illustrated in FIG. 69 is just one example, the number of first layers 210 may vary depending on the screen size of the display device in the embodiment of the invention.

Figure 71:
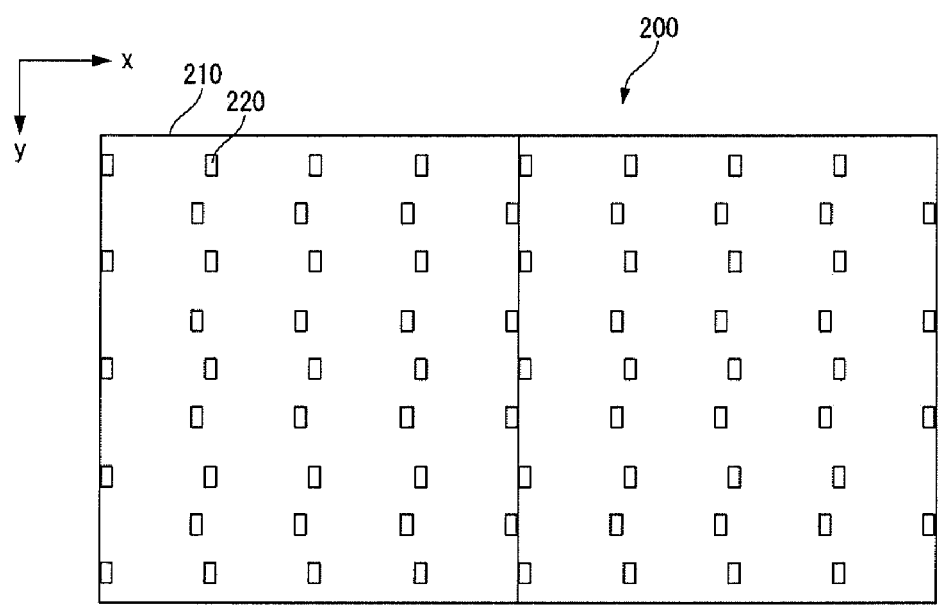
Figure 72:
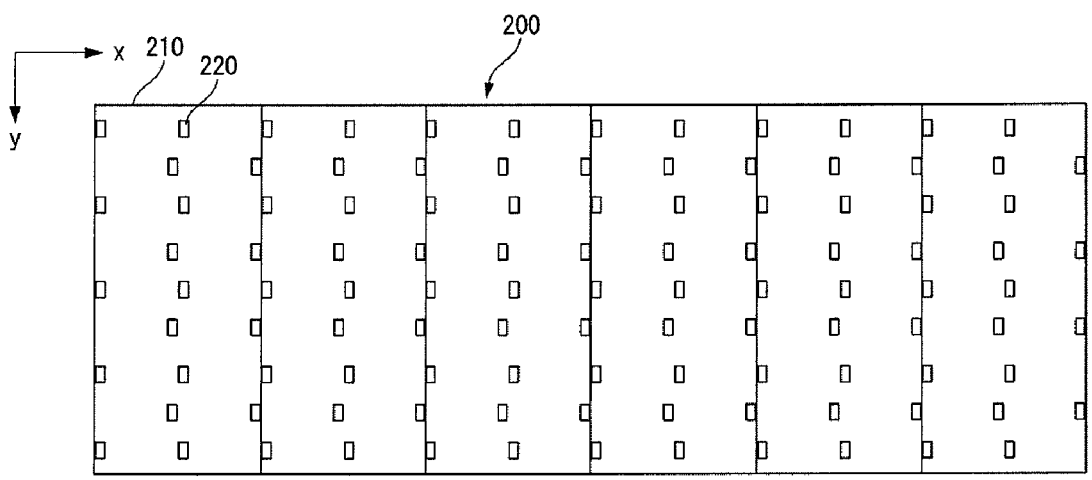
Figure 73:
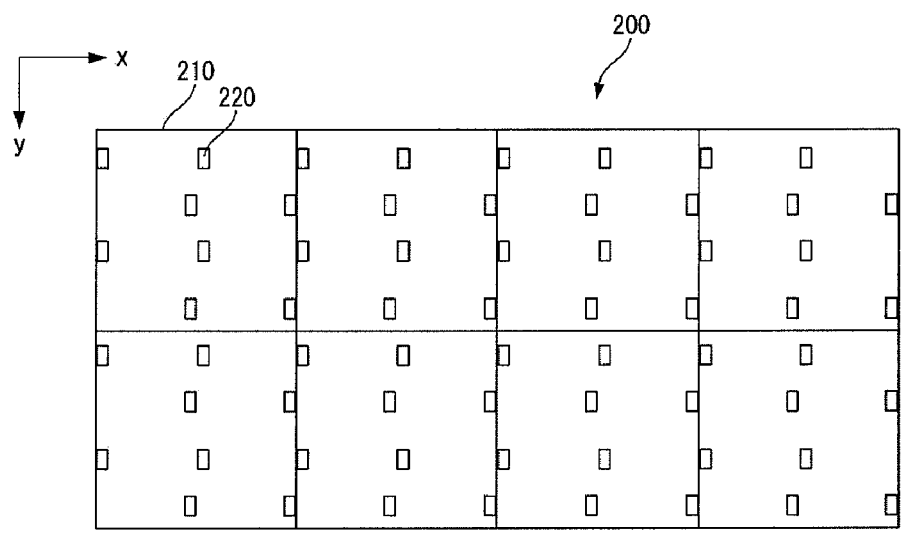

For example, as shown in FIG. 71, the backlight unit 200 may be configured to include the two first layers 210 (e.g., formed adjacent to each other). As shown in FIG. 72, the backlight unit 200 may be configured to include the six first layers 210. As shown in FIG. 73, the backlight unit 200 may be configured to include the eight first layers 210 (e.g., formed adjacent to each other). In case of the display device having the large-sized screen, the backlight unit 200 may be configured to include the ten or more first layers 210.

Figure 74:
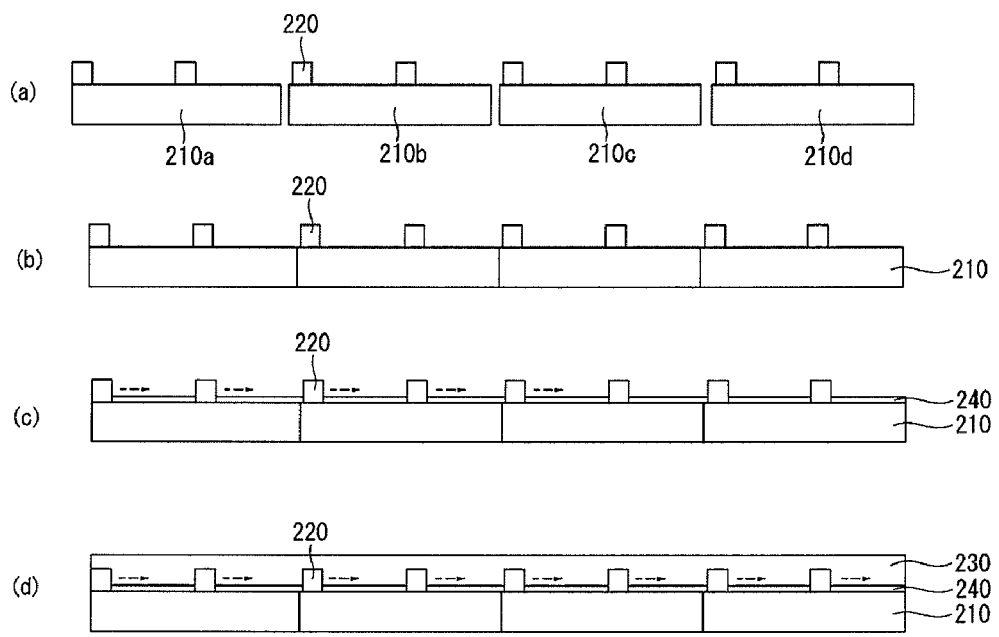

The backlight unit 200 according to the eleventh exemplary configuration may be manufactured through a process illustrated in FIG. 74.

FIG. 74 is a cross-sectional view taken along line Q-Q' of FIG. 69. As shown in FIG. 74(a), the plurality of light sources 220 are formed on each of a plurality of first layers 210a, 210b, 210c, and 210d using a soldering process. As shown in FIG. 74(b), the formed first layers 210a, 210b, 210c, and 210d are attached to one another to form the first layer 210.

Subsequently, as shown in FIG. 74(c), one reflection layer 240 or the plurality of reflection layers 240 covering the front surface of the first layer 210 are formed on the first layer 210. As shown in FIG. 74(d), the second layer 230 is attached and coated on the first layer 210 on which the reflection layer 240 is formed to manufacture the backlight unit 200 according to the embodiment of the invention.

The first layers 210 may be independently manufactured, and the light sources 220 on the first layers 210 may be independently manufactured. The adjacently disposed first layers 210 and the adjacently disposed light sources 220 may form a module-type backlight unit. The module-type backlight unit serving as backlight means may provide light to the display panel 110.

The backlight unit 200 according to the embodiments of the invention may be driven in a full driving manner such as global dimming or a partial driving manner such as local dimming and impulsive driving. The backlight unit 200 may be driven in various driving manners depending on a circuit design. As a result, in the embodiment of the invention, a color contrast ratio can increase, and also the image quality can be improved because a bright image and a dark image may be clearly displayed on the screen of the display device.

In other words, the backlight unit 200 may be divided into a plurality of division driving regions (blocks) to selectively and independently operate each of the regions according to dimming and other operations. Each of these regions may be composed of one or more of the first layers 210. For instance, each of these regions can be selectively and independently driven so that the light sources in one region may be turned on while the light sources in another region may be turned off, or vice versa. Further, the light sources in one region of the backlight unit may be dimmed while the light sources in another region of the backlight unit may emit brighter light. In an example, the backlight unit 200 may reduce a luminance of a dark image and increase a luminance of a bright image based on a relation between a luminance of each of the division driving regions and a luminance of a video signal, thereby improving the contrast ratio and the definition.

For example, the backlight unit 200 may upward provide light by independently driving only some of the light sources 220 on one first layer 210. For this, the light sources 220 included in the each of the first layers 210 may be independently controlled.

An area of the display panel 110 corresponding to the plurality of first layers 210 may be selectively and independently divided into two or more blocks. The display panel 110 and the backlight unit 200 may be separately driven in block unit.

Because the plurality of first layers 210 are assembled as described above to configure the backlight unit 200, a manufacturing process of the backlight unit 200 may be simplified and a manufacturing loss generated in the manufacturing process may be minimized. Hence, productivity of the backlight unit 200 may be improved. Further, the first layers 210 may be applied to the backlight unit having various sizes by standardizing the first layers 210 and mass-producing the standardized first layers 210.

Furthermore, when one of the plurality of first layers 210 of the backlight unit 200 is defective, only the defective first layer (or that region) is replaced without replacing all of the first layers 210 of the backlight unit 200. Therefore, a replacing work is easy and the part replacing cost is saved.

Figure 75:
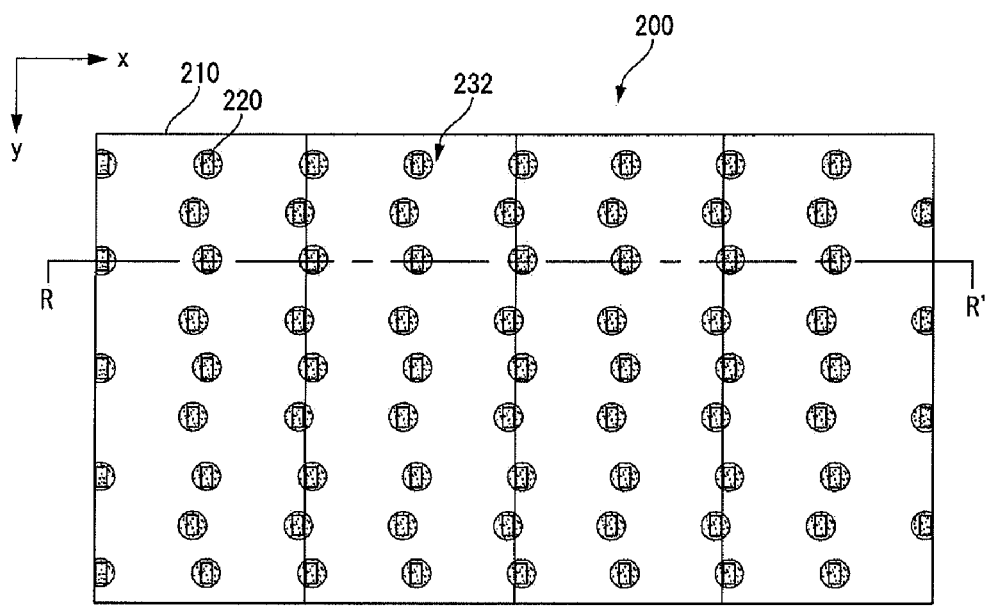
Figure 76:
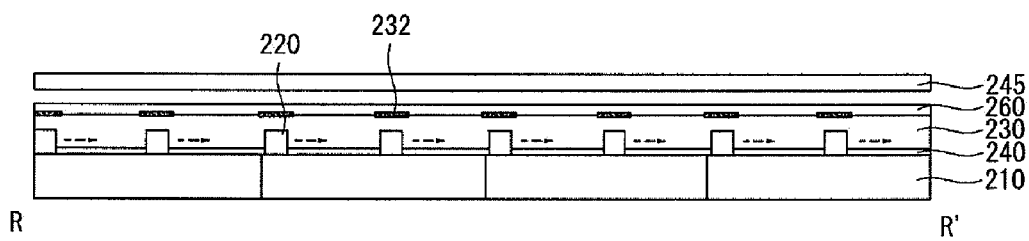

As shown in examples of FIGS. 75 and 76, the backlight unit 200 according to the embodiment of the invention may include the transparent film 260 having the plurality of first patterns 232 on the second layer 230. As described above with reference to FIGS. 7 to 22, the first patterns 232 may prevent the hot spot phenomenon generated in the light sources 220. The diffusion plate 245 may be positioned on the transparent film 260 to be separated from the transparent film 260.

Figure 77:
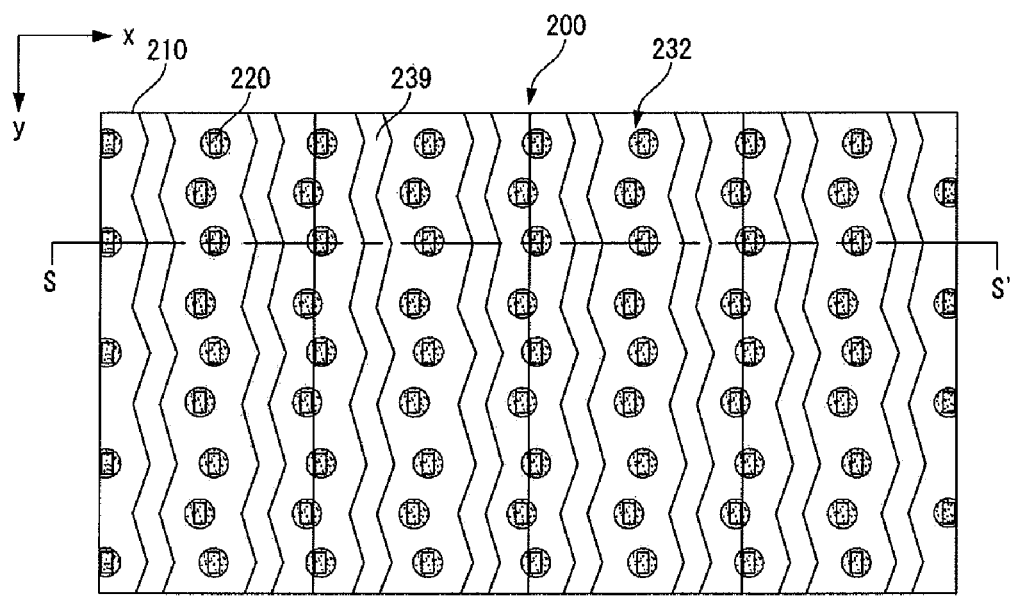
Figure 78:
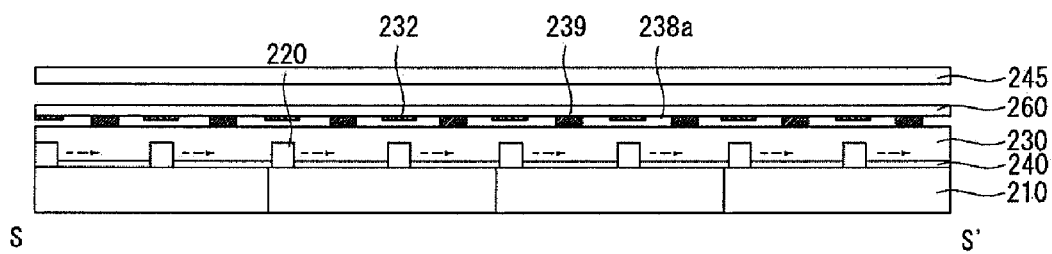

As shown in FIGS. 77 and 78, the adhesive layer 239 may be formed on the transparent film 260 having the plurality of first patterns 232. The adhesive layer 239 may attach the transparent film 260 to the second layer 230 and may secure a space for forming the first air layer 238a between the transparent film 260 and the second layer 230.

Figure 79:
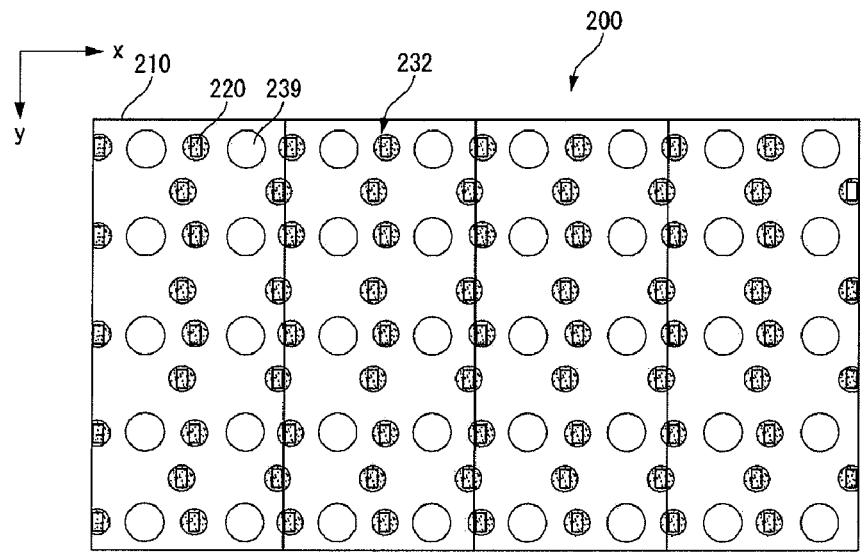

The adhesive layer 239 may be coated between the light sources 220 in a line form. As shown in FIG. 79, the adhesive layer 239 may be coated between the light sources 220 in a dot form. Other shapes may be used for the adhesive layer 239.

Figure 80:
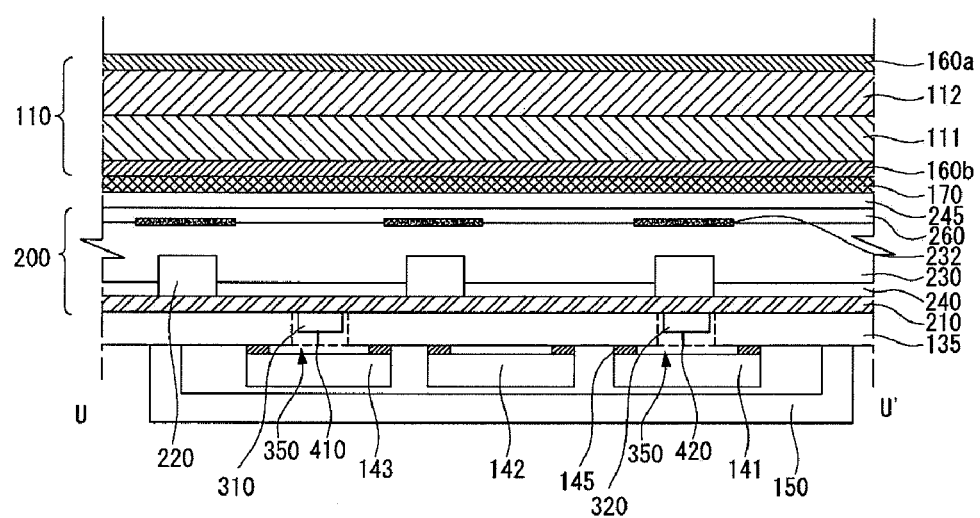
FIG. 80 is a cross-sectional view illustrating a configuration of a display device according to an exemplary embodiment of the invention.

FIG. 80 is a cross-sectional view illustrating an example of a configuration of the display device according to the exemplary embodiment of the invention. Structures and components identical or equivalent to those illustrated in FIGS. 1 to 79 may be designated with the same reference numerals in FIG. 80, and a further description may be briefly made or may be entirely omitted. The display device of FIG. 80 is merely an example, and the invention can be applied in any other suitable display device or any device that uses a backlight unit or light sources. All components of the display device are operatively coupled and configured.

As shown in FIG. 80, the display panel 110 including the first substrate 111, the second substrate 112, the upper polarizing plate 160a, and the lower polarizing plate 160a may closely adhere to the backlight unit 200 including the first layer 210, the plurality of light sources 220, and the second layer 230. For example, an adhesive 170 may be formed between the backlight unit 200 and the display panel 110 to adhesively fix the backlight unit 200 to the bottom of the display panel 110.

More specifically, the top of the backlight unit 200 may adhere to the bottom of the lower polarizing plate 160b using the adhesive 170. The backlight unit 200 may further include the diffusion plate 245 on the second layer 230. A plurality of optical sheets may be formed between the diffusion plate 245 and the adhesive 170.

The backlight unit 200 may be configured to include the first layer 210, the plurality of light sources 220 on the first layer 210, the reflection layer 240 formed around the light sources 220, the second layer 230 on the first layer 210, the transparent film 260 having the first patterns 232 on the second layer 230, and the diffusion plate 245 on the transparent film 260. All of the configurations illustrated in FIGS. 2 to 78 may be applied to the backlight unit 200 according to the embodiment of the invention.

Further, a bottom plate 135 may be disposed on the bottom of the backlight unit 200 and may closely adhere to the bottom of the first layer 210.

The display device may include a display module, e.g., a driver for supplying a driving voltage and a power to the display panel 110 and the backlight unit 200. For example, the plurality of light sources 220 of the backlight unit 200 may be driven using the driving voltage received from the driver to emit light.

The driver may include a driving controller 141, a main board 142, and a power supply unit 143. The driver may be disposed and fixed on a driver chassis 145 positioned on the bottom plate 135, so that the driver may be stably supported and fixed.

In the embodiment of the invention, a first connector 310 may be formed on the back surface of the first layer 210. For this, a hole 350 for inserting the first connector 310 may be formed in the bottom plate 135.

The first connector 310 may electrically connect the power supply unit 143 to the light source 220 to allow the driving voltage supplied by the power supply unit 143 to be supplied to the light source 220.

For example, the first connector 310 may be formed on the bottom of the first layer 210 and may be connected to the power supply unit 143 through a first cable 410. Hence, the first connector 310 may be used to transfer the driving voltage received from the power supply unit 143 through the first cable 410 to the light source 220.

An electrode pattern, for example, a carbon nanotube electrode pattern may be formed on the top of the first layer 210. The electrode formed on the top of the first layer 210 may contact the electrode formed in the light source 220 and may electrically connect the light source 220 with the first connector 410.

Further, the display device may include the driving controller 141 for controlling a drive of the display panel 110 and the backlight unit 200. For example, the driving controller 141 may be a timing controller.

The timing controller may control a driving timing of the display panel 110. More specifically, the timing controller may generate a control signal for controlling a driving timing of each of a data driver, a gamma voltage generator, and a gate driver that are included in the display panel 110 and may supply the control signal to the display panel 110.

The timing controller may synchronize with a drive of the display panel 110 and may supply a signal for controlling driving timing of the light sources 220 to the backlight unit 200, so that the backlight unit 200, more specifically, the light sources 220 operate.

As shown in FIG. 80, the driving controller 141 may be fixed to the driver chassis 145 positioned on the bottom plate 135, so that the driving controller 141 may be stably supported and fixed.

In the embodiment of the invention, a second connector 320 may be formed on the first layer 210. For this, a hole 350 for inserting the second connector 320 may be formed in the bottom plate 135.

The second connector 320 may electrically connect the driving controller 141 with the first layer 210, thereby allowing a control signal output from the driving controller 141 to be supplied to the first layer 210.

For example, the second connector 320 may be formed on the bottom of the first layer 210 and may be connected to the driving controller 141 through a second cable 420. Hence, the second connector 320 may be used to transfer a control signal received from the driving controller 141 through the second cable 420 to the first layer 210.

A light source driver may be formed on the first layer 210. The light source driver may drive the light sources 220 using the control signal supplied from the driving controller 141 through the second connector 320.

The driving controller 141 and the power supply unit 143 may be covered by the back case 150 and may be protected from the outside.

The configuration of the display device shown in FIG. 80 is just one embodiment of the invention. Therefore, the location or the numbers of each of the driving controller 141, the power supply unit 143, the first and second connector 310 and 320, and the first and second cables 420 and 430 may be changed, if necessary.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light generating device comprising:
arrays of light source devices arranged on a first layer and including a plurality of light source devices, the plurality of light source devices including a first light source device and a second light source device configured to emit light in opposite directions, at least one of the first and second light source devices including:
a housing having inclined inner walls that define a cavity,
a light emitting diode disposed in the cavity and configured to generate the light, and
at least one material filled in the cavity;
a reflection layer disposed on the first layer and configured to reflect the light emitted from the plurality of light source devices; and
a second layer covering the plurality of light source devices and the reflection layer,
wherein a first angle $\theta 1$ is formed from a line extending from the inclined inner walls of the housing with respect to a line perpendicular to a light emitting surface of the light emitting diode of the first light source device,
a second angle $\theta 2$ is formed from a line connecting a middle point on a surface of the first light source device and a middle point on a surface of the second light source device to a line extending perpendicularly from a light emitting surface of the first light source device, and
a difference between the first angle $\theta 1$ and the second angle $\theta 2$ ranges from 0° to about 78°,
wherein the plurality of the light source devices positioned on the line extending perpendicularly from the light emitting surface of the first light source device emit light in the same direction as a light emitting direction of the first light source.

2. The light generating device of claim 1, wherein the difference between the first angle $\theta 1$ and the second angle $\theta 2$ is equal to or less than 30°.

3. The light generating device of claim 1, wherein the first angle $\theta 1$ ranges from 2° to 70°.

4. The light generating device of claim 3, wherein the first angle $\theta 1$ ranges from 20° to 50°.

5. The light generating device of claim 1, wherein the second angle $\theta 2$ ranges from 10° to 80°.

6. The light generating device of claim 5, wherein the second angle θ2 ranges from 20° to 50°.

7. The light generating device of claim 1, wherein the second layer encapsulates the plurality of light source devices and the reflection layer.

8. The light generating device of claim 1, further comprising:
light diffusing patterns disposed on or in the second layer and configured to diffuse the light reflected from the reflection layer,
wherein the light diffusing patterns are disposed to correspond with the plurality of light source devices.

9. The light generating device of claim 1, wherein the arrays of light source devices are arranged on the first layer in a matrix configuration.

10. The light generating device of claim 1, wherein the arrays of light source devices are arranged on the first layer in a staggered configuration.

11. A display device comprising:
a display panel configured to display images; and
a backlight unit configured to supply light to the display panel, and including a plurality of light generating blocks,
at least one of the light generating blocks including:
arrays of light source devices arranged on a first layer and including a plurality of light source devices, the plurality of light source devices including a first light source device and a second light source device configured to emit light in opposite directions, at least one of the first and second light source devices including:
a housing having inclined inner walls that define a cavity,
a light emitting diode disposed in the cavity and configured to generate the light, and
at least one material filled in the cavity;
a reflection layer disposed on the first layer and configured to reflect the light emitted from the plurality of light source devices; and
a second layer covering the plurality of light source devices and the reflection layer,
wherein a first angle θ1 is formed from a line extending from the inclined inner walls of the housing with respect to a line perpendicular to a light emitting surface of the light emitting diode of the first light source device,
a second angle θ2 is formed from a line connecting a middle point on a surface of the first light source device and a middle point on a surface of the second light source device to a line extending perpendicularly from a light emitting surface of the first light source device, and
a difference between the first angle θ1 and the second angle θ2 ranges from 0° to about 78°,
wherein the plurality of the light source devices positioned on the line extending perpendicularly from the light emitting surface of the first light source device emit light in the same direction as a light emitting direction of the first light source.

12. The display device of claim 11, wherein the difference between the first angle θ1 and the second angle θ2 is equal to or less than 30°.

13. The display device of claim 11, wherein the first angle θ1 ranges from 2° to 70°.

14. The display device of claim 13, wherein the first angle θ1 ranges from 20° to 50°.

15. The display device of claim 11, wherein the second angle θ2 ranges from 10° to 80°.

16. The display device of claim 15, wherein the second angle θ2 ranges from 20° to 50°.

17. The display device of claim 11, wherein the second layer encapsulates the plurality of light source devices and the reflection layer.

18. The display device of claim 11, the at least one of the light generating blocks further comprising:
light diffusing patterns disposed on or in the second layer and configured to diffuse the light reflected from the reflection layer,
wherein the light diffusing patterns are disposed to correspond with the plurality of light source devices.

19. The display device of claim 11, wherein the arrays of light source devices are arranged on the first layer in a matrix configuration.

20. The display device of claim 11, wherein the arrays of light source devices are arranged on the first layer in a staggered configuration.

* * * * *